US012372875B2

(12) United States Patent
Shibayama et al.

(10) Patent No.: US 12,372,875 B2
(45) Date of Patent: Jul. 29, 2025

(54) COMPOSITION FOR RESIST PATTERN METALLIZATION PROCESS

(71) Applicant: NISSAN CHEMICAL CORPORATION, Tokyo (JP)

(72) Inventors: Wataru Shibayama, Toyama (JP); Satoshi Takeda, Toyama (JP); Shuhei Shigaki, Toyama (JP); Ken Ishibashi, Toyama (JP); Kodai Kato, Toyama (JP); Makoto Nakajima, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 819 days.

(21) Appl. No.: 17/599,900

(22) PCT Filed: Mar. 27, 2020

(86) PCT No.: PCT/JP2020/014232

§ 371 (c)(1),
(2) Date: Sep. 29, 2021

(87) PCT Pub. No.: WO2020/203852

PCT Pub. Date: Oct. 8, 2020

(65) Prior Publication Data

US 2022/0206395 A1 Jun. 30, 2022

(30) Foreign Application Priority Data

Mar. 29, 2019 (JP) ................................ 2019-068030

(51) Int. Cl.
*G03F 7/40* (2006.01)

(52) U.S. Cl.
CPC .................................. *G03F 7/405* (2013.01)

(58) Field of Classification Search
CPC .......... G03F 7/405; G03F 7/11; G03F 7/0043
See application file for complete search history.

(56) References Cited

U.S. PATENT DOCUMENTS

2018/0149977 A1 5/2018 Shibayama et al.

FOREIGN PATENT DOCUMENTS

| | | | | |
|---|---|---|---|---|
| CN | 107533302 | A | 1/2018 | |
| JP | 2005-277052 | A | 10/2005 | |
| JP | 2013-040993 | A | 2/2013 | |
| JP | 2013-536463 | A | 9/2013 | |
| WO | 2009/104552 | A1 | 8/2009 | |
| WO | 2014/021256 | A1 | 2/2014 | |
| WO | 2015/053194 | A1 | 4/2015 | |
| WO | WO2016/190261 | * | 12/2016 | ................ G03F 7/11 |

OTHER PUBLICATIONS

Nov. 7, 2023 Office Action issued in Taiwanese Patent Application No. 109110772.
Oct. 10, 2023 Office Action issued in Chinese Patent Application No. 202080032980.7.
Jun. 9, 2020 International Search Report issued in International Patent Application No. PCT/JP2020/014232.
Jun. 9, 2020 Written Opinion of the International Searching Authority issued in International Patent Application No. PCT/JP2020/014232.
Nov. 17, 2023 Office Action issued in Japanese Patent Application No. 2021-512051.
May 23, 2024 Office Action issued in Taiwanese Patent Application No. 109110772.
Jul. 13, 2024 Office Action issued in Chinese Patent Application No. 202080032980.7.
Aug. 14, 2024 Office Action issued in Korean Patent Application No. 10-2021-7032618.
Jun. 26, 2024 Office Action issued in Japanese Patent Application No. 2021-512051.
Sep. 28, 2024 Office Action issued in Chinese Patent Application No. 202080032980.7.
Oct. 14, 2024 Office Action issued in Taiwanese Patent Application No. 109110772.

* cited by examiner

*Primary Examiner* — Daborah Chacko-Davis
(74) *Attorney, Agent, or Firm* — Oliff PLC

(57) ABSTRACT

A composition with which collapse and roughness of a resist pattern can be ameliorated and the etching resistance can be improved by metallizing a resist in the resist pattern and a resist pattern metallization method using the composition. A composition for a resist pattern metallization process, including a component (A): at least one selected from the group consisting of a metal oxide (a1), a hydrolyzable silane compound (a2), a hydrolysate (a3) of the hydrolyzable silane compound, and a hydrolysis condensate (a4) of the hydrolyzable silane compound, a component (B): an acid compound containing no carboxylic acid group (—COOH), and a component (C): an aqueous solvent, and a resist pattern metallization method for providing a resist pattern in which the composition components have permeated into a resist using the composition.

10 Claims, 4 Drawing Sheets

EXAMPLE 4-1

OBSERVATION FROM TOP OBSERVATION FROM CROSS SECTION

COMPARATIVE EXAMPLE

OBSERVATION FROM TOP OBSERVATION FROM CROSS SECTION

EXAMPLE 4-1 (AFTER PATTERN TRANSFER)

OBSERVATION FROM TOP OBSERVATION FROM CROSS SECTION

COMPARATIVE EXAMPLE 4-1 (AFTER PATTERN TRANSFER)

OBSERVATION FROM TOP

OBSERVATION FROM CROSS SECTION

EXAMPLE 4-1

COMPARATIVE EXAMPLE

COMPOSITION FOR RESIST PATTERN METALLIZATION PROCESS

TECHNICAL FIELD

The present invention relates to a composition which is applied to a resist pattern during development procedure or after development according to a lithography process, and specifically, to a composition used in a metallization process in which a composition permeates into a resist to obtain a resist pattern into which the composition components have permeated.

BACKGROUND ART

In the field of producing semiconductor devices, a technique of forming a fine pattern on a substrate, performing etching according to the pattern, and processing the substrate is widely used.

With the progress of lithography techniques, fine patterning has progressed, KrF excimer lasers and ArF excimer lasers have been used, and additionally, exposure techniques using electron beams (EB) and extreme ultra violet (EUV) have been studied, and techniques such as directed self-assembly (DSA) have also been studied.

In recent years, a phenomenon in which patterns collapse in the development and developer rinsing steps performed after light exposure of a resist in the lithography process due to miniaturization of patterns has been a problem.

As a method of minimizing such pattern collapse, the thinning of resist films is progressing, but on the other hand, it cannot be said that the improvement in the etching resistance of the resist itself sufficiently corresponds to the thinning of the film, and the difficulty of etching hardmasks and semiconductor substrates is increasing.

Under these circumstances, a method in which a surface of a resist after exposure is developed with a developer, and then washed with a rinsing solution, the rinsing solution is replaced with a coating solution containing a polymer component, a resist pattern is covered with the polymer component, and the resist is then removed by dry etching to form a reverse pattern with the replaced polymer component has been proposed. For example, a pattern forming method including a step of forming a resist film on a substrate, a step of selectively emitting an energy beam to the resist film in order to form a latent image on the resist film, a step of supplying a developer (alkaline developer) onto the resist film in order to form a resist pattern from the resist film on which the latent image is formed, a step of supplying the rinsing solution to the substrate in order to replace the developer on the substrate with the rinsing solution, a step of supplying a coating film material to the substrate in order to perform replacement with the coating film material containing at least some of a solvent of the rinsing solution on the substrate and a solute different from the resist film, a step of volatilizing a solvent in the coating film material in order to form a coating film covering the resist film on the substrate, a step of removing at least a part of the surface of the coating film in order to expose at least a part of the upper surface of the resist pattern and form a mask pattern composed of the coating film, and a step of processing the substrate using the mask pattern has been disclosed (Patent Document 1).

In addition, as an aqueous composition for coating a photoresist pattern, a composition containing a water-soluble compound containing an amino group and a compound containing a carboxylic acid group has been proposed (Patent Document 2).

PRIOR ART DOCUMENTS

[Patent Document 1] Japanese Unexamined Patent Application Publication No. 2005-277052 (JP 2005-277052 A)

[Patent Document 2] Japanese Translation of PCT Application No. 2013-536463 (JP 2013-536463 A)

SUMMARY OF THE INVENTION

Problem to be Solved by the Invention

In the prior art disclosed in Patent Document 1, when the resist is removed with a developer or a rinsing solution to form a resist pattern, there is a possibility of pattern collapse.

In addition, when the composition disclosed in Patent Document 2 is applied to a resist pattern, a uniform coating may not be obtained in some cases.

The present invention has been made in view of the above circumstances, and an object of the present invention is to provide a composition with which collapse and roughness of a resist pattern can be ameliorated and the etching resistance can be improved by metallizing a resist in the resist pattern, and a resist pattern metallization method using the composition.

Means for Solving the Problem

In order to achieve the above object, the inventors conducted extensive studies, and as a result, found that, when a composition in which a metal oxide, a hydrolyzable silane compound and a hydrolysate/hydrolysis condensate thereof, and an acid compound containing no carboxylic acid group are combined is applied to a resist pattern during development or after development and heated, a resist pattern in which the composition components have permeated into a resist is obtained, pattern collapse can be suppressed in the resist pattern into which the composition components have permeated, and the etching resistance is improved, and completed the present invention.

That is, a first aspect of the present invention relates to a composition for a resist pattern metallization process, including a component (A): at least one selected from the group consisting of a metal oxide (a1), a hydrolyzable silane compound (a2), a hydrolysate (a3) of the hydrolyzable silane compound, and a hydrolysis condensate (a4) of the hydrolyzable silane compound;

a component (B): an acid compound containing no carboxylic acid group (—COOH); and a component (C): an aqueous solvent.

A second aspect relates to the composition according to the first aspect in which the component (B) is an acid compound containing a sulfonate group ($—SO_3H$).

A third aspect relates to the composition according to the first aspect or the second aspect in which the hydrolyzable silane compound (a2) contains at least one selected from the group consisting of a hydrolyzable silane (i) containing an organic group having an amino group and a hydrolyzable silane (ii) containing an organic group having an ionic functional group.

A fourth aspect relates to the composition according to the first aspect or the second aspect in which the hydrolyzable silane compound (a2) contains at least one selected from the group consisting of a hydrolyzable silane of the following Formula (1) and a hydrolyzable silane of the following Formula (1-1):

$$[R^1{}_{a0}Si(R^2)_{3-a0}]_{b0}R^3{}_{c0} \quad \text{Formula (1)}$$

$$[[Si(R^{10})_2O]_{n0}Si(R^{20})_2]R^{30}{}_2 \quad \text{Formula (1-1)}$$

(in Formula (1), $R^3$ is an organic group having an amino group or an organic group having an ionic functional group, which is bonded to a silicon atom by an Si—C bond or Si—N bond, and when there are a plurality of $R^3$'s, the $R^3$'s are groups that may form a ring and be bonded to Si atoms, $R^1$ is an organic group having an alkyl group, an aryl group, a halogenated alkyl group, a halogenated aryl group, an alkenyl group, an epoxy group, an acryloyl group, a methacryloyl group, a mercapto group, or a cyano group and is a group that is bonded to a silicon atom by an Si—C bond, $R^2$ is an alkoxy group, an acyloxy group or a halogen group, a0 is an integer of 0 or 1, b0 is an integer of 1 to 3, c0 is an integer of 1 or 2, in Formula (1-1), $R^{10}$ and $R^{20}$ are each a hydroxy group, an alkoxy group, an acyloxy group, or a halogen group, $R^{30}$ is an organic group having an amino group or an organic group having an ionic functional group, which is bonded to a silicon atom by an Si—C bond or Si—N bond, and when there are a plurality of $R^{30}$'s, the $R^{30}$'s are groups that may form a ring and be bonded to Si atoms, and n0 is an integer of 1 to 10).

A fifth aspect relates to the composition according to the first aspect or the second aspect in which the metal oxide (a1) is an oxide of at least one metal selected from the group consisting of titanium, hafnium, zirconium, germanium, aluminum, indium, tin, tungsten and vanadium.

A sixth aspect relates to the composition according to any one of the first aspect to the fifth aspect in which the proportion of the component (B) contained is 0.5 to 15 parts by mass with respect to 100 parts by mass of the component (A).

A seventh aspect relates to the composition according to any one of the first aspect to the sixth aspect, further including a curing catalyst.

An eighth aspect relates to the composition according to any one of the first aspect to the seventh aspect, further including a surfactant.

A ninth aspect relates to the composition according to any one of the first aspect to the eighth aspect, further including a photoacid generator.

A tenth aspect relates to a resist pattern metallization method for providing a resist pattern in which the composition components have permeated into a resist, including:

- a step of applying a resist solution to a substrate;
- a step of exposing and developing a resist film;
- a step of applying the composition according to any one of the first aspect to the ninth aspect to a resist pattern during the development or after the development and forming a coating film on the resist pattern; and
- a step of heating the coating film and forming a heated coating film.

An eleventh aspect relates to a resist pattern metallization method for providing a resist pattern in which the composition components have permeated into a resist, including:

- a step of applying a resist solution to a substrate;
- a step of exposing and developing a resist film;
- a step of applying the composition according to any one of the first aspect to the ninth aspect to a resist pattern during the development or after the development and forming a coating film in which the resist pattern is buried;
- a step of heating the coating film and forming a heated coating film; and
- a step of removing the heated coating film with water or a developer.

A twelfth aspect relates to a method of producing a semiconductor device including a step of processing a substrate with the metallized resist pattern obtained by the method according to the tenth aspect or the eleventh aspect.

Effects of the Invention

When the composition for a resist pattern metallization process of the present invention is applied to a resist pattern, a resist pattern into which the composition components have permeated can be formed. Accordingly, it is possible to provide a resist pattern in which it is possible to suppress shape deterioration such as peeling and collapse of the resist pattern, ameliorate roughness of a line width, and improve the etching resistance.

In addition, according to the resist pattern metallization method of the present invention, after mask exposure, when the composition is brought into contact with the surface of the resist during development or after development of the resist and heated, the resist pattern is covered, the space within the resist pattern is filled, and collapse of the resist pattern is prevented. Then, when the coating film is heated, it is possible to obtain a resist pattern in which the composition components have permeated into a resist, and as a result, collapse of the resist pattern can be suppressed and the etching resistance can be improved.

Then, when the resist pattern into which the composition components have permeated is used as an etching mask, the pattern can be transferred by etching to the underlayer of the resist pattern.

of a resist pattern of a comparative example in [6] Resist pattern formation according to ArF exposure and resist pattern metallization (1).

Figure 5:
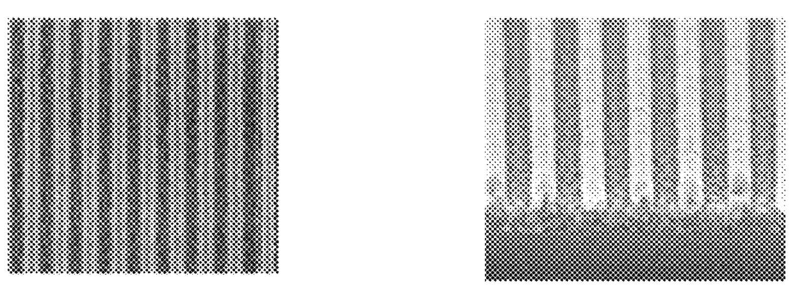

FIG. 5 shows scanning microscopic images (magnification: 100 K, an upper part and a cross section of a pattern) of a resist pattern and a transfer pattern to which the composition of Example 4-1 was applied after dry etching in [6] Resist pattern formation according to ArF exposure and resist pattern metallization (1).

Figure 6:
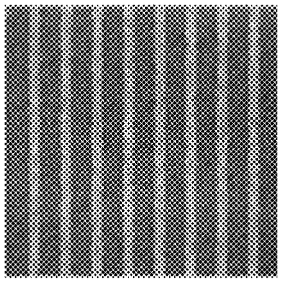
Figure 6:
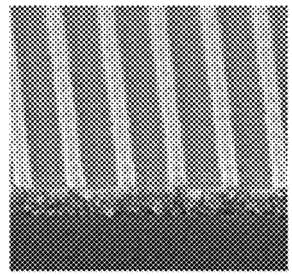

FIG. 6 shows scanning microscopic images (magnification: 100 K, an upper part and a cross section of a pattern) of a resist pattern and a transfer pattern of a comparative example after dry etching in [6] Resist pattern formation according to ArF exposure and resist pattern metallization (1).

Figure 7:
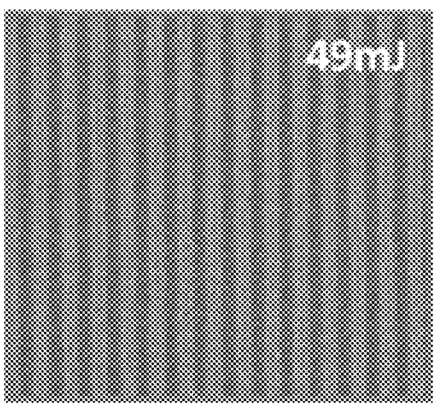

FIG. 7 shows a scanning microscopic image (magnification: 200 K, an upper part of a pattern) of a resist pattern to which the composition of Example 4-1 was applied in [8] Resist pattern formation according to EUV exposure and resist pattern metallization.

Figure 8:
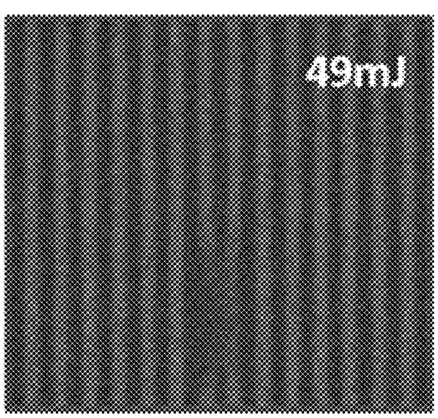

FIG. 8 shows a scanning microscopic image (magnification: 200 K, an upper part of a pattern) of a resist pattern of a comparative example in [8] Resist pattern formation according to EUV exposure and resist pattern metallization.

Figure 9:
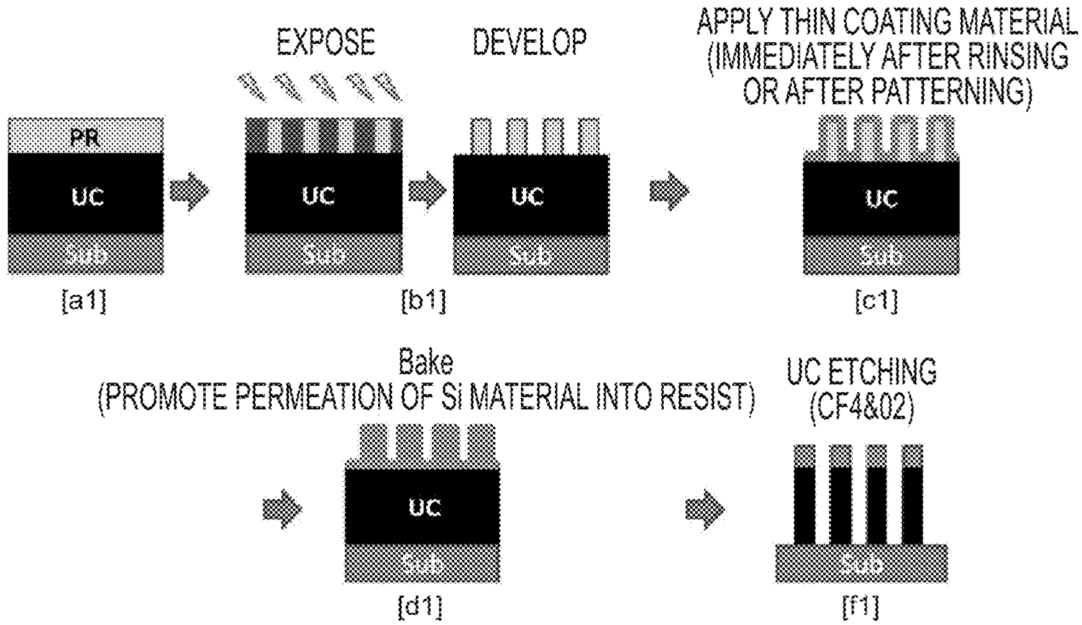

FIG. 9 shows schematic views illustrating one aspect of a resist pattern metallization method of the present invention.

Figure 10:
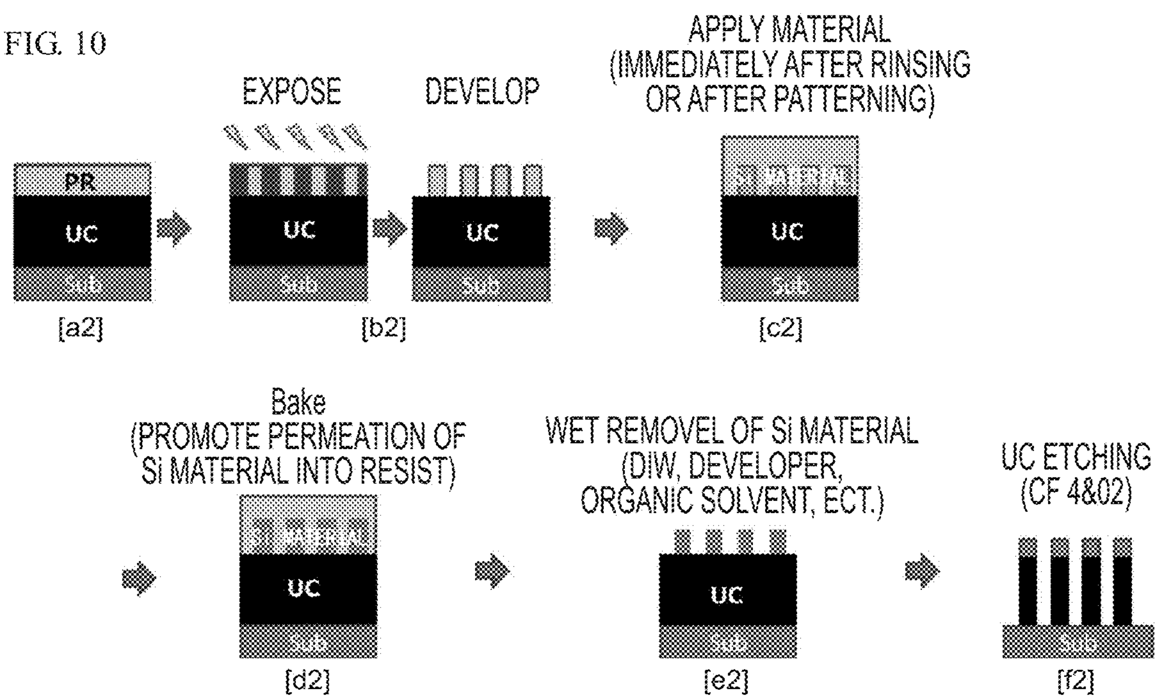

FIG. 10 shows schematic views illustrating another aspect of a resist pattern metallization method of the present invention.

MODES FOR CARRYING OUT THE INVENTION

[Composition for Resist Pattern Metallization Process]

The present invention provides a composition for a resist pattern metallization process containing the following component (A), component (B), and component (C), that is, a composition containing the component (A): at least one selected from the group consisting of a metal oxide (a1), a hydrolyzable silane compound (a2), a hydrolysate (a3) of the hydrolyzable silane compound, and a hydrolysis condensate (a4) (also referred to as a polysiloxane) of the hydrolyzable silane compound, the component (B): an acid compound containing no carboxylic acid group (—COOH), and the component (C): an aqueous solvent.

As will be described below, by applying the composition for a resist pattern metallization process of the present invention to a resist pattern, it is possible to obtain a resist pattern in which the above composition components have permeated into the resist. In the present invention, "metallization" is a process in which a component in the composition, particularly a silane component or a metal component in the composition (that is, the component (A) contained in the composition: a metal oxide (a1), a hydrolyzable silane compound (a2), a hydrolysate (a3) of the hydrolyzable silane compound, and a hydrolysis condensate (a4) of the hydrolyzable silane compound) has permeated into the resist pattern.

The concentration of the solid content in the composition with respect to a total mass of the composition may be, for example, 0.01 to 50% by mass, 0.01 to 20.0% by mass, or 0.01 to 10.0% by mass. The solid content includes components other than the solvent contained in the composition.

The proportion of the component (A): at least one selected from the group consisting of a metal oxide (a1), a hydrolyzable silane compound (a2), a hydrolysate (a3) of the hydrolyzable silane compound, and a hydrolysis condensate (a4) of the hydrolyzable silane compound in the solid content may be 50 to 99.9% by mass or 80 to 99.9% by mass.

In addition, the concentration of the component (B): an acid compound containing no carboxylic acid group (—COOH) in the solid content may be 0.1% by mass to 50% by mass or 0.1% by mass to 20% by mass.

In addition, the proportion of the component (A) contained (at least one selected from the group consisting of a metal oxide (a1), a hydrolyzable silane compound (a2), a hydrolysate (a3) of the hydrolyzable silane compound, and a hydrolysis condensate (a4) of the hydrolyzable silane compound) with respect to 100 parts by mass of the composition of the present invention may be 0.001 to 50.0 parts by mass. That is, the concentration of the component (A) in the composition may be generally 0.001 to 50.0% by mass, and preferably 0.001 to 20.0% by mass.

In addition, the concentration of the component (B) (acid compound containing no carboxylic acid group (—COOH)) in the composition may be 0.0001 to 2.0% by mass.

[Component (A)]

The component (A) is at least one selected from the group consisting of a metal oxide (a1), a hydrolyzable silane compound (a2), a hydrolysate (a3) of the hydrolyzable silane compound, and a hydrolysis condensate (a4) (also referred to as a polysiloxane) of the hydrolyzable silane compound.

Here, when the component (A) is classified into the component (A1): a metal oxide (a1) and the component (A2): a hydrolyzable silane compound (a2), a hydrolysate (a3) of the hydrolyzable silane compound, and a hydrolysis condensate (a4) of the hydrolyzable silane compound, the component (A1) may be used alone, the component (A2) may be used alone, or the component (A1) and the component (A2) may be used in combination. When the component (A1) and the component (A2) are used in combination, the ratio therebetween is generally a mass ratio of (A1):(A2) =50:1 to 0.05:1.

[Metal Oxide (a1)]

For the metal oxide (a1), for example, an oxide of at least one metal selected from the group consisting of titanium, hafnium, zirconium, germanium, aluminum, indium, tin, tungsten and vanadium can be selected.

The metal oxide can also be used as a partial metal oxide. Examples thereof include a hydrolysis condensate containing TiOx (titanium oxide, x=1 to 2), a hydrolysis condensate containing HfOx (hafnium oxide, x=1 to 2), a hydrolysis condensate containing ZrOx (zirconium oxide, x=1 to 2), a hydrolysis condensate containing GeOx (germanium oxide, x=1 to 2), a hydrolysis condensate containing AlOx (aluminum oxide, x=1 to 1.5), a hydrolysis condensate containing InOx (indium oxide, x=1 to 1.5), a hydrolysis condensate containing SnOx (tin oxide, x=1 to 3), a hydrolysis condensate containing WOx (tungsten oxide, x=1 to 3), and a hydrolysis condensate containing VOx (vanadium oxide, x=1 to 2.5). The metal oxide or the partial metal oxide can be obtained as a hydrolysis condensate of a metal alkoxide, and the partial metal oxide may have an alkoxide group.

[Hydrolyzable Silane Compound (a2), Hydrolysate (a3) of the Hydrolyzable Silane Compound, and Hydrolysis Condensate (a4) of the Hydrolyzable Silane Compound]

As the component (A), at least one selected from the group consisting of a hydrolyzable silane compound (a2), a hydrolysate (a3) of the hydrolyzable silane compound and a hydrolysis condensate (a4) of the hydrolyzable silane compound can be used, and these can be used as a mixture.

In addition, as will be described below, the hydrolyzable silane compound (a2) can be hydrolyzed and the obtained hydrolysate (a3) can be condensed and used as a hydrolysis condensate (a4). When the hydrolysis condensate (a4) is obtained, if a partial hydrolysate that is not completely hydrolyzed or an unreacted silane compound is mixed with the hydrolysis condensate, the form of a mixture thereof can be used. The hydrolysis condensate (a4) has a concept in which the hydrolysis condensate may not only be a polymer having a polysiloxane structure where hydrolysis and condensation are completely finished and also be a polymer having a polysiloxane structure obtained by hydrolysis and condensation of a silane compound, in which condensation is partially incomplete and Si—OH groups remain.

As the hydrolyzable silane compound (a2), at least one selected from the group consisting of hydrolyzable silanes of Formula (1) and Formula (1-1) can be suitably used.

The hydrolysate (a3) of the hydrolyzable silane compound corresponds to a hydrolysate of the hydrolyzable silane compound (a2).

In addition, the hydrolysis condensate (a4) of the hydrolyzable silane compound is a condensate of the hydrolysate (a3) of the hydrolyzable silane compound (a2). Here, (a4) is also referred to as a polysiloxane.

In Formula (1), $R^3$ is an organic group having an amino group or an organic group having an ionic functional group, which is bonded to a silicon atom by an Si—C bond or Si—N bond, and when there are a plurality of $R^3$'s, the $R^3$'s are groups that may form a ring and be bonded to Si atoms.

- $R^1$ is an organic group having an alkyl group, an aryl group, a halogenated alkyl group, a halogenated aryl group, an alkenyl group, an epoxy group, an acryloyl group, a methacryloyl group, a mercapto group, or a cyano group and is a group that is bonded to a silicon atom by an Si—C bond,
- $R^2$ is an alkoxy group, an acyloxy group, or a halogen group.
- a0 is an integer of 0 or 1, b0 is an integer of 1 to 3, and c0 is an integer of 1 or 2.

In Formula (1-1), $R^{10}$ and $R^{20}$ are each a hydroxy group, an alkoxy group, an acyloxy group, or a halogen group.

$R^{30}$ is an organic group having an amino group or an organic group having an ionic functional group, which is bonded to a silicon atom by an Si—C bond or Si—N bond, and when there are a plurality of $R^{30}$'s, the $R^{30}$'s are groups that may form a ring and be bonded to Si atoms.

n0 is an integer of 1 to 10, and may be, for example, an integer of 1 to 5 or an integer of 1.

Examples of $R^3$ in Formula (1) or $R^{30}$ in Formula (1-1) include an organic group having an amino group.

As the amino group, a primary amino group, a secondary amino group, or a tertiary amino group can be used, and one amino group or a plurality of (two or three) amino groups may be provided in the molecule. For these, an aliphatic amino group, an aromatic amino group, and the like can be used.

In addition, examples of $R^3$ in Formula (1) or $R^{30}$ in Formula (1-1) include an organic group having an ionic functional group. Examples of ionic functional groups include ammonium cation, carboxylate anion, sulfonate anion, nitrate anion, phosphate anion, sulfonium anion, and alcoholate anion. Examples of ammonium cations include primary ammonium, secondary ammonium, tertiary ammonium, and quaternary ammonium.

Examples of counterions for ionic functional groups include, as anions, chloride anion, fluoride anion, bromide anion, iodide anion, nitrate anion, sulfate anion, phosphate anion, formate anion, acetate anion, propionate anion, maleate anion, oxalate anion, malonate anion, methylmalonate anion, succinate anion, malate anion, tartrate anion, phthalate anion, citrate anion, glutarate anion, citrate anion, lactate anion, salicylate anions, methanesulfonate anion, octanoate anion, decanoate anion, octanesulfonate anion, decanesulfonate anion, dodecylbenzenesulfonate anion, phenolsulfonate anion, sulfosalicylate anion, camphorsulfonate anion, nonafluorobutanesulfonate anion, toluenesulfonate anion, cumenesulfonate anion, p-octylbenzenesulfonate anion, p-decylbenzenesulfonate anion, 4-octyl 2-phenoxybenzenesulfonate anion, and 4-carboxybenzenesulfonate anion. In addition, they may have a unit structure of a silane having an anionic functional group or a polysiloxane having an anionic functional group, or a polysiloxane having an anionic functional group for forming an intramolecular salt.

Here, examples of counterions for ionic functional groups include, as cations, hydrogen cation, ammonium cation, sulfonium cation, iodonium cation, phosphonium cation, and oxonium cation.

As the alkyl group, a linear or branched alkyl group having a carbon atom number of 1 to 10 may be exemplified, and examples thereof include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group and 1-ethyl-2-methyl-n-propyl group.

In addition, a cyclic alkyl group can be used, and for example, $C_{3-10}$ cyclic alkyl groups may be exemplified. Specific examples thereof include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group and 2-ethyl-3-methyl-cyclopropyl group.

As the aryl group, for example, $C_{6-20}$ aryl groups may be exemplified. Specific examples thereof include phenyl group, o-methylphenyl group, m-methylphenyl group, p-methylphenyl group, o-chlorphenyl group, m-chlorphenyl group, p-chlorphenyl group, o-fluorophenyl group, p-mercaptophenyl group, o-methoxyphenyl group, p-methoxyphenyl group, p-aminophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group and 9-phenanthryl group.

In addition, examples of the halogenated alkyl group and the halogenated aryl group include groups in which one or more hydrogen atoms of the alkyl group or aryl group are substituted with halogen atoms such as fluorine, chlorine, bromine, or iodine.

As the alkenyl group, for example, $C_{2-10}$ alkenyl groups may be exemplified. Specific examples thereof include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group and 3-cyclohexenyl group.

Here, in the alkenyl group, one or more hydrogen atoms may be substituted with halogen atoms such as fluorine, chlorine, bromine, or iodine (halogenated alkenyl group).

Examples of organic groups having an epoxy group include glycidoxymethyl, glycidoxyethyl, glycidoxypropyl, glycidoxybutyl, and epoxycyclohexyl groups.

Examples of organic groups having an acryloyl group include acryloylmethyl, acryloylethyl, and acryloylpropyl groups.

Examples of organic groups having a methacryloyl group include methacryloylmethyl, methacryloylethyl, and methacryloylpropyl groups.

Examples of organic groups having a mercapto group include ethylmercapto, butylmercapto, hexylmercapto, and octylmercapto groups.

Examples of organic groups having a cyano group include cyanoethyl and cyanopropyl groups.

As the alkoxy group in $R^2$ in Formula (1) and $R^{10}$ and $R^{20}$ in Formula (1-1), for example, $C_{1-20}$ alkoxy groups having a linear, branched, or cyclic alkyl moiety may be exemplified. Specific examples thereof include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group and 1-ethyl-2-methyl-n-propoxy group, and examples of the cyclic alkoxy group include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group and 2-ethyl-3-methyl-cyclopropoxy group.

As the acyloxy group in $R^2$ in Formula (1) and $R^{10}$ and $R^{20}$ in Formula (1-1), for example, $C_{1-20}$ acyloxy groups may be exemplified. Specific examples thereof include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of halogen groups in $R^2$ in Formula (1), $R^{10}$ and $R^{20}$ in Formula (1-1), and $R^7$ in Formula (3) include fluorine, chlorine, bromine, and iodine.

In the hydrolyzable silane of Formula (1), an example of a silane in which $R^3$ is an organic group having an amino group is shown below, but the present invention is not limited thereto.

Here, among the following exemplary compounds, T is a hydrolyzable group, and is, for example, an alkoxy group, an acyloxy group, or a halogen group, and specific examples of these groups include the above examples. T is particularly preferably an alkoxy group such as a methoxy group and an ethoxy group.

Formula (1-1-1)

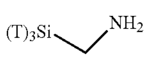

Formula (1-2-1)

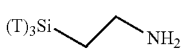

Formula (1-3-1)

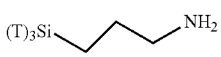

Formula (1-4-1)

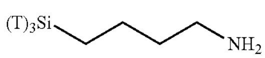

Formula (1-5-1)

Formula (1-6-1)

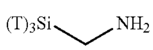

Formula (1-7-1)

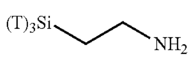

Formula (1-8-1)

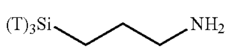

Formula (1-9-1)

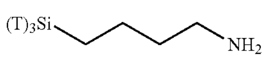

Formula (1-10-1)

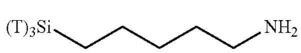

Formula (1-11-1)

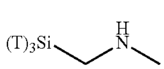

Formula (1-12-1)

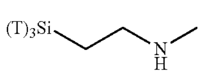

Formula (1-13-1)

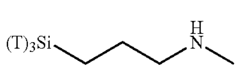

Formula (1-14-1)

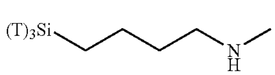

Formula (1-15-1)

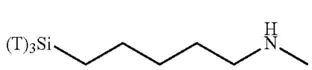

-continued

Formula (1-16-1)

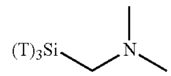

Formula (1-17-1)

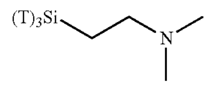

Formula (1-18-1)

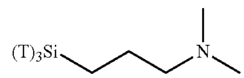

Formula (1-19-1)

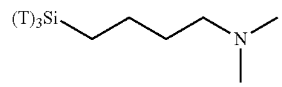

Formula (1-20-1)

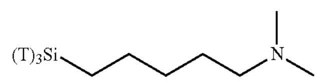

Formula (1-21-1)

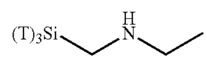

Formula (1-22-1)

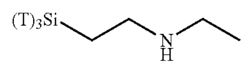

Formula (1-23-1)

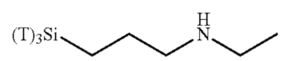

Formula (1-24-1)

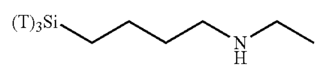

Formula (1-25-1)

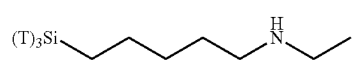

Formula (1-26-1)

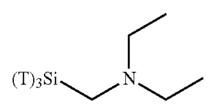

Formula (1-27-1)

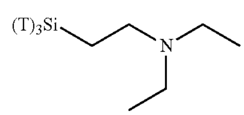

Formula (1-28-1)

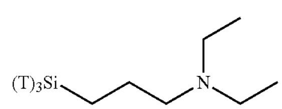

Formula (1-29-1)

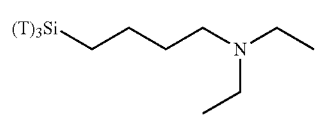

Formula (1-30-1)

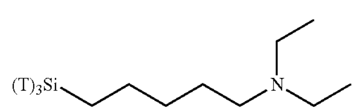

Formula (1-31-1)

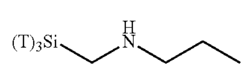

Formula (1-32-1)

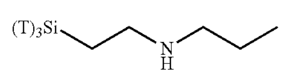

Formula (1-33-1)

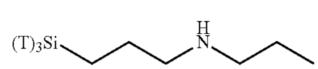

-continued
Formula (1-34-1)
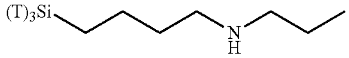
Formula (1-35-1)
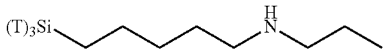
Formula (1-36a-1)
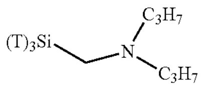
Formula (1-36b-1)
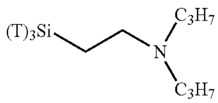
Formula (1-36c-1)
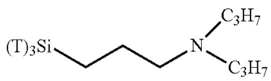
Formula (1-36d-1)
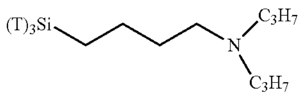
Formula (1-36e-1)
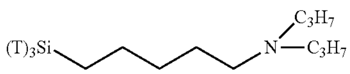
Formula (1-37-1)
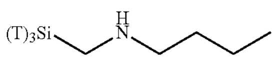
Formula (1-38-1)
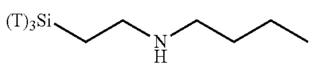
Formula (1-39-1)
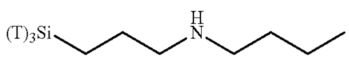
Formula (1-40-1)
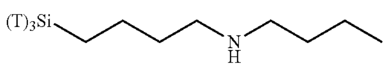
Formula (1-41-1)
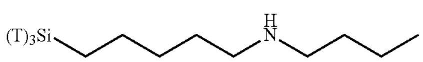
Formula (1-42-1)
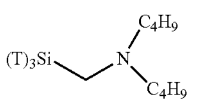
Formula (1-43-1)
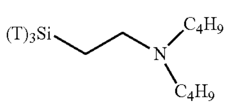
Formula (1-44-1)
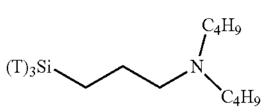
Formula (1-45-1)
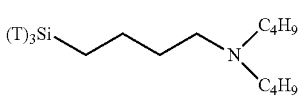
Formula (1-46-1)
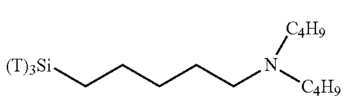
-continued
Formula (1-47-1)
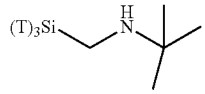
Formula (1-48-1)
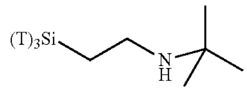
Formula (1-49-1)
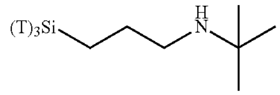
Formula (1-50-1)
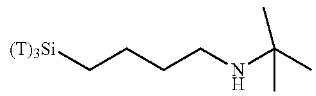
Formula (1-51-1)
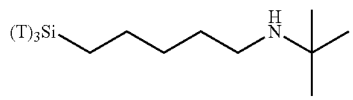
Formula (1-52-1)
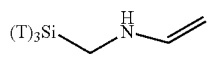
Formula (1-53-1)
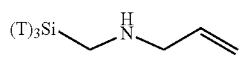
Formula (1-54-1)
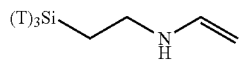
Formula (1-55-1)
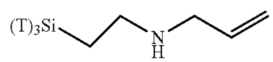
Formula (1-56-1)
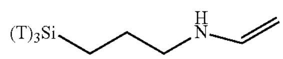
Formula (1-57-1)
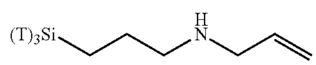
Formula (1-58-1)
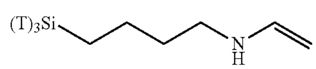
Formula (1-59-1)
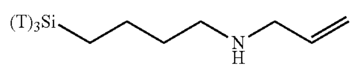
Formula (1-60-1)
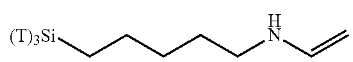
Formula (1-61-1)
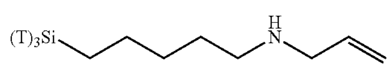
Formula (1-62-1)
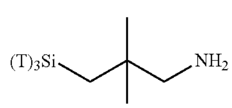
Formula (1-63-1)
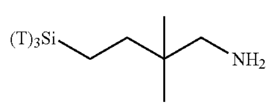
Formula (1-64-1)
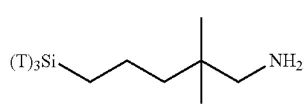

-continued
Formula (1-65-1)
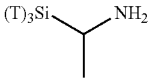
Formula (1-66-1)
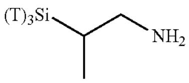
Formula (1-67-1)
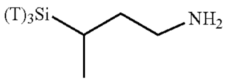
Formula (1-68-1)
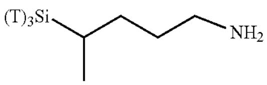
Formula (1-69-1)
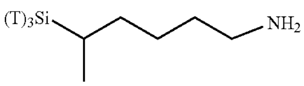
Formula (1-70-1)
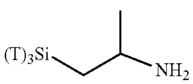
Formula (1-71-1)
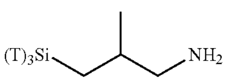
Formula (1-72-1)
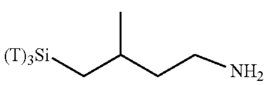
Formula (1-73-1)
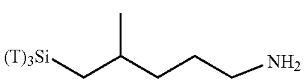
Formula (1-74-1)
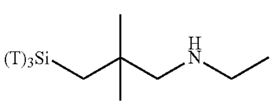
Formula (1-75-1)
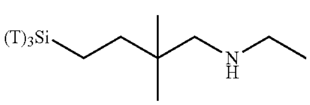
Formula (1-76-1)
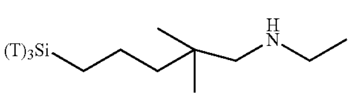
Formula (1-77-1)
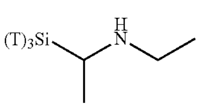
Formula (1-78-1)
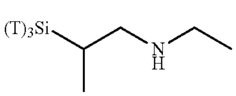
Formula (1-79-1)
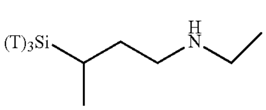
Formula (1-80-1)
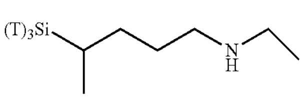
-continued
Formula (1-81-1)
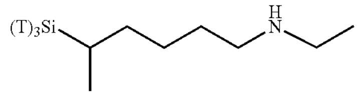
Formula (1-82-1)
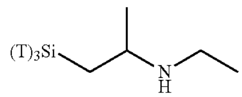
Formula (1-83-1)
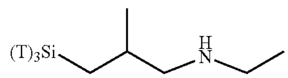
Formula (1-84-1)
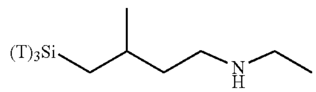
Formula (1-85-1)
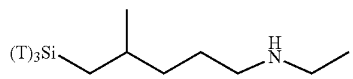
Formula (1-86-1)
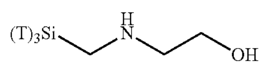
Formula (1-87-1)
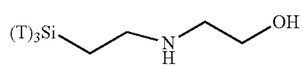
Formula (1-88-1)
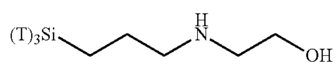
Formula (1-89-1)
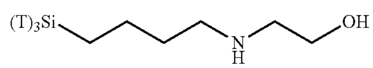
Formula (1-90-1)
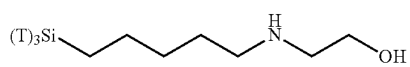
Formula (1-91-1)
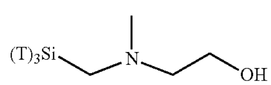
Formula (1-92-1)
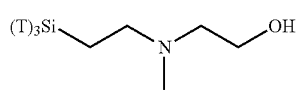
Formula (1-93-1)
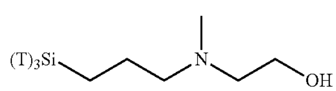
Formula (1-94-1)
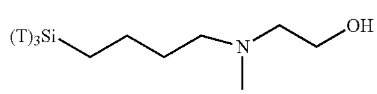
Formula (1-95-1)
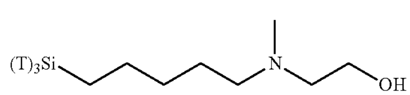
Formula (1-96-1)
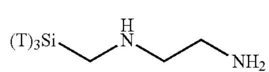
Formula (1-97-1)
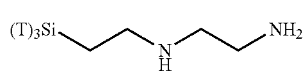
Formula (1-98-1)
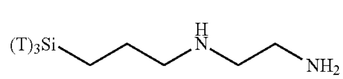

-continued
Formula (1-99-1)
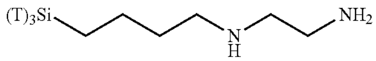
Formula (1-100-1)
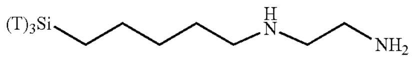
Formula (1-101-1)
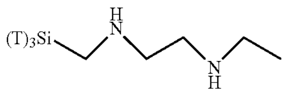
Formula (1-102-1)
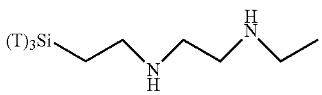
Formula (1-103-1)
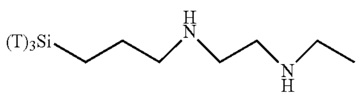
Formula (1-104-1)
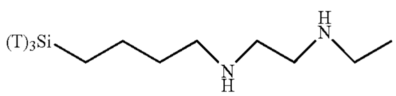
Formula (1-105-1)
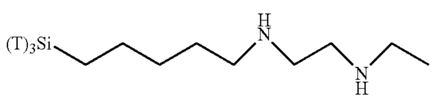
Formula (1-106-1)
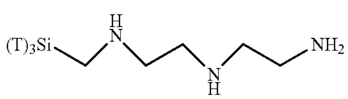
Formula (1-107-1)
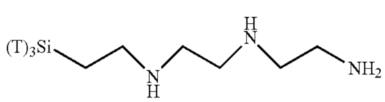
Formula (1-108-1)
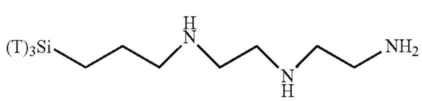
Formula (1-109-1)
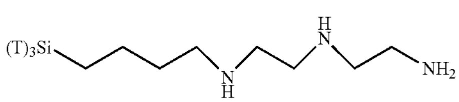
Formula (1-110-1)
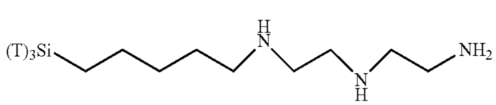
Formula (1-111-1)
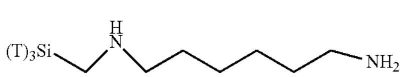
Formula (1-112-1)
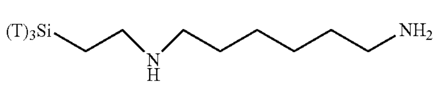
Formula (1-113-1)
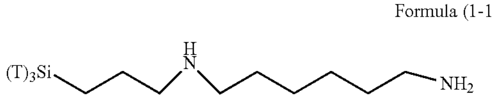
-continued
Formula (1-114-1)
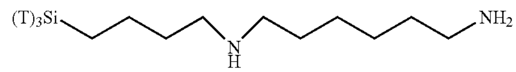
Formula (1-115-1)
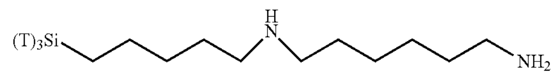
Formula (1-116-1)
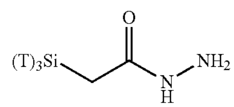
Formula (1-117-1)
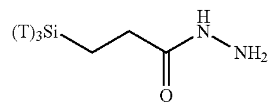
Formula (1-118-1)
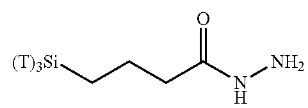
Formula (1-119-1)
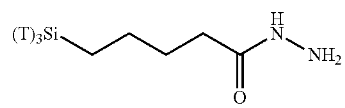
Formula (1-120-1)
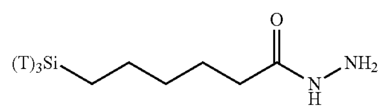
Formula (1-121-1)
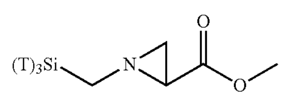
Formula (1-122-1)
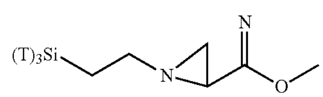
Formula (1-123-1)
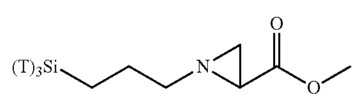
Formula (1-124-1)
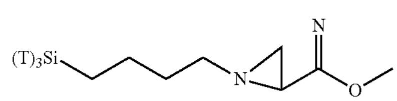
Formula (1-125-1)
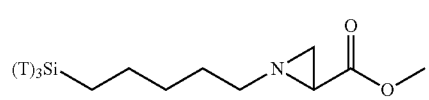
Formula (1-126-1)
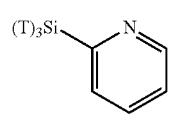
Formula (1-127-1)
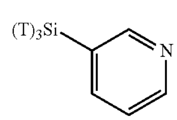

-continued
Formula (1-128-1)
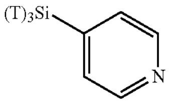
Formula (1-129-1)
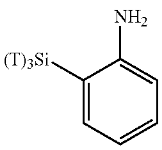
Formula (1-130-1)
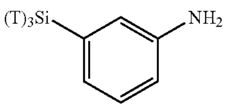
Formula (1-131-1)
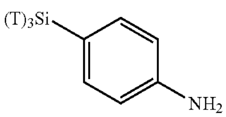
Formula (1-132-1)
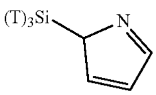
Formula (1-33-1)
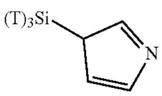
Formula (1-134-1)
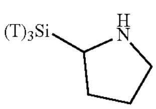
Formula (1-135-1)
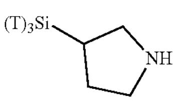
Formula (1-136-1)
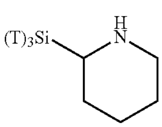
Formula (1-137-1)
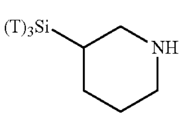
Formula (1-138-1)
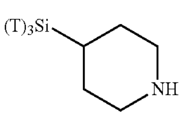
Formula (1-139-1)
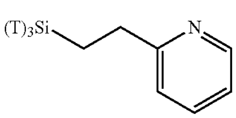
Formula (1-140-1)
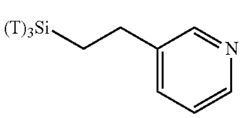
-continued
Formula (1-141-1)
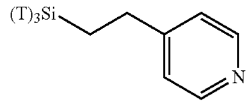
Formula (1-142-1)
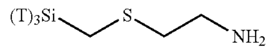
Formula (1-143-1)
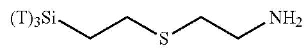
Formula (1-144-1)
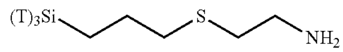
Formula (1-145-1)
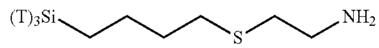
Formula (1-146-1)
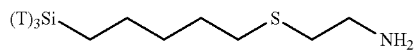
Formula (1-147-1)
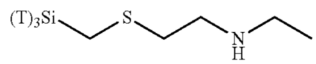
Formula (1-148-1)
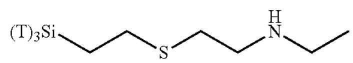
Formula (1-149-1)
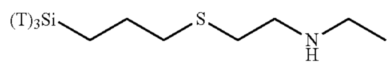
Formula (1-150-1)
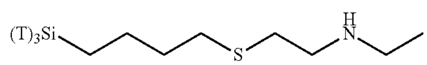
Formula (1-151-1)
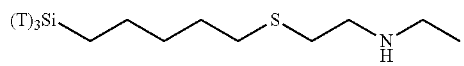
Formula (1-152-1)
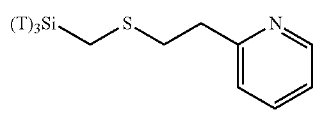
Formula (1-153-1)
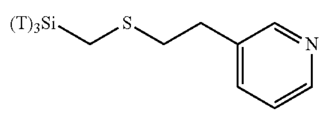
Formula (1-154-1)
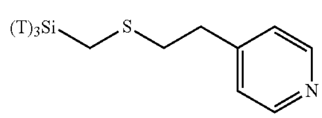
Formula (1-155-1)
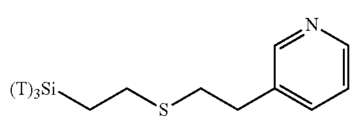
Formula (1-156-1)
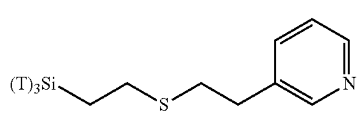
Formula (1-157-1)
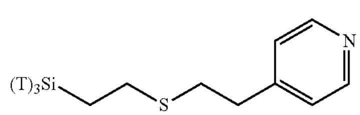

-continued
Formula (1-158-1)
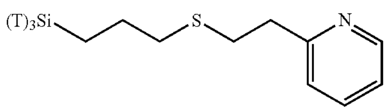
Formula (1-159-1)
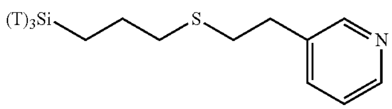
Formula (1-160-1)
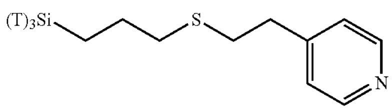
Formula (1-161-1)
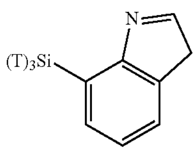
Formula (1-162-1)
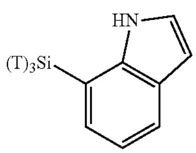
Formula (1-163-1)
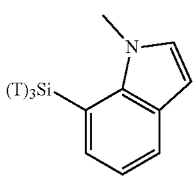
Formula (1-164-1)
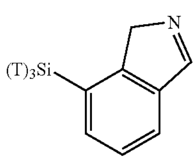
Formula (1-165-1)
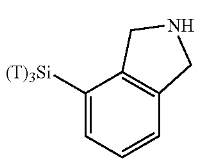
Formula (1-166-1)
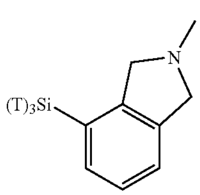
Formula (1-167-1)
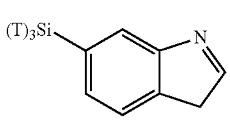
-continued
Formula (1-168-1)
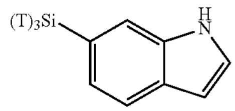
Formula (1-169-1)
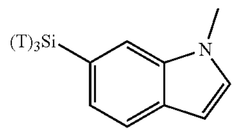
Formula (1-170-1)
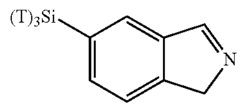
Formula (1-171-1)
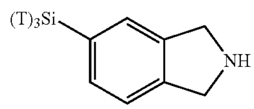
Formula (1-172-1)
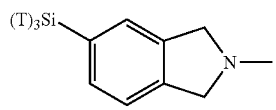
Formula (1-173-1)
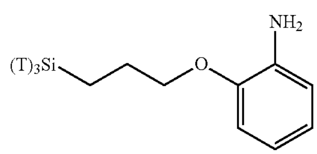
Formula (1-174-1)
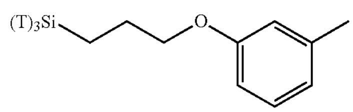
Formula (1-175-1)
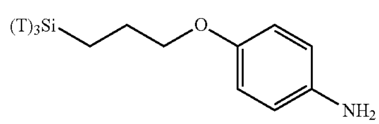
Formula (1-176-1)
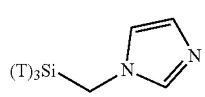
Formula (1-177-1)
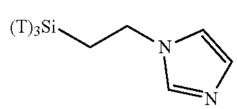
Formula (1-178-1)
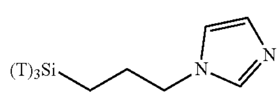
Formula (1-179-1)
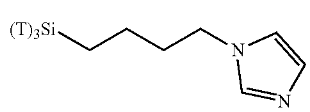
Formula (1-180-1)
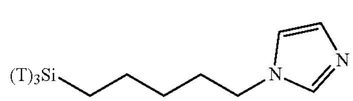
Formula (1-181-1)
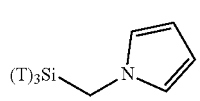

-continued
Formula (1-182-1)
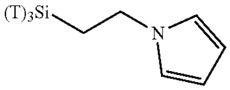
Formula (1-183-1)
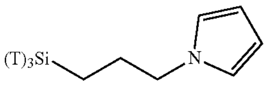
Formula (1-184-1)
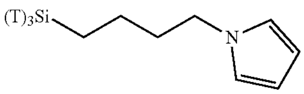
Formula (1-185-1)
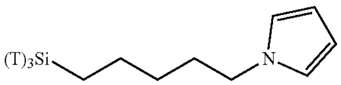
Formula (1-186-1)
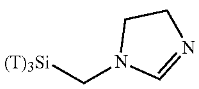
Formula (1-187-1)
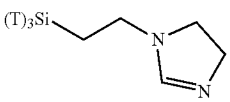
Formula (1-188-1)
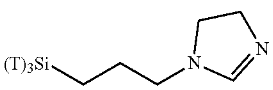
Formula (1-189-1)
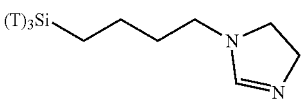
Formula (1-190-1)
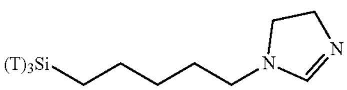
Formula (1-191-1)
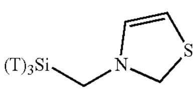
Formula (1-192-1)
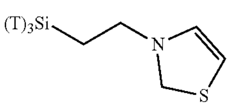
Formula (1-193-1)
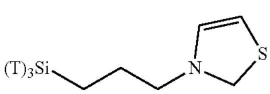
Formula (1-194-1)
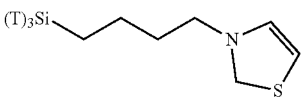
Formula (1-195-1)
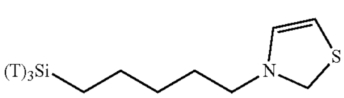
Formula (1-196-1)
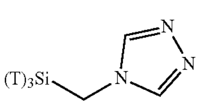
-continued
Formula (1-197-1)
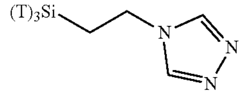
Formula (1-198-1)
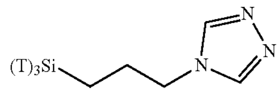
Formula (1-199-1)
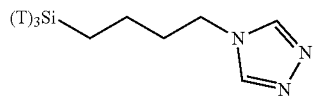
Formula (1-200-1)
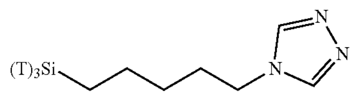
Formula (1-201-1)
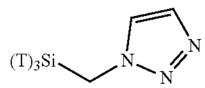
Formula (1-202-1)
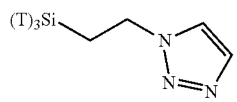
Formula (1-203-1)
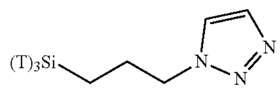
Formula (1-204-1)
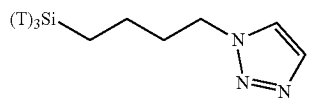
Formula (1-205-1)
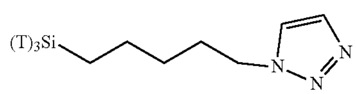
Formula (1-206-1)
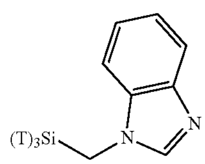
Formula (1-207-1)
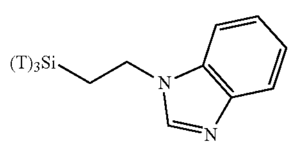
Formula (1-208-1)
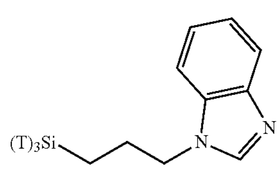
Formula (1-209-1)
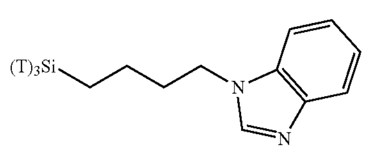

-continued
Formula (1-210-1)
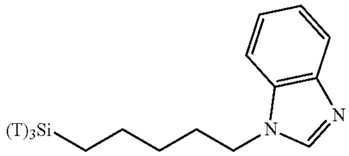
Formula (1-211-1)
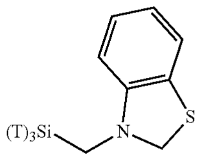
Formula (1-212-1)
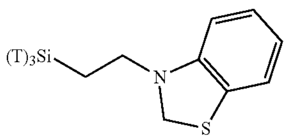
Formula (1-213-1)
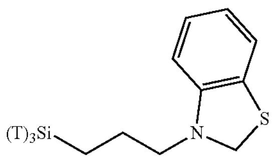
Formula (1-214-1)
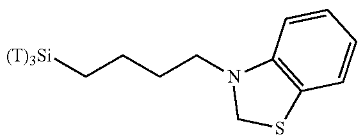
Formula (1-215-1)
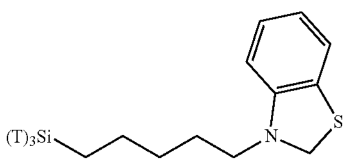
Formula (1-216-1)
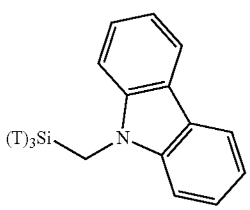
Formula (1-217-1)
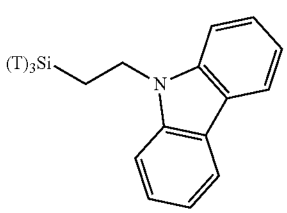
Formula (1-218-1)
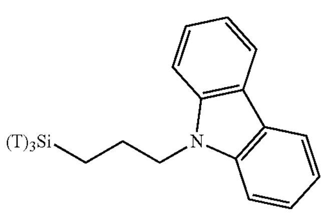
-continued
Formula (1-219-1)
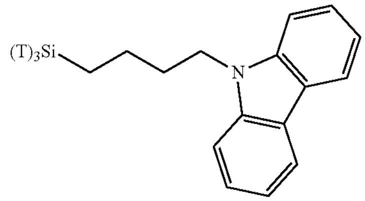
Formula (1-220-1)
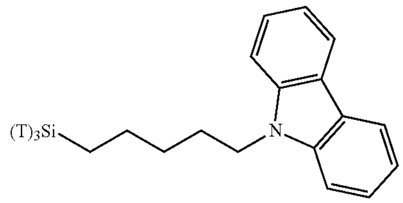
Formula (1-221-1)
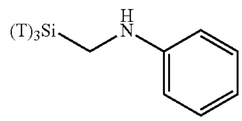
Formula (1-222-1)
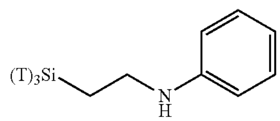
Formula (1-223-1)
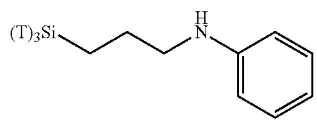
Formula (1-224-1)
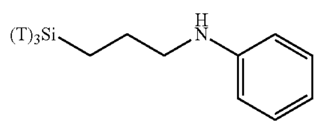
Formula (1-225-1)
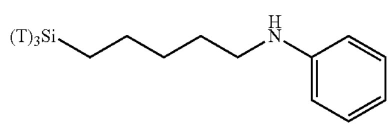
Formula (1-226-1)
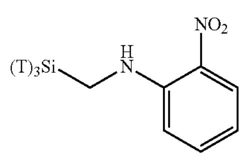
Formula (1-227-1)
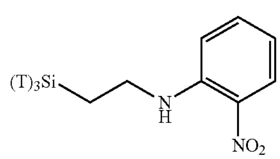
Formula (1-228-1)
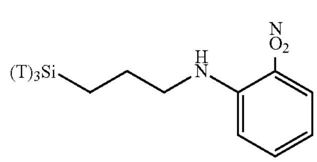

-continued
Formula (1-229-1)
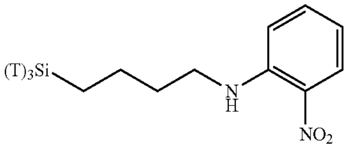
Formula (1-230-1)
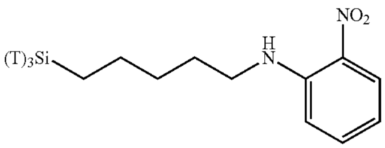
Formula (1-231-1)
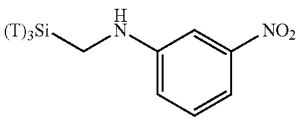
Formula (1-232-1)
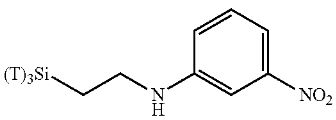
Formula (1-233-1)
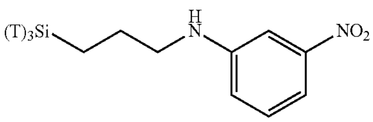
Formula (1-234-1)
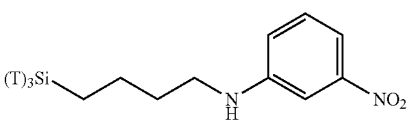
Formula (1-235-1)
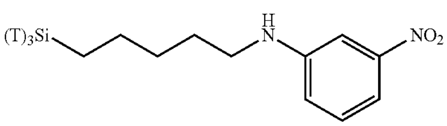
Formula (1-236-1)
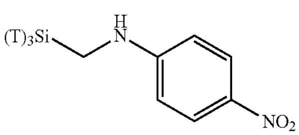
Formula (1-237-1)
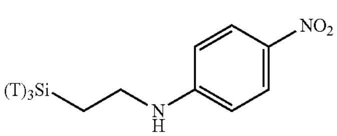
Formula (1-238-1)
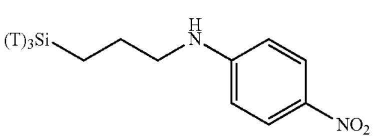
Formula (1-239-1)
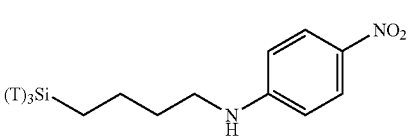
-continued
Formula (1-240-1)
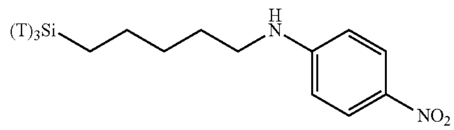
Formula (1-241-1)
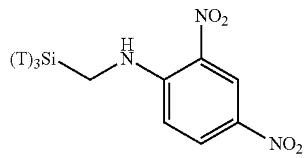
Formula (1-242-1)
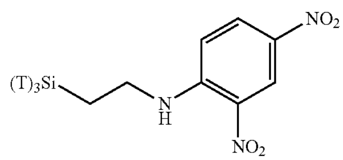
Formula (1-243-1)
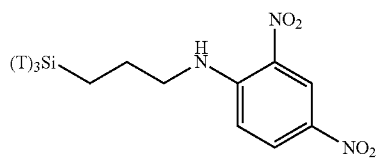
Formula (1-244-1)
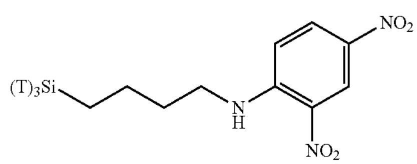
Formula (1-245-1)
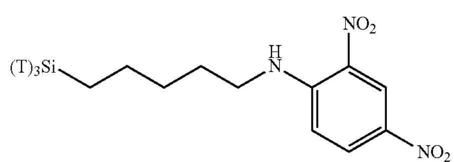
Formula (1-246-1)
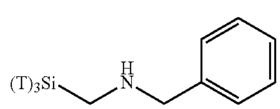
Formula (1-247-1)
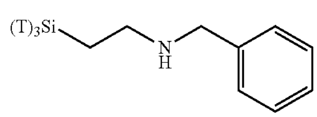
Formula (1-248-1)
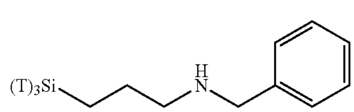
Formula (1-249-1)
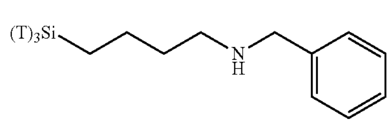

Formula (1-250-1)
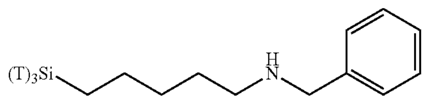
Formula (1-251-1)
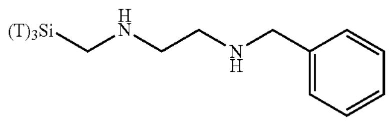
Formula (1-252-1)
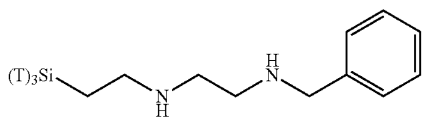
Formula (1-253-1)
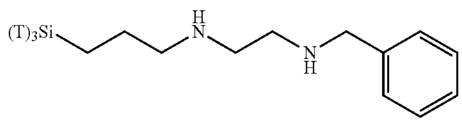
Formula (1-254-1)
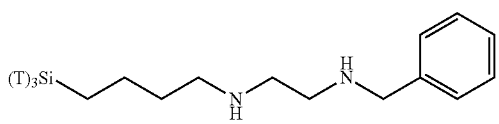
Formula (1-255-1)
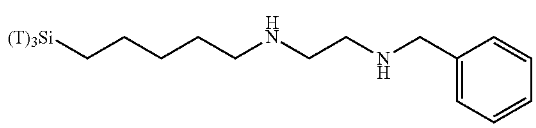
Formula (1-256-1)
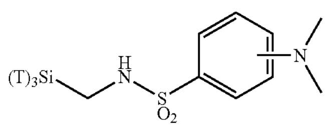
Formula (1-257-1)
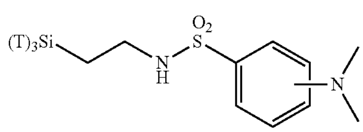
Formula (1-258-1)
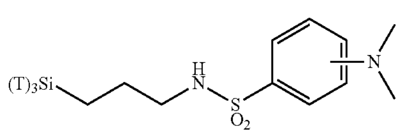
Formula (1-259-1)
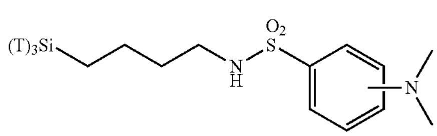
Formula (1-260-1)
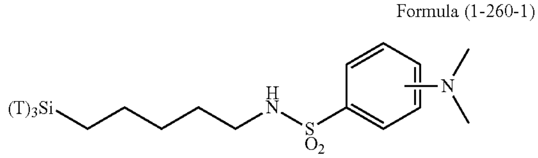
Formula (1-261-1)
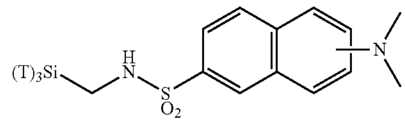
Formula (1-262-1)
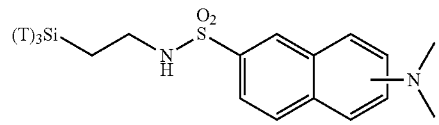
Formula (1-263-1)
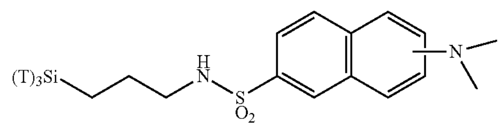
Formula (1-264-1)
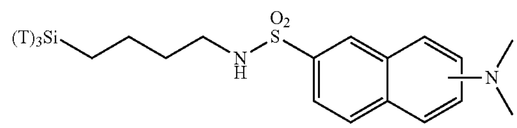
Formula (1-265-1)
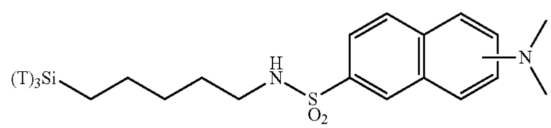
Formula (1-266-1)
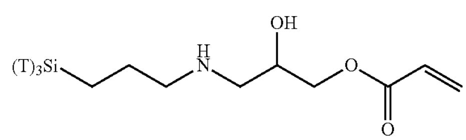
Formula (1-267-1)
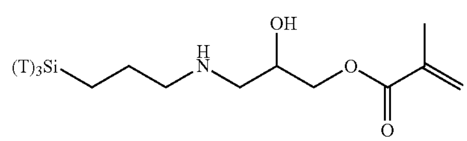
Formula (1-268-1)
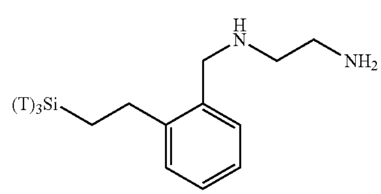
Formula (1-269-1)
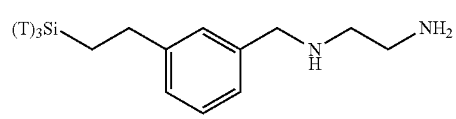
Formula (1-270-1)
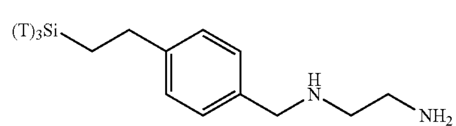

-continued
Formula (1-271-1)
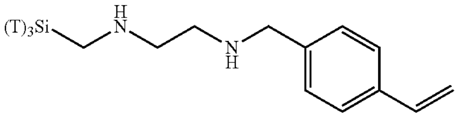
Formula (1-272-1)
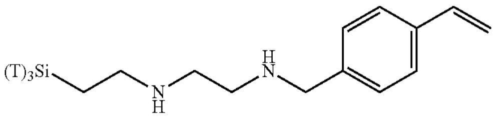
Formula (1-273-1)
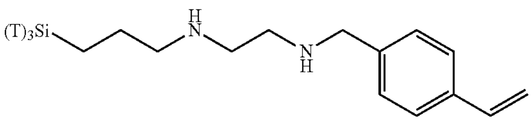
Formula (1-274-1)
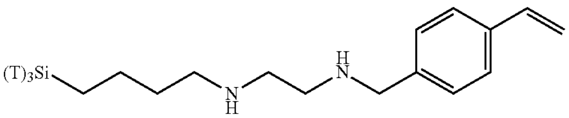
Formula (1-275-1)
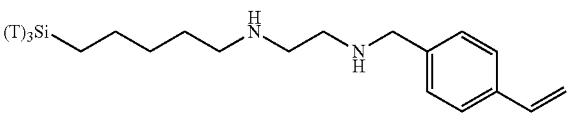
Formula (1-276-1)
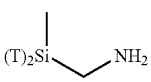
Formula (1-277-1)
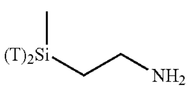
Formula (1-278-1)
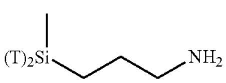
Formula (1-279-1)
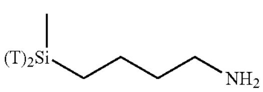
Formula (1-280-1)
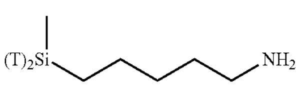
Formula (1-281-1)
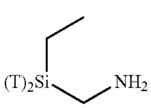
Formula (1-282-1)
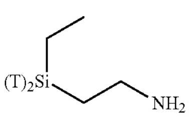
Formula (1-283-1)
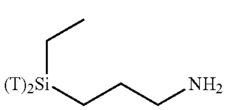
-continued
Formula (1-284-1)
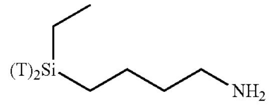
Formula (1-285-1)
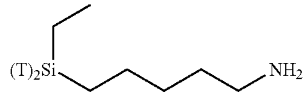
Formula (1-286-1)
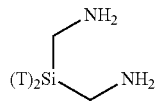
Formula (1-287-1)
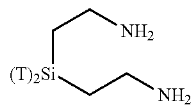
Formula (1-288-1)
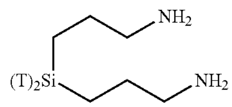
Formula (1-289-1)
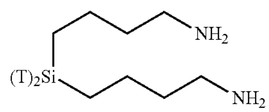
Formula (1-290-1)
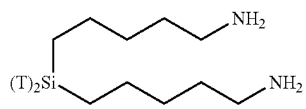
Formula (1-291-1)
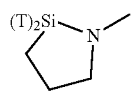
Formula (1-292-1)
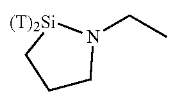
Formula (1-293-1)
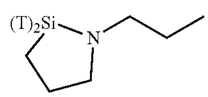
Formula (1-294-1)
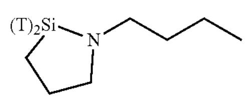
Formula (1-295-1)
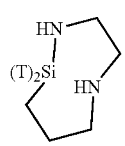
Formula (1-296-1)
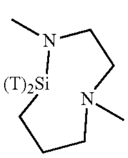

Formula (1-297-1)

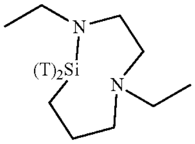

Formula (1-298-1)

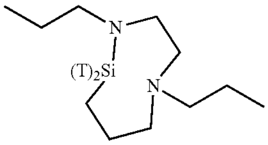

Formula (1-299-1)

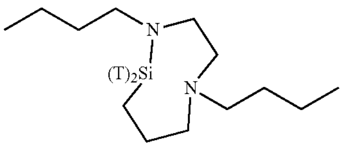

Formula (1-300-1)

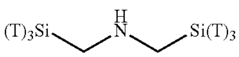

Formula (1-301-1)

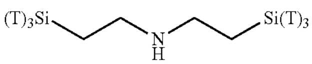

Formula (1-302-1)

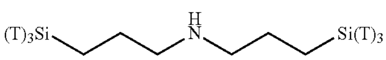

Formula (1-303-1)

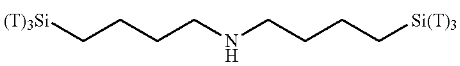

Formula (1-304-1)

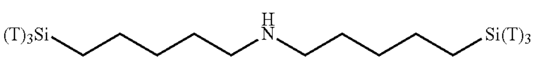

Formula (1-305-1)

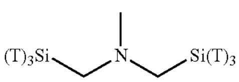

Formula (1-306-1)

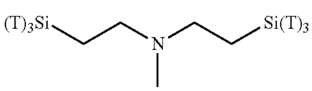

Formula (1-307-1)

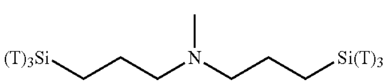

Formula (1-308-1)

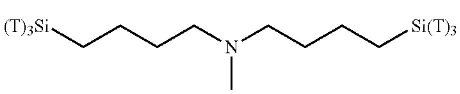

Formula (1-309-1)

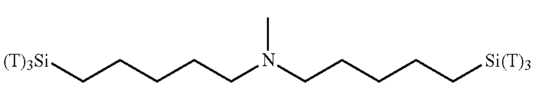

Formula (1-310-1)

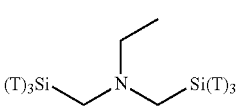

Formula (1-311-1)

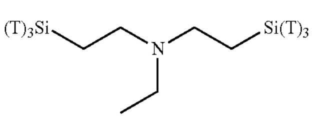

Formula (1-312-1)

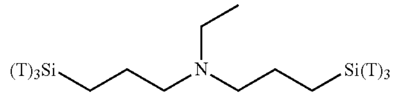

Formula (1-313-1)

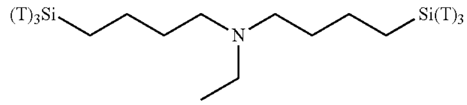

Formula (1-314-1)

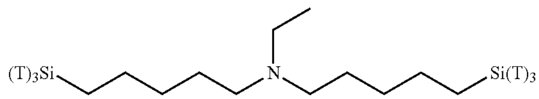

Formula (1-315-1)

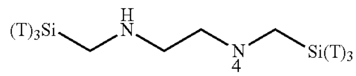

Formula (1-316-1)

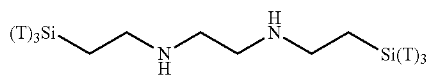

Formula (1-317-1)

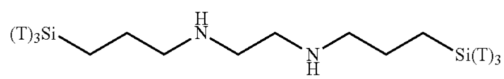

Formula (1-318-1)

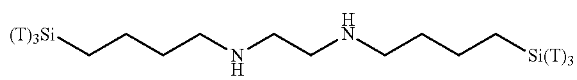

Formula (1-319-1)

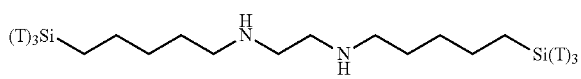

Formula (1-320-1)

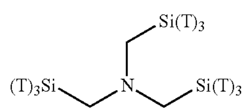

Formula (1-321-1)

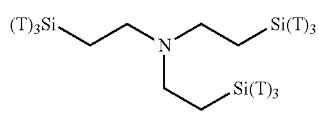

Formula (1-322-1)

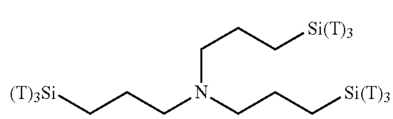

Formula (1-323-1)

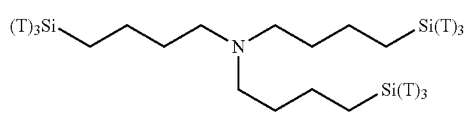

Formula (1-324-1)

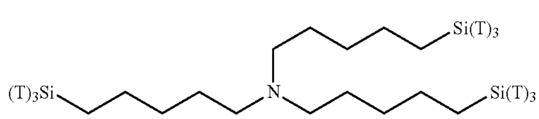

An example of a silane in which $R^3$ is an organic group having an ionic functional group in the hydrolyzable silane of Formula (1), and an example of a silane in which $R^{30}$ is an organic group having an ionic functional group in the hydrolyzable silane of Formula (1-1) are shown below, but the present invention is not limited thereto. Here, among the following exemplary compounds, T is a hydrolyzable group, and is, for example, an alkoxy group, an acyloxy group, or a halogen group, and specific examples of these groups include the above examples. T is particularly preferably an alkoxy group such as a methoxy group and an ethoxy group.

X and Y in the following formulae mean counterions for ionic functional groups, and specific examples thereof include anions and cations as counterions for the ionic functional groups described above. Here, in the formulae, $X^-$ and $Y^+$ are a monovalent anion and a monovalent cation, respectively, but when $X^-$ and $Y^+$ are divalent ions among the above ion examples, the coefficient before the ion displayed is a numerical value multiplied by ½, and similarly, when trivalent ions are shown, the coefficient for the ion displayed is a numerical value multiplied by ⅓.

Formula (1-1-2)

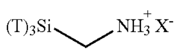

Formula (1-2-2)

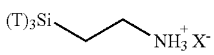

Formula (1-3-2)

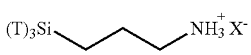

Formula (1-4-2)

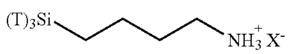

Formula (1-5-2)

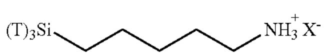

Formula (1-6-2)

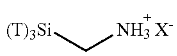

Formula (1-7-2)

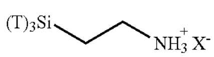

Formula (1-8-2)

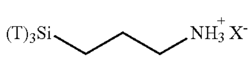

Formula (1-9-2)

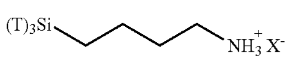

Formula (1-10-2)

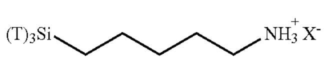

Formula (1-11-2)

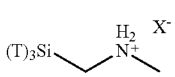

Formula (1-12-2)

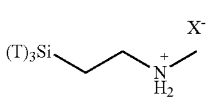

Formula (1-13-2)

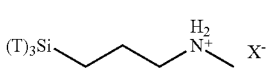

Formula (1-14-2)

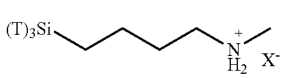

Formula (1-15-2)

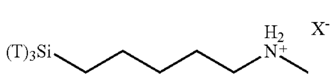

-continued

Formula (1-16-2)

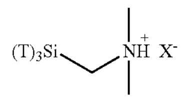

Formula (1-17-2)

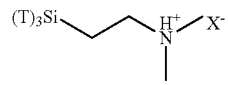

Formula (1-18-2)

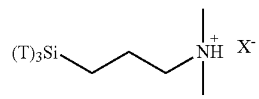

Formula (1-19-2)

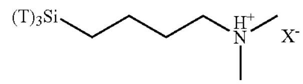

Formula (1-20-2)

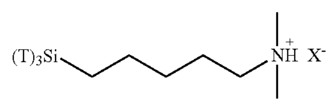

Formula (1-21-2)

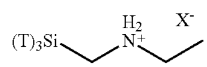

Formula (1-22-2)

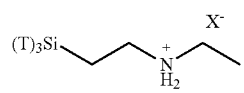

Formula (1-23-2)

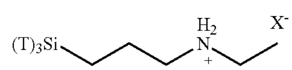

Formula (1-24-2)

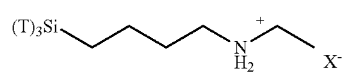

Formula (1-25-2)

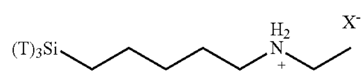

Formula (1-26-2)

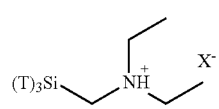

Formula (1-27-2)

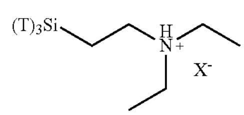

Formula (1-28-2)

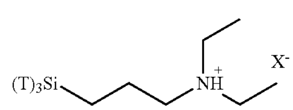

Formula (1-29-2)

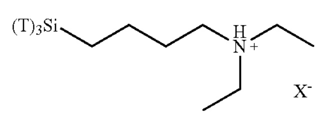

Formula (1-30-2)

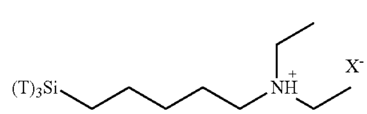

Formula (1-31-2)

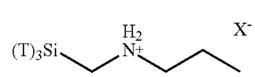

-continued
Formula (1-32-2)
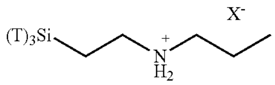
Formula (1-33-2)
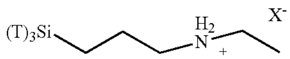
Formula (1-34-2)
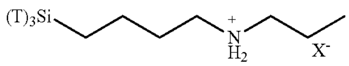
Formula (1-35-2)
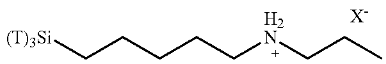
Formula (1-36a-2)
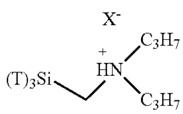
Formula (1-36b-2)
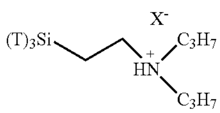
Formula (1-36c-2)
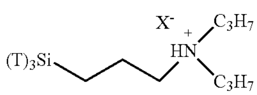
Formula (1-36d-2)
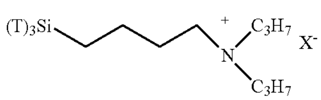
Formula (1-36e-2)
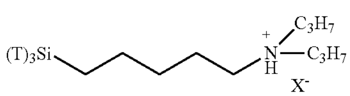
Formula (1-37-2)
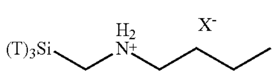
Formula (1-38-2)
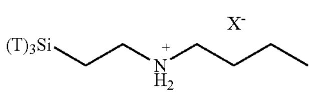
Formula (1-39-2)
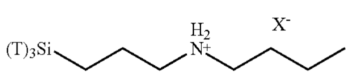
Formula (1-40-2)
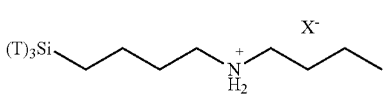
Formula (1-41-2)
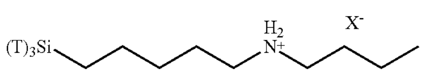
Formula (1-42-2)
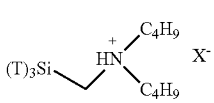
Formula (1-43-2)
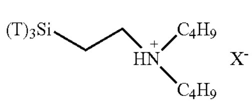
-continued
Formula (1-44-2)
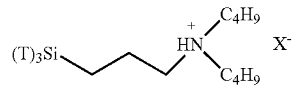
Formula (1-45-2)
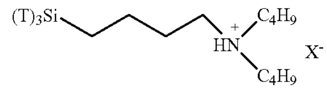
Formula (1-46-2)
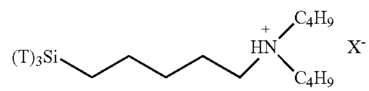
Formula (1-47-2)
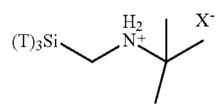
Formula (1-48-2)
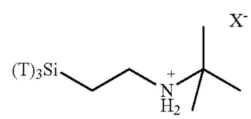
Formula (1-49-2)
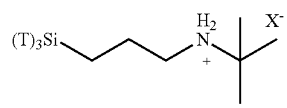
Formula (1-50-2)
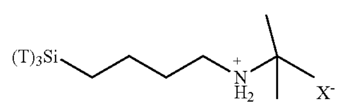
Formula (1-51-2)
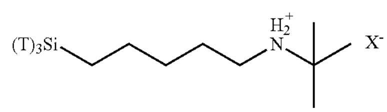
Formula (1-52-2)
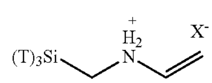
Formula (1-53-2)
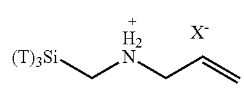
Formula (1-54-2)
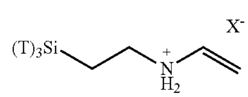
Formula (1-55-2)
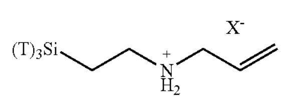
Formula (1-56-2)
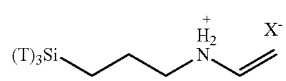
Formula (1-57-2)
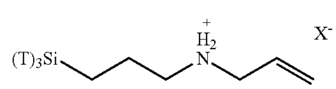
Formula (1-58-2)
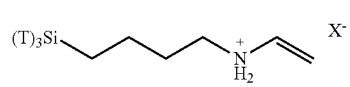

-continued
Formula (1-59-2)
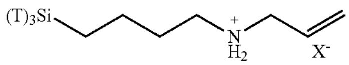
Formula (1-60-2)
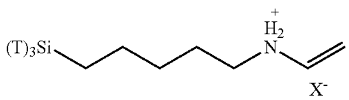
Formula (1-61-2)
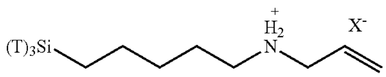
Formula (1-62-2)
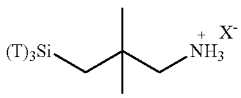
Formula (1-63-2)
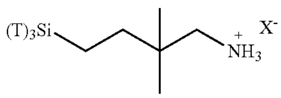
Formula (1-64-2)
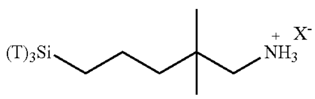
Formula (1-65-2)
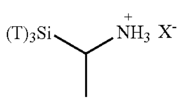
Formula (1-66-2)
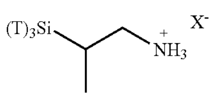
Formula (1-67-2)
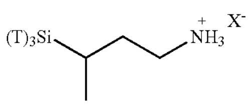
Formula (1-68-2)
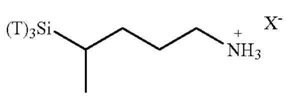
Formula (1-69-2)
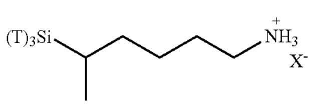
Formula (1-70-2)
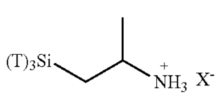
Formula (1-71-2)
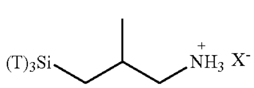
Formula (1-72-2)
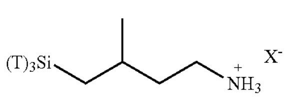
Formula (1-73-2)
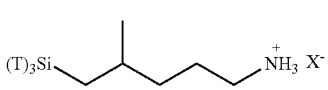
-continued
Formula (1-74-2)
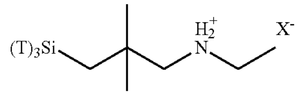
Formula (1-75-2)
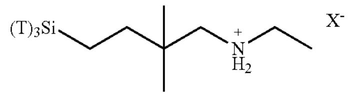
Formula (1-76-2)
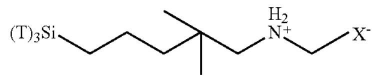
Formula (1-77-2)
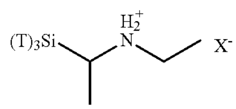
Formula (1-78-2)
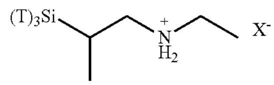
Formula (1-79-2)
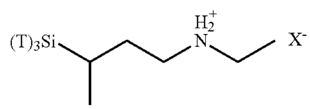
Formula (1-80-2)
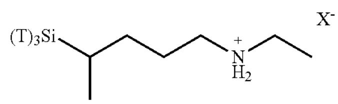
Formula (1-81-2)
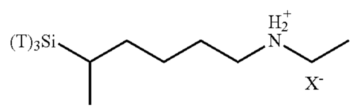
Formula (1-82-2)
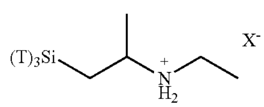
Formula (1-83-2)
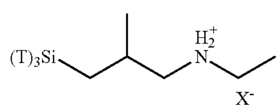
Formula (1-84-2)
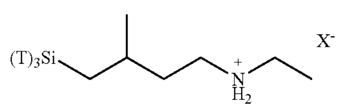
Formula (1-85-2)
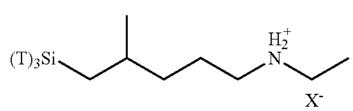
Formula (1-86-2)
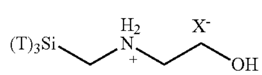
Formula (1-87-2)
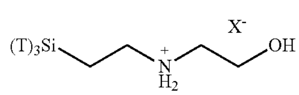
Formula (1-88-2)
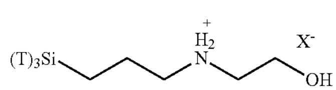

-continued
Formula (1-89-2)
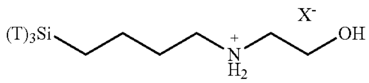
Formula (1-90-2)
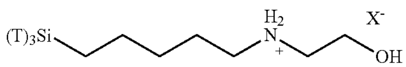
Formula (1-91-2)
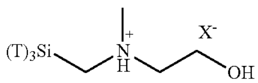
Formula (1-92-2)
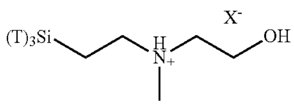
Formula (1-93-2)
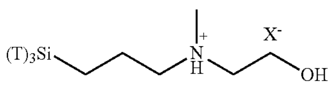
Formula (1-94-2)
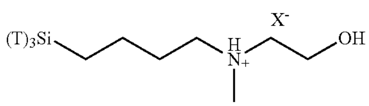
Formula (1-95-2)
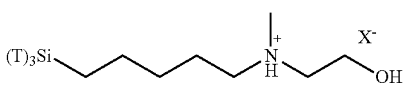
Formula (1-96-2)
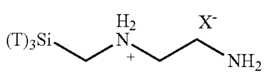
Formula (1-97-2)
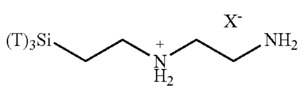
Formula (1-98-2)
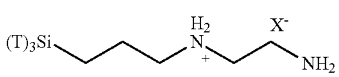
Formula (1-99-2)
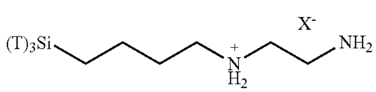
Formula (1-100-2)
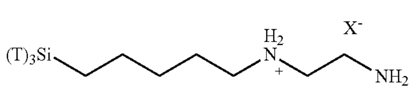
Formula (1-101-2)
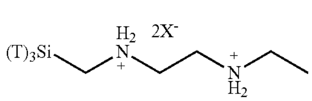
Formula (1-102-2)
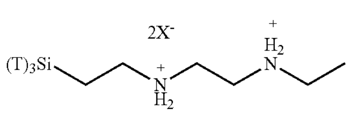
Formula (1-103-2)
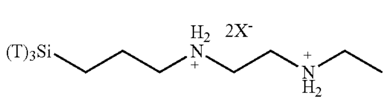
-continued
Formula (1-104-2)
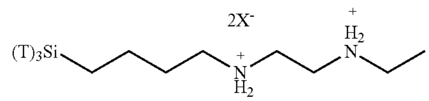
Formula (1-105-2)
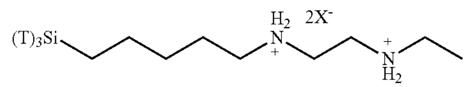
Formula (1-106-2)
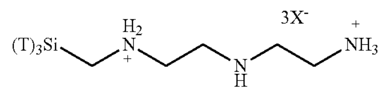
Formula (1-107-2)
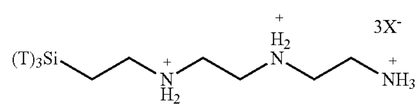
Formula (1-108-2)
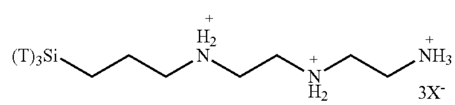
Formula (1-109-2)
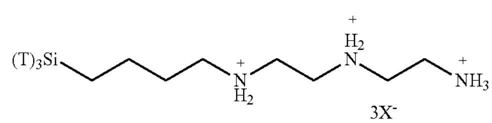
Formula (1-110-2)
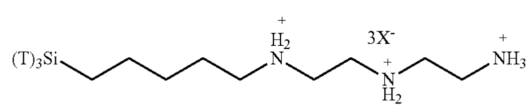
Formula (1-111-2)
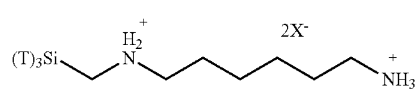
Formula (1-112-2)
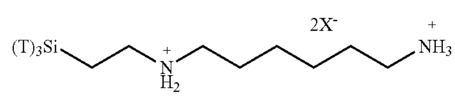
Formula (1-113-2)
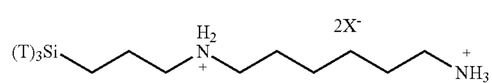
Formula (1-114-2)
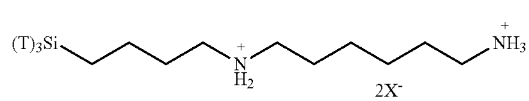
Formula (1-115-2)
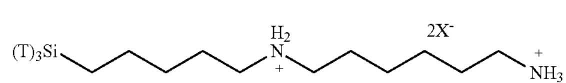

-continued
Formula (1-116-2)
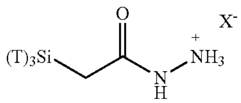
Formula (1-117-2)
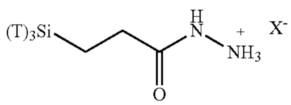
Formula (1-118-2)
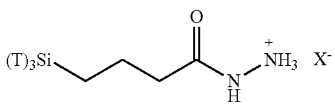
Formula (1-119-2)
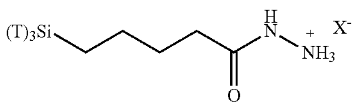
Formula (1-120-2)
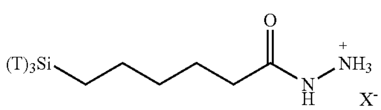
Formula (1-121-2)
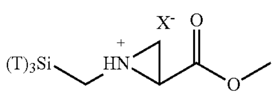
Formula (1-122-2)
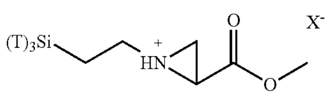
Formula (1-123-2)
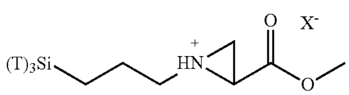
Formula (1-124-2)
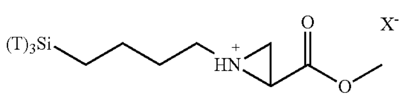
Formula (1-125-2)
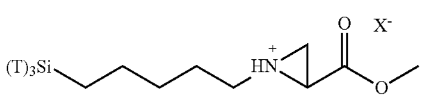
Formula (1-126-2)
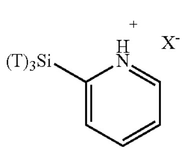
Formula (1-127-2)
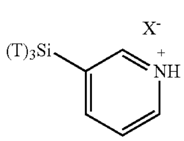
Formula (1-128-2)
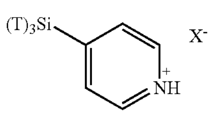
-continued
Formula (1-129-2)
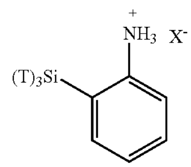
Formula (1-130-2)
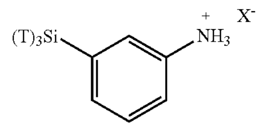
Formula (1-131-2)
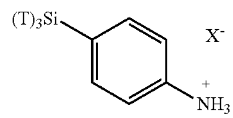
Formula (1-132-2)
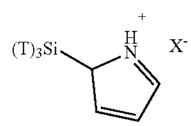
Formula (1-133-2)
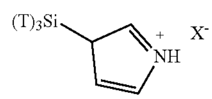
Formula (1-134-2)
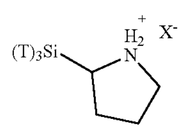
Formula (1-135-2)
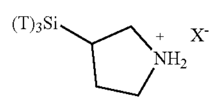
Formula (1-136-2)
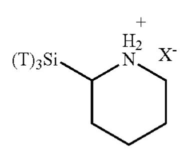
Formula (1-137-2)
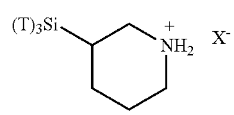
Formula (1-138-2)
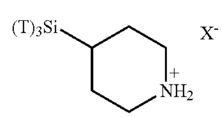
Formula (1-139-2)
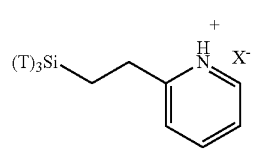
Formula (1-140-2)
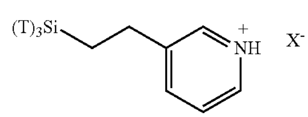

-continued
Formula (1-141-2)
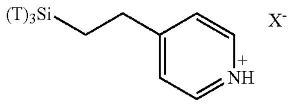
Formula (1-142-2)
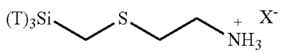
Formula (1-143-2)
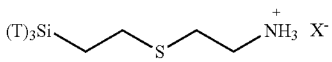
Formula (1-144-2)
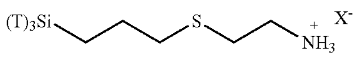
Formula (1-145-2)
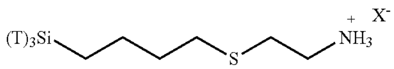
Formula (1-146-2)
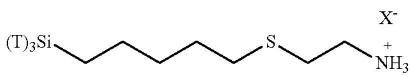
Formula (1-147-2)
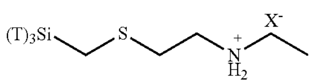
Formula (1-148-2)
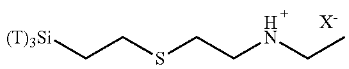
Formula (1-149-2)
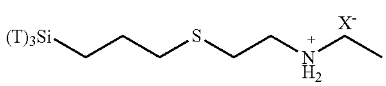
Formula (1-150-2)
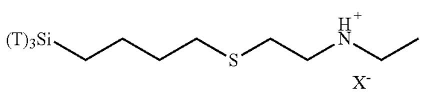
Formula (1-151-2)
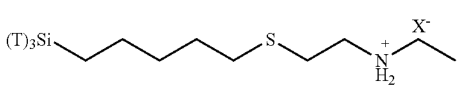
Formula (1-152-2)
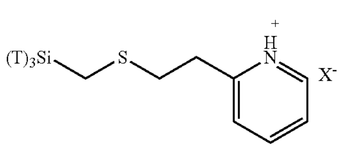
Formula (1-153-2)
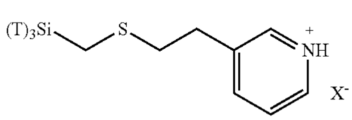
Formula (1-154-2)
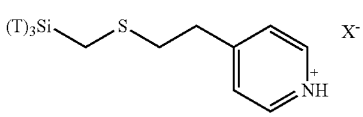
Formula (1-155-2)
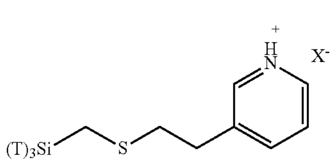
-continued
Formula (1-156-2)
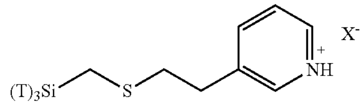
Formula (1-157-2)
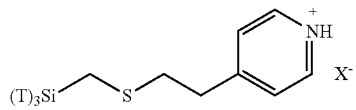
Formula (1-158-2)
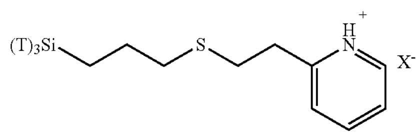
Formula (1-159-2)
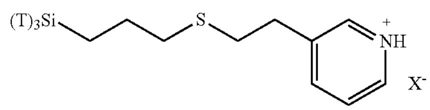
Formula (1-160-2)
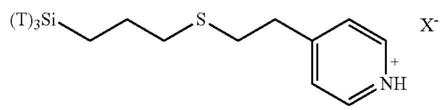
Formula (1-161-2)
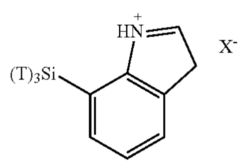
Formula (1-162-2)
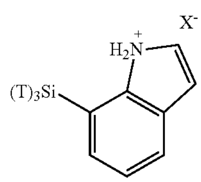
Formula (1-163-2)
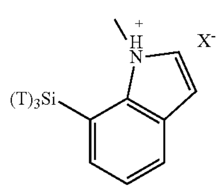
Formula (1-164-2)
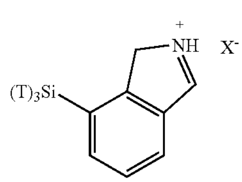
Formula (1-165-2)
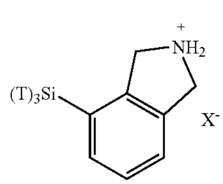

-continued
Formula (1-166-2)
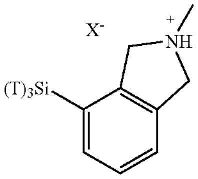
Formula (1-167-2)
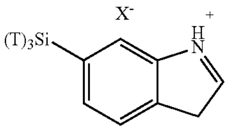
Formula (1-168-2)
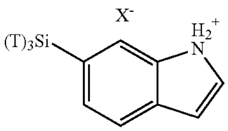
Formula (1-169-2)
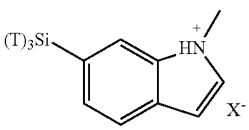
Formula (1-170-2)
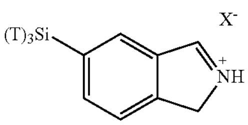
Formula (1-171-2)
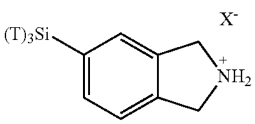
Formula (1-172-2)
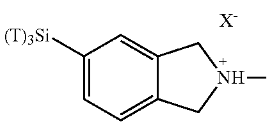
Formula (1-173-2)
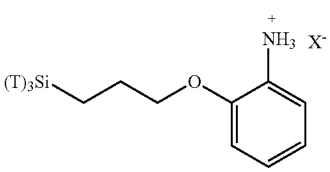
Formula (1-174-2)
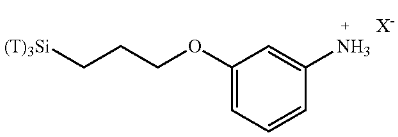
Formula (1-175-2)
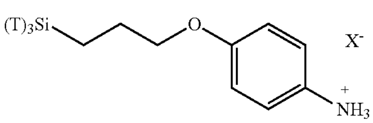
Formula (1-176-2)
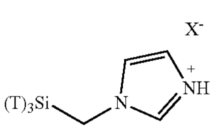
-continued
Formula (1-177-2)
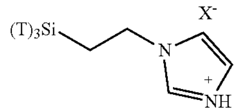
Formula (1-178-2)
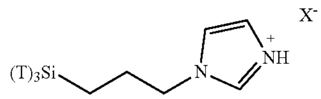
Formula (1-179-2)
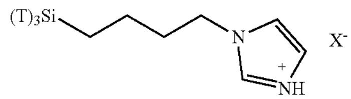
Formula (1-180-2)
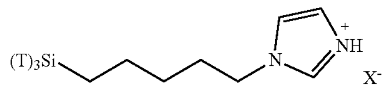
Formula (1-181-2)
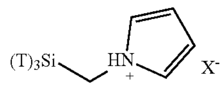
Formula (1-182-2)
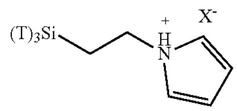
Formula (1-183-2)
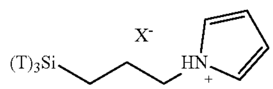
Formula (1-184-2)
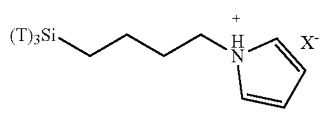
Formula (1-185-2)
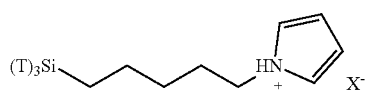
Formula (1-186-2)
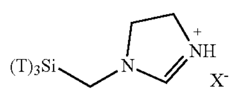
Formula (1-187-2)
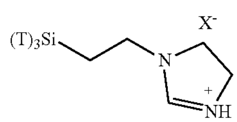
Formula (1-188-2)
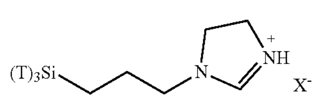
Formula (1-189-2)
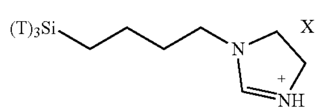
Formula (1-190-2)
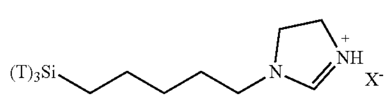

-continued
Formula (1-191-2)
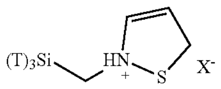
Formula (1-192-2)
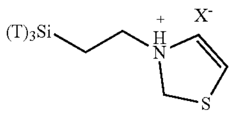
Formula (1-193-2)
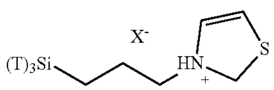
Formula (1-194-2)
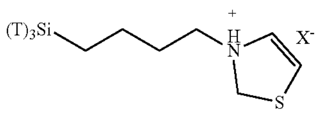
Formula (1-195-2)
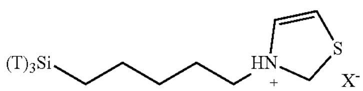
Formula (1-196-2)
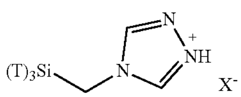
Formula (1-197-2)
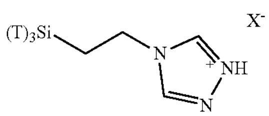
Formula (1-198-2)
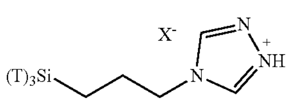
Formula (1-199-2)
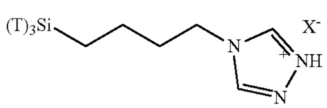
Formula (1-200-2)
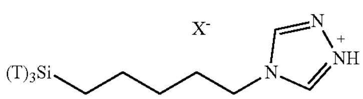
Formula (1-201-2)
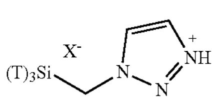
Formula (1-202-2)
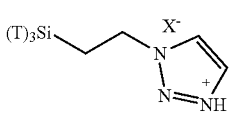
Formula (1-203-2)
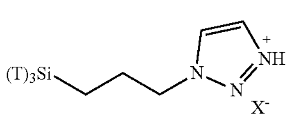
Formula (1-204-2)
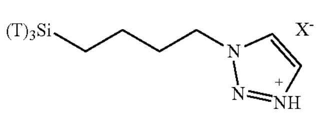
-continued
Formula (1-205-2)
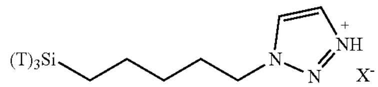
Formula (1-206-2)
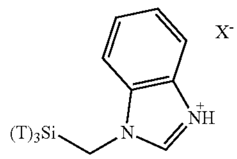
Formula (1-207-2)
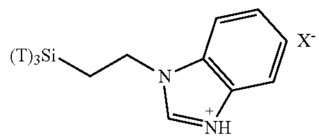
Formula (1-208-2)
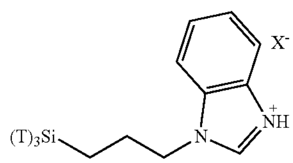
Formula (1-209-2)
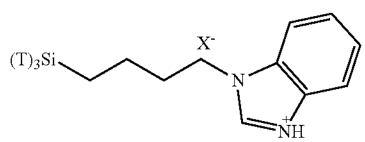
Formula (1-210-2)
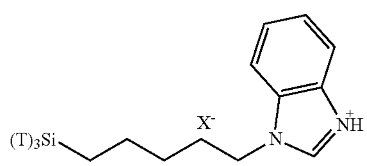
Formula (1-211-2)
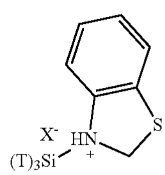
Formula (1-212-2)
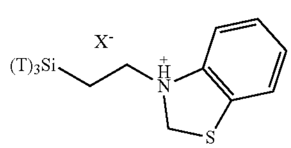
Formula (1-213-2)
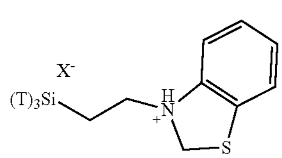
Formula (1-214-2)
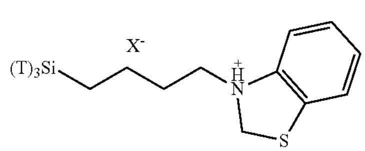

-continued
Formula (1-215-2)
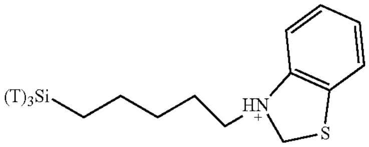
Formula (1-216-2)
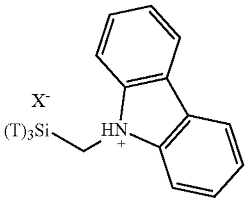
Formula (1-217-2)
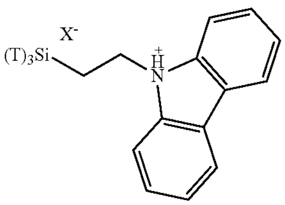
Formula (1-218-2)
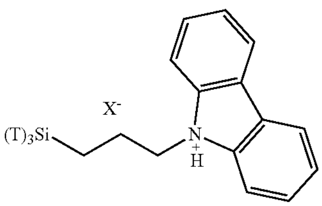
Formula (1-219-2)
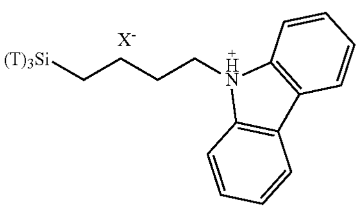
Formula (1-220-2)
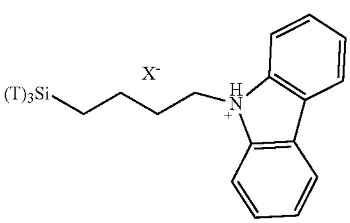
Formula (1-221-2)
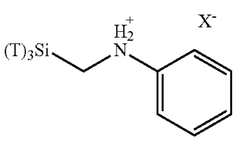
Formula (1-222-2)
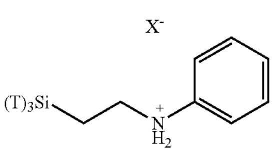
-continued
Formula (1-223-2)
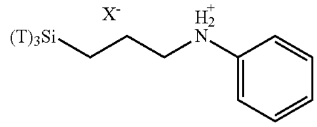
Formula (1-224-2)
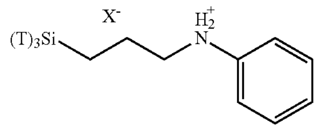
Formula (1-225-2)
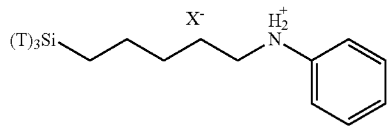
Formula (1-226-2)
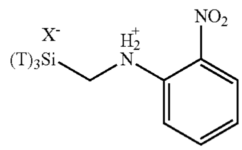
Formula (1-227-2)
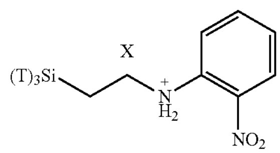
Formula (1-228-2)
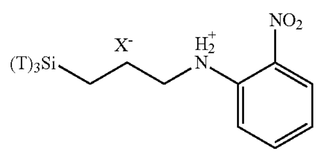
Formula (1-229-2)
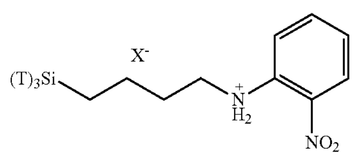
Formula (1-230-2)
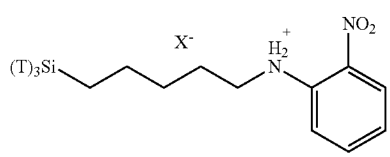
Formula (1-231-2)
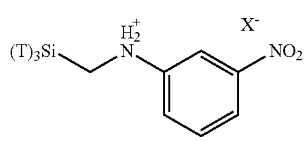
Formula (1-232-2)
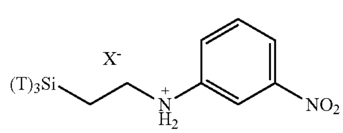

-continued
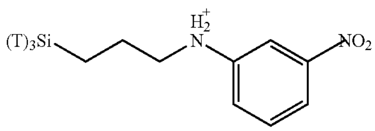
Formula (1-233-2)
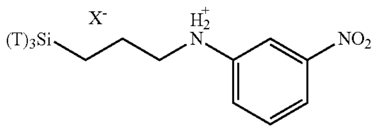
Formula (1-234-2)
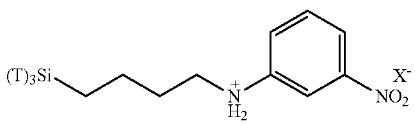
Formula (1-235-2)
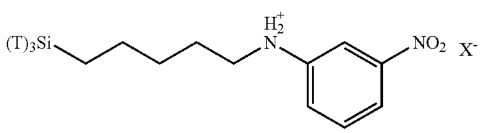
Formula (1-236-2)
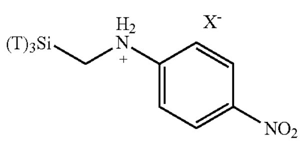
Formula (1-237-2)
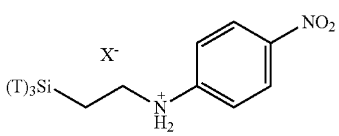
Formula (1-238-2)
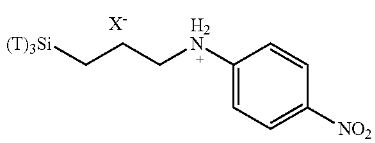
Formula (1-239-2)
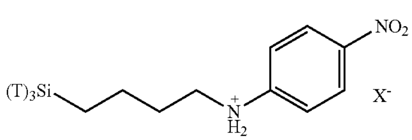
Formula (1-240-2)
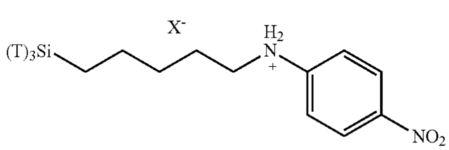
Formula (1-241-2)
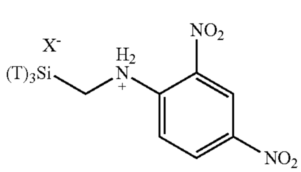
-continued
Formula (1-242-2)
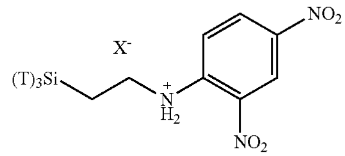
Formula (1-243-2)
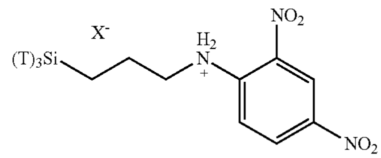
Formula (1-244-2)
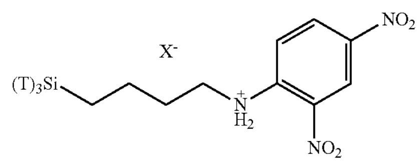
Formula (1-245-2)
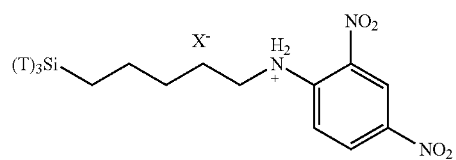
Formula (1-246-2)
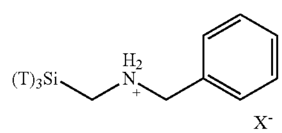
Formula (1-247-2)
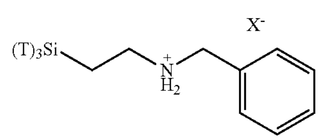
Formula (1-248-2)
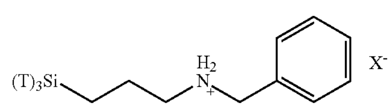
Formula (1-249-2)
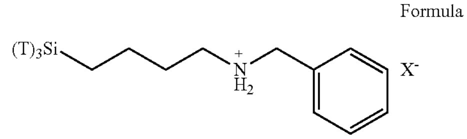
Formula (1-250-2)
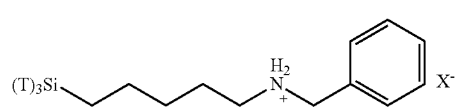
Formula (1-251-2)
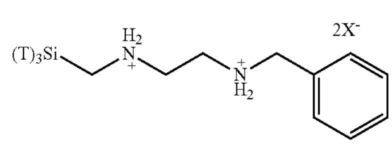

-continued
Formula (1-252-2)
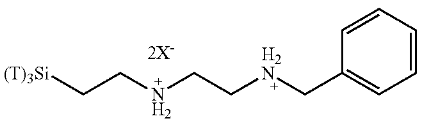
Formula (1-253-2)
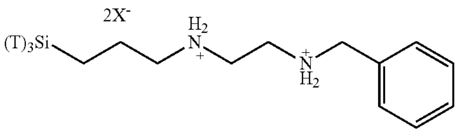
Formula (1-254-2)
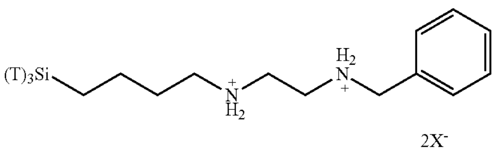
Formula (1-255-2)
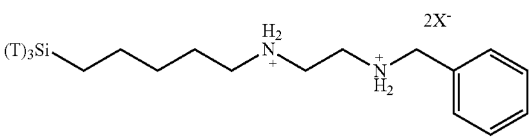
Formula (1-256-2)
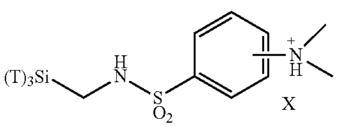
Formula (1-257-2)
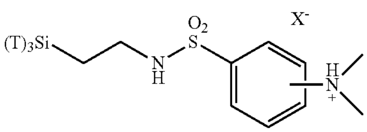
Formula (1-258-2)
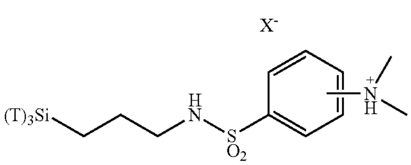
Formula (1-259-2)
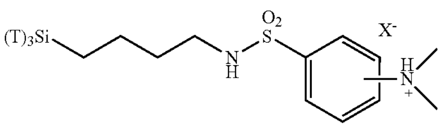
Formula (1-260-2)
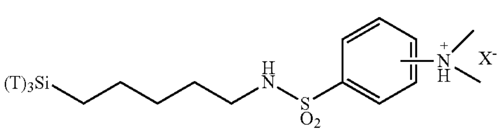
Formula (1-261-2)
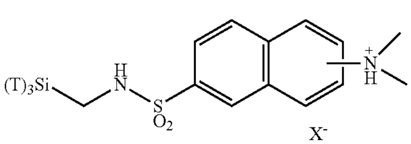
-continued
Formula (1-262-2)
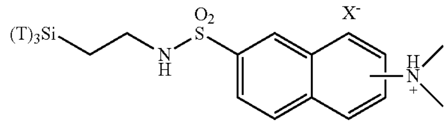
Formula (1-263-2)
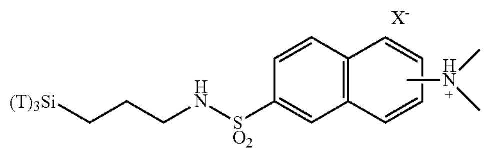
Formula (1-264-2)
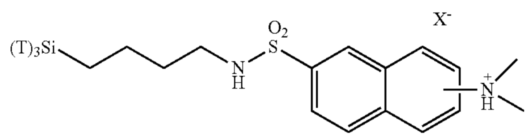
Formula (1-265-2)
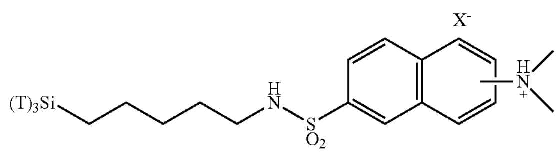
Formula (1-266-2)
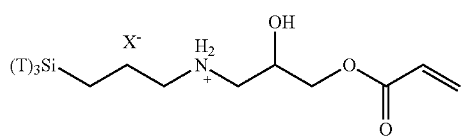
Formula (1-267-2)
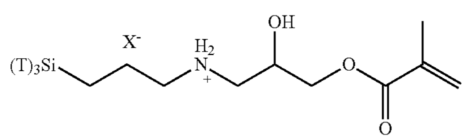
Formula (1-268-2)
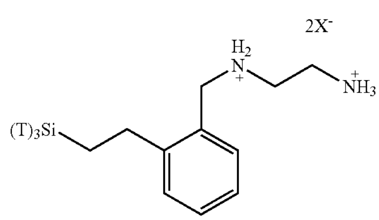
Formula (1-269-2)
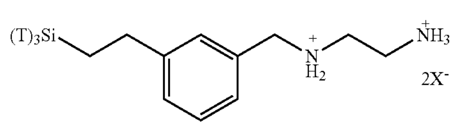
Formula (1-270-2)
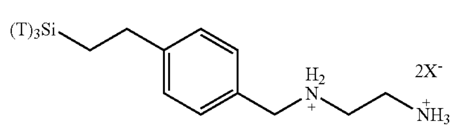

Formula (1-271-2)
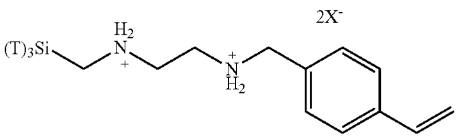
Formula (1-272-2)
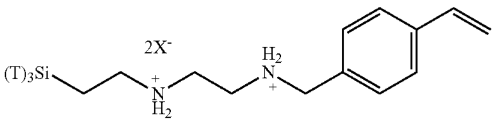
Formula (1-273-2)
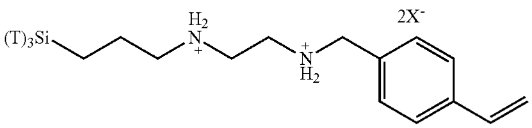
Formula (1-274-2)
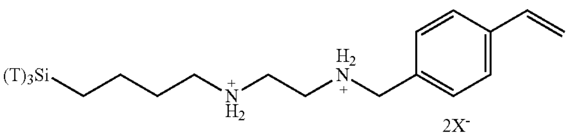
Formula (1-275-2)
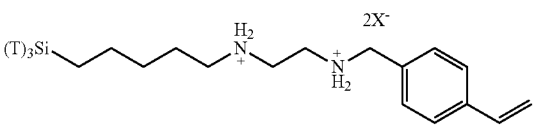
Formula (1-276-2)
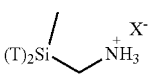
Formula (1-277-2)
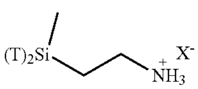
Formula (1-278-2)
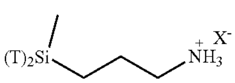
Formula (1-279-2)
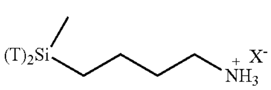
Formula (1-280-2)
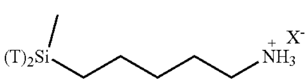
Formula (1-281-2)
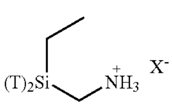
Formula (1-282-2)
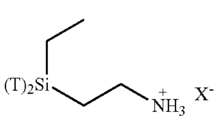
Formula (1-283-2)
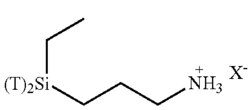
Formula (1-284-2)
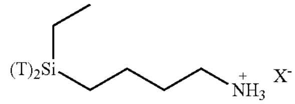
Formula (1-285-2)
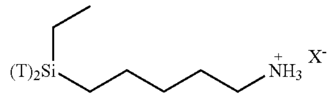
Formula (1-286-2)
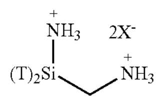
Formula (1-287-2)
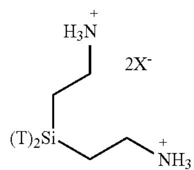
Formula (1-288-2)
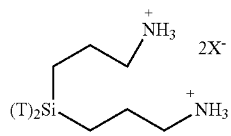
Formula (1-289-2)
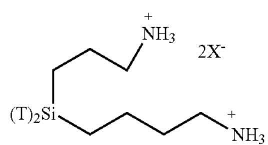
Formula (1-290-2)
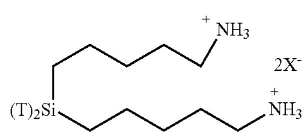
Formula (1-291-2)
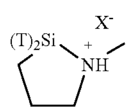
Formula (1-292-2)
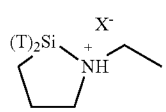
Formula (1-293-2)
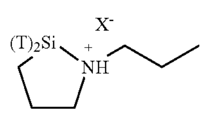
Formula (1-294-2)
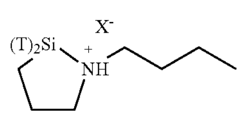

-continued
Formula (1-295-2)
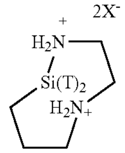
Formula (1-296-2)
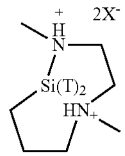
Formula (1-297-2)
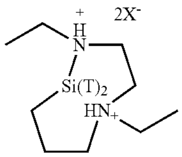
Formula (1-298-2)
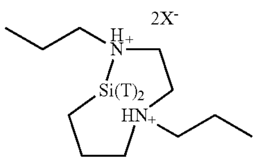
Formula (1-299-2)
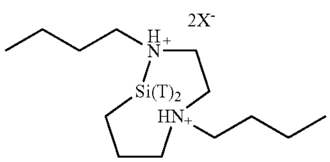
Formula (1-300-2)
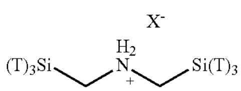
Formula (1-301-2)
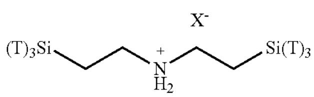
Formula (1-302-2)
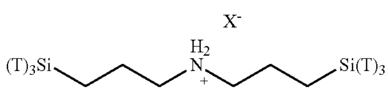
Formula (1-303-2)
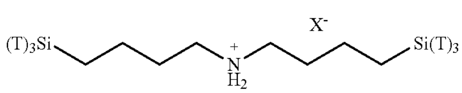
Formula (1-304-2)
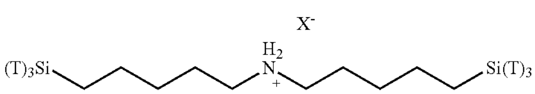
Formula (1-305-2)
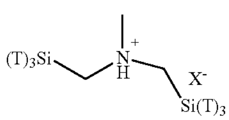
Formula (1-306-2)
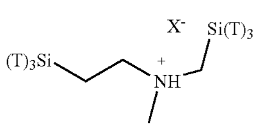
-continued
Formula (1-307-2)
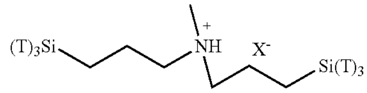
Formula (1-308-2)
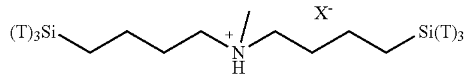
Formula (1-309-2)
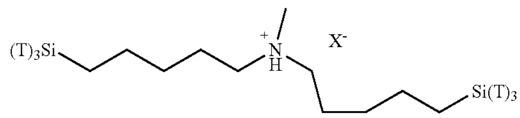
Formula (1-310-2)
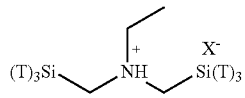
Formula (1-311-2)
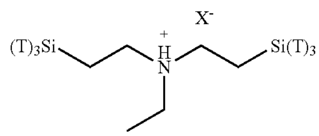
Formula (1-312-2)
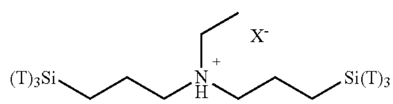
Formula (1-313-2)
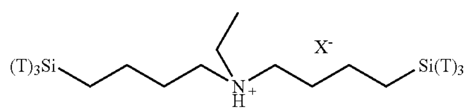
Formula (1-314-2)
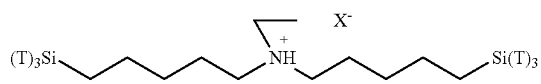
Formula (1-315-2)
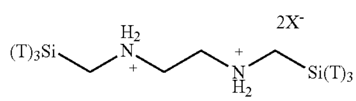
Formula (1-316-2)
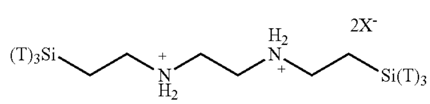
Formula (1-317-2)
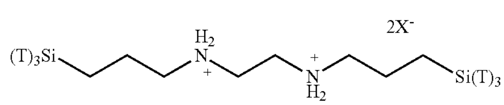
Formula (1-318-2)
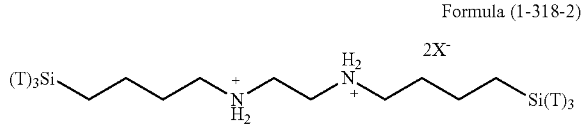
Formula (1-319-2)
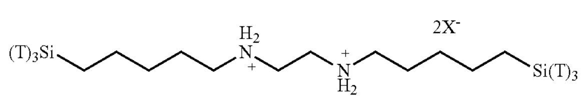

-continued
Formula (1-320-2)
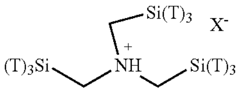
Formula (1-321-2)
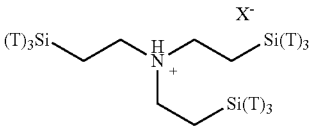
Formula (1-322-2)
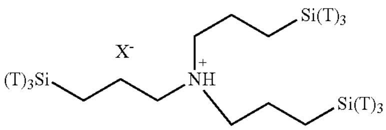
Formula (1-323-2)
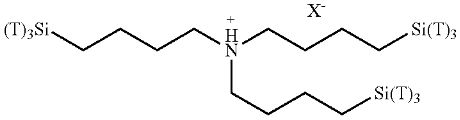
Formula (1-324-2)
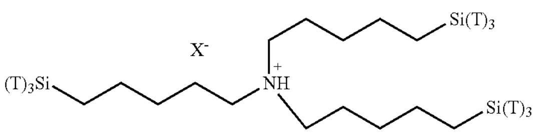
Formula (1-325-2)
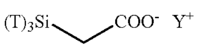
Formula (1-326-2)
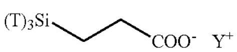
Formula (1-327-2)
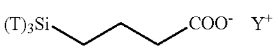
Formula (1-328-2)
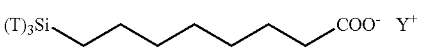
Formula (1-329-2)
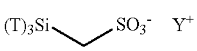
Formula (1-330-2)
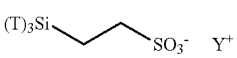
Formula (1-331-2)
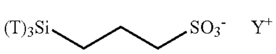
Formula (1-332-2)
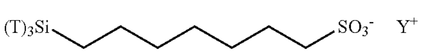
Formula (1-333-2)
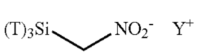
Formula (1-334-2)
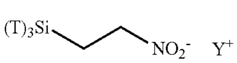
Formula (1-335-2)
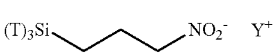
Formula (1-336-2)
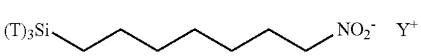
Formula (1-337-2)
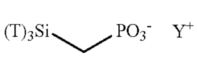
Formula (1-338-2)
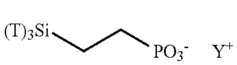
-continued
Formula (1-339-2)
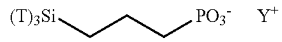
Formula (1-340-2)
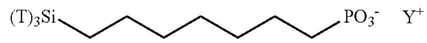
Formula (1-341-2)
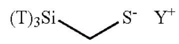
Formula (1-342-2)
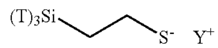
Formula (1-343-2)
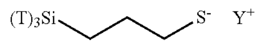
Formula (1-344-2)
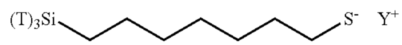
Formula (1-345-2)
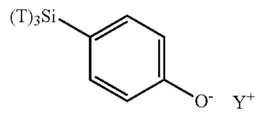
Formula (1-346-2)
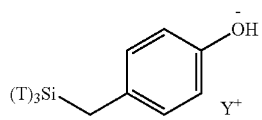
Formula (1-347-2)
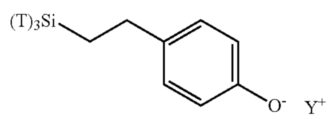
Formula (1-348-2)
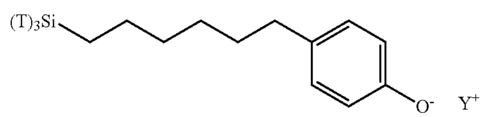
Formula (1-349-2)
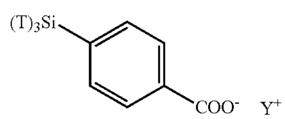
Formula (1-350-2)
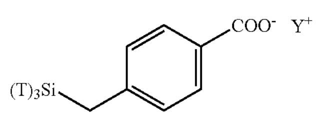
Formula (1-351-2)
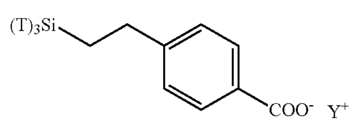
Formula (1-352-2)
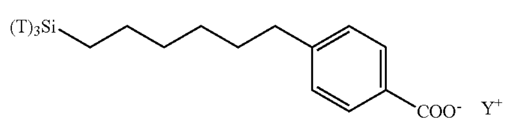
Formula (1-353-2)
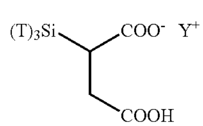

-continued
Formula (1-354-2)
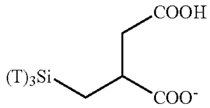
Formula (1-355-2)
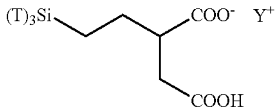
Formula (1-356-2)
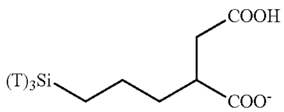
Formula (1-357-2)
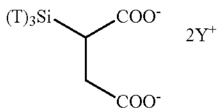
Formula (1-358-2)
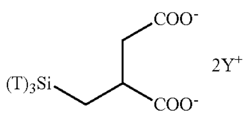
Formula (1-359-2)
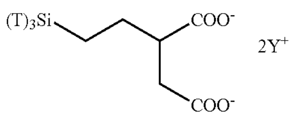
Formula (1-360-2)
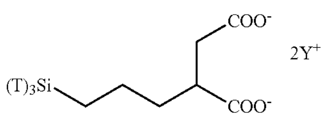
Formula (1-361-2)
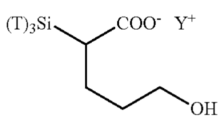
Formula (1-362-2)
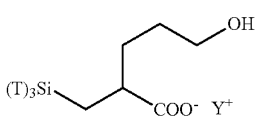
Formula (1-363-2)
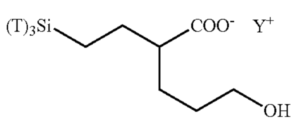
Formula (1-364-2)
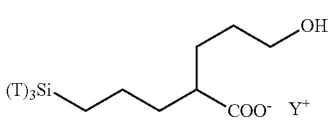
Formula (1-365-2)
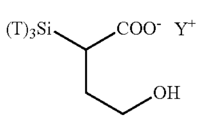
Formula (1-366-2)
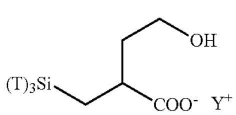
-continued
Formula (1-367-2)
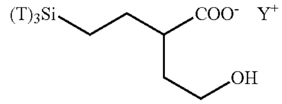
Formula (1-368-2)
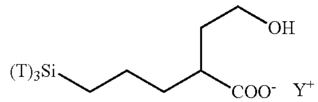
Formula (1-369-2)
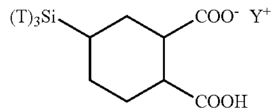
Formula (1-370-2)
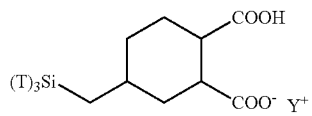
Formula (1-371-2)
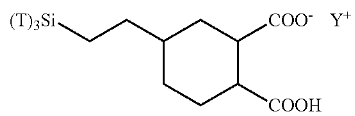
Formula (1-372-2)
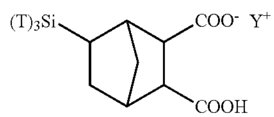
Formula (1-373-2)
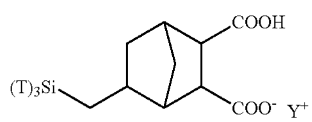
Formula (1-374-2)
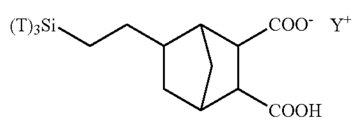
Formula (1-375-2)
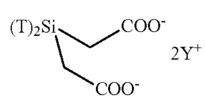
Formula (1-376-2)
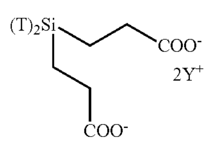
Formula (1-377-2)
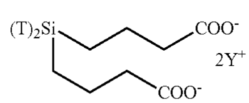
Formula (1-378-2)
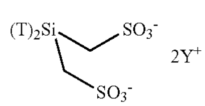

-continued
Formula (1-379-2)
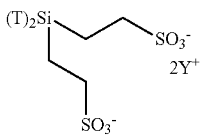
Formula (1-380-2)
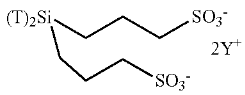
Formula (1-381-2)
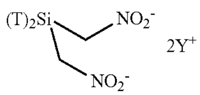
Formula (1-382-2)
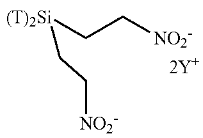
Formula (1-383-2)
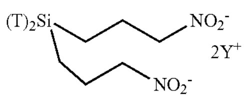
Formula (1-384-2)
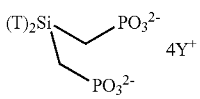
Formula (1-385-2)
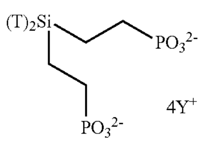
Formula (1-386-2)
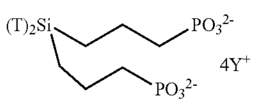
Formula (1-387-2)
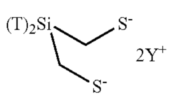
Formula (1-388-2)
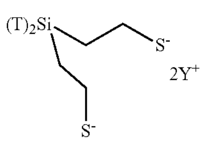
Formula (1-389-2)
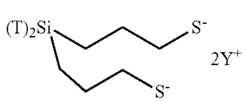
Formula (1-390-2)
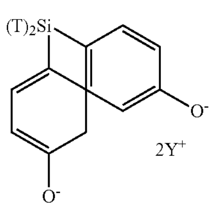
-continued
Formula (1-391-2)
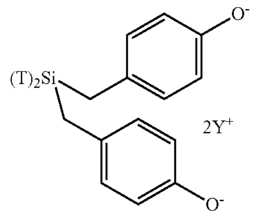
Formula (1-392-2)
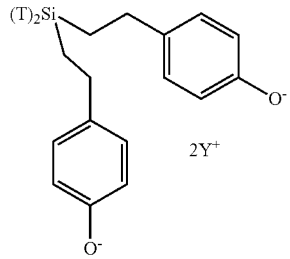
Formula (1-393-2)
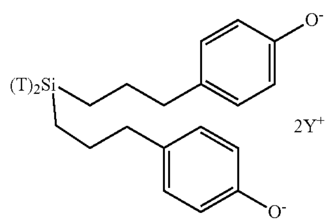
Formula (1-394-2)
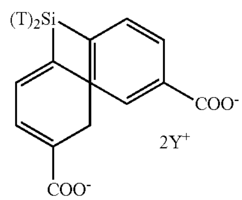
Formula (1-395-2)
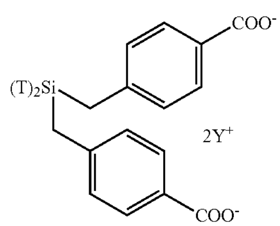
Formula (1-396-2)
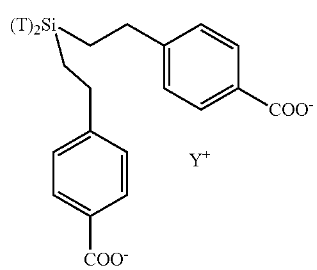
Formula (1-397-2)
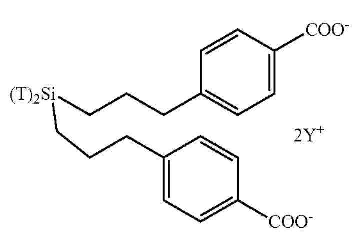

-continued
Formula (1-398-2)
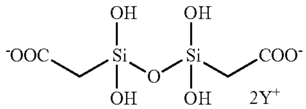
Formula (1-399-2)
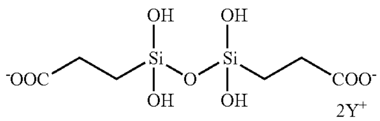
Formula (1-400-2)
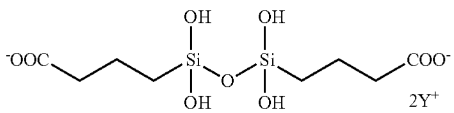
Formula (1-401-2)
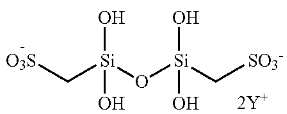
Formula (1-402-2)
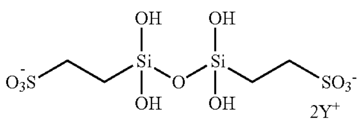
Formula (1-403-2)
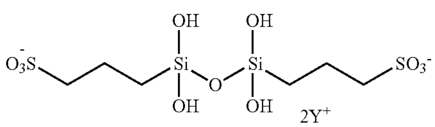
Formula (1-404-2)
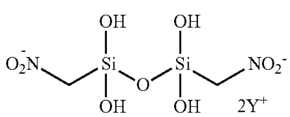
Formula (1-405-2)
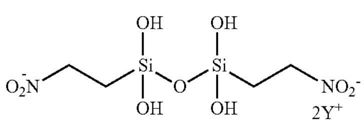
Formula (1-406-2)
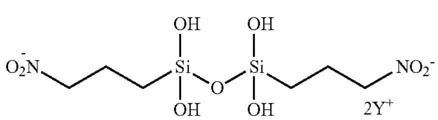
Formula (1-407-2)
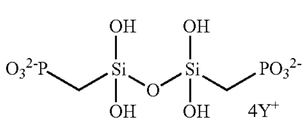
Formula (1-408-2)
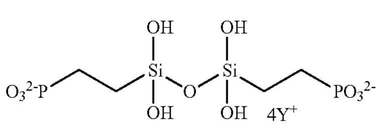
-continued
Formula (1-409-2)
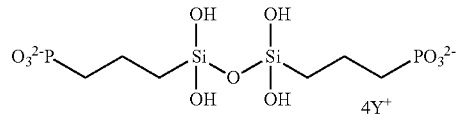
Formula (1-410-2)
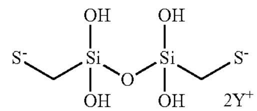
Formula (1-411-2)
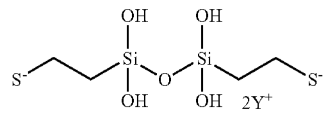
Formula (1-412-2)
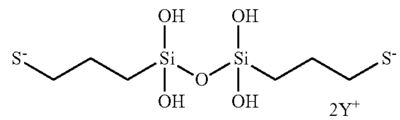
Formula (1-413-2)
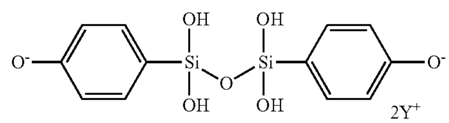
Formula (1-414-2)
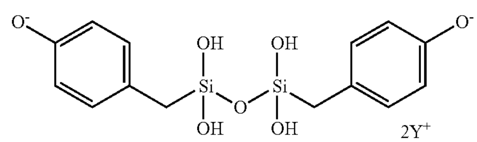
Formula (1-415-2)
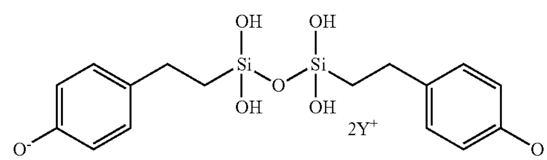
Formula (1-416-2)
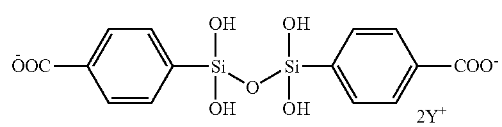
Formula (1-417-2)
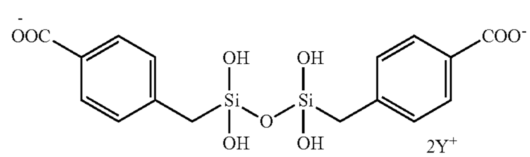
Formula (1-418-2)
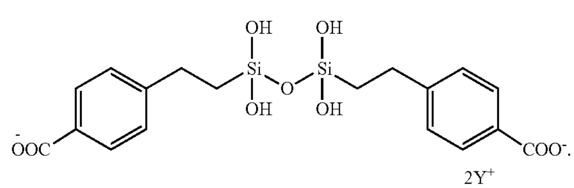

The hydrolyzable silane compound (a2) in the composition of the present invention can be used in combination with another hydrolyzable silane compound (b) together with at least one selected from the group consisting of the hydrolyzable silane of Formula (1) and the hydrolyzable silane of Formula (1-1).

Preferable specific examples of the hydrolyzable silane compound (b) used in the present invention include at least one selected from the group consisting of the hydrolyzable silane of the following Formula (2) and the hydrolyzable silane of the following Formula (3).

$$R^4{}_aSi(R^5)_{4-a} \quad \text{Formula (2)}$$

In Formula (2), $R^4$ is an organic group having an alkyl group, an aryl group, a halogenated alkyl group, a halogenated aryl group, an alkenyl group, an acryloyl group, a methacryloyl group, a mercapto group, or a cyano group, and is a group that is bonded to a silicon atom by an Si—C bond.

$R^5$ is an alkoxy group, an acyloxy group, or a halogen group.

a is an integer of 0 to 3.

$$[R^6{}_cSi(R^7)_{3-c}]_2Z_b \quad \text{Formula (3)}$$

In Formula (3), $R^6$ is an alkyl group.

$R^7$ is an alkoxy group, an acyloxy group, or a halogen group.

Z is an alkylene group or an arylene group.

b is an integer of 0 or 1, and c is an integer of 0 or 1.

Specific examples of organic groups having an alkyl group, an aryl group, a halogenated alkyl group, a halogenated aryl group, an alkenyl group, an acryloyl group, a methacryloyl group, a mercapto group, or a cyano group in $R^4$ in Formula (2) and an alkyl group in $R^6$ include the same ones as described above for $R^1$.

Specific examples of alkoxy groups, acyloxy groups and halogen groups in $R^5$ in Formula (2) and $R^7$ in Formula (3) include the same ones described above for $R^2$.

In addition, examples of alkylene groups or arylene groups in Z include divalent organic groups derived from the alkyl groups or aryl groups described above.

Specific examples of alkylene groups include a methylene group, an ethylene group, and a triethylene group, but the present invention is not limited thereto.

Specific examples of arylene groups include a paraphenylene group, a metaphenylene group, an orthophenylene group, and a biphenyl-4,4'-diyl group, but the present invention is not limited thereto.

As the hydrolyzable silane compound (b), it is preferable to use the hydrolyzable silane of Formula (2).

As the hydrolyzable silane compound (a2), a hydrolyzable silane containing, by molar ratio, the hydrolyzable silanes of Formula (1) and Formula (1-1) and the hydrolyzable silane (b) (at least one selected from the group consisting of hydrolyzable silanes of Formula (2) and Formula (3)) at a ratio of the hydrolyzable silanes of Formula (1) and Formula (1-1): hydrolyzable silane (b)=3:97 to 100:1, or 30:70 to 100:0, or 50:50 to 100:0, or 70:30 to 100:0, or 97:3 to 100:0 can be used.

Specific examples of the hydrolyzable silane of Formula (2) include, for example, tetramethoxysilane, tetrachlorosilane, tetraacetoxysilane, tetraethoxysilane, tetra n-propoxysilane, tetraisopropoxysilane, tetra n-butoxysilane, tetraacetoxysilane, methyltrimethoxysilane, methyltriethoxysilane, methyltrichlorosilane, methyltriacetoxysilane, methyltripropoxysilane, methyltriacetoxysilane, methyltributoxysilane, methyltripropoxysilane, methyltriamyloxysilane, methyltriphenoxysilane, methyltribenzyloxysilane, methyltriphenethyloxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, phenyltrimethoxysilane, phenyltrichlorosilane, phenyltriacetoxysilane, phenyltriethoxysilane, phenyltriacetoxysilane, γ-methacryloxypropyltrimethoxysilane, γ-mercaptopropyltrimethoxysilane, γ-mercaptopropyltriethoxysilane, β-cyanoethyltriethoxysilane, dimethyldimethoxysilane, phenylmethyldimethoxysilane, dimethyldiethoxysilane, phenylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, and methylvinyldiethoxysilane.

Specific examples of the hydrolyzable silane of Formula (3) include, for example, methylene bistrimethoxysilane, methylene bistrichlorosilane, methylene bistriacetoxysilane, ethylene bistriethoxysilane, ethylene bistrichlorosilane, ethylene bistriacetoxysilane, propylene bistriethoxysilane, butylene bistrimethoxysilane, phenylene bistrimethoxysilane, phenylene bistriethoxysilane, phenylene bismethyldiethoxysilane, phenylene bismethyldimethoxysilane, naphthylene bistrimethoxysilane, bistrimethoxydisilane, bistriethoxydisilane, bisethyldiethoxydisilane, and bismethyldimethoxydisilane.

In addition to the above examples, as long as the effects of the present invention are not impaired, the hydrolyzable silane compound (a2) may contain hydrolyzable silanes other than the above examples.

In a preferable aspect of the present invention, the composition contains at least the hydrolysis condensate (a4) of the hydrolyzable silane compound (a2). In this case, the composition may contain an uncondensed (partial) hydrolysate or an unreacted silane compound together with the above hydrolysis condensate (a4), which is a polysiloxane.

In a preferable aspect of the present invention, the hydrolysis condensate (a4) includes a hydrolysis condensate obtained using at least one selected from the group consisting of the hydrolyzable silane of Formula (1) and the hydrolyzable silane of Formula (1-1), at least one selected from the group consisting of the hydrolyzable silane of Formula (2) and the hydrolyzable silane of Formula (3), and if desired, at least other hydrolyzable silanes.

The hydrolysis condensate (also referred to as a polysiloxane) (a4) of the hydrolyzable silane compound (a2) has a weight average molecular weight that may be, for example, 500 to 1,000,000. From the viewpoint of suppressing the precipitation of the hydrolysis condensate in the composition, the weight average molecular weight is preferably 500,000 or less, more preferably 250,000 or less, and still more preferably 100,000 or less, and from the viewpoint of achieving both the storage stability and coating properties, the weight average molecular weight is preferably 700 or more, and more preferably 1,000 or more.

Here, these weight average molecular weights are molecular weights obtained by GPC analysis in terms of polystyrene and molecular weights obtained by GFC (aqueous GPC) analysis in terms of PEG/PEO.

GPC analysis can be performed using, for example, a GPC device (product name HLC-8220GPC, commercially available from Tosoh Corporation), GPC columns (product name Shodex KF803L, KF802, and KF801, commercially available from Showa Denko K.K.), at a column temperature of 40° C., and using tetrahydrofuran as an eluent (eluting solvent), at a flow rate (flow velocity) of 1.0 ml/min, and using polystyrene (commercially available from Showa Denko K.K.) as standard samples.

In addition, GFC analysis can be performed using, for example, a GFC device (product name RID-10A, commercially available from Shimadzu Corporation), GFC columns (product name Shodex SB-803HQ, commercially available from Showa Denko K.K.), at a column temperature of 40° C., and using water and a 0.5 M acetic acid/0.5 M sodium nitrate aqueous solution as an eluent (eluting solvent), at a flow rate (flow velocity) of 1.0 ml/min, and using pullulan and PEG/PEO (commercially available from Showa Denko K.K.) as standard samples.

Hydrolysis condensates suitably used in the present invention are exemplified below, but the present invention is not limited thereto.

Formula (2-1-1)

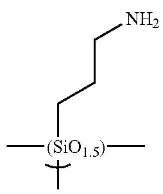

Formula (2-2-1)

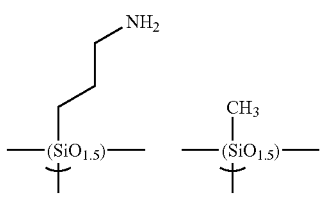

Formula (2-3-1)

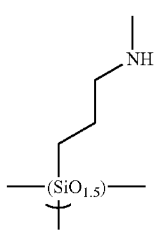

Formula (2-4-1)

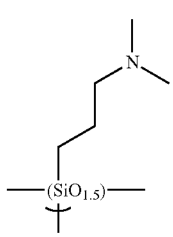

Formula (2-5-1)

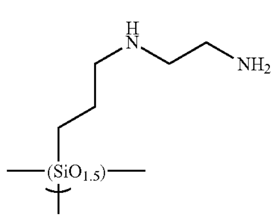

-continued

Formula (2-6-1)

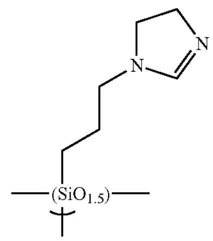

Formula (2-7-1)

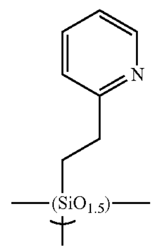

Formula (2-1-2)

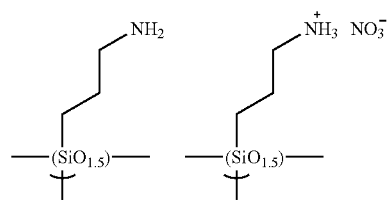

Formula (2-2-2)

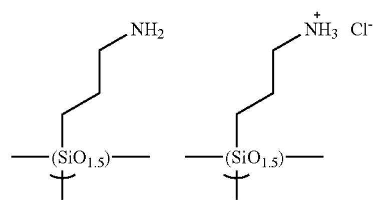

Formula (2-3-2)

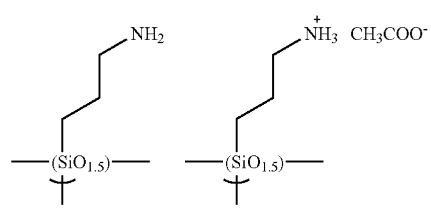

Formula (2-4-2)

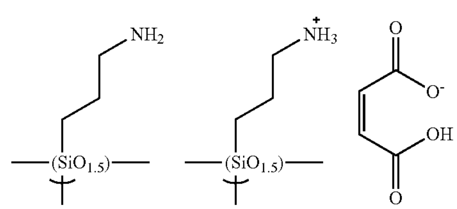

Formula (2-5-2)

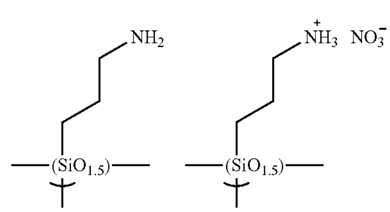

-continued
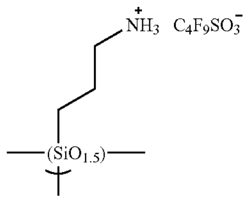
Formula (2-6-2)
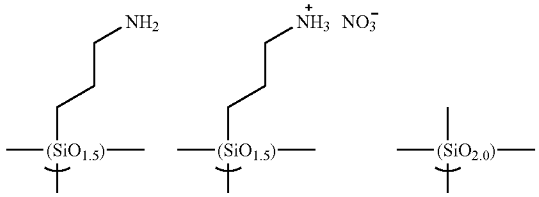
Formula (2-7-2)
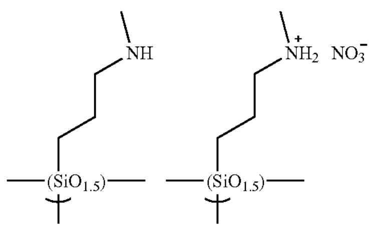
Formula (2-8-2)
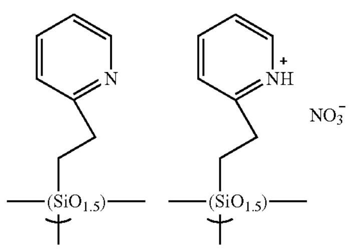
Formula (2-9-2)
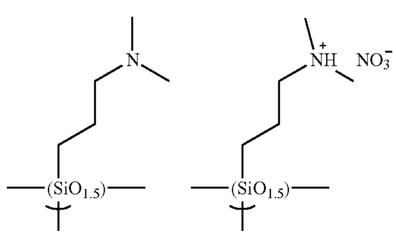
Formula (2-10-2)
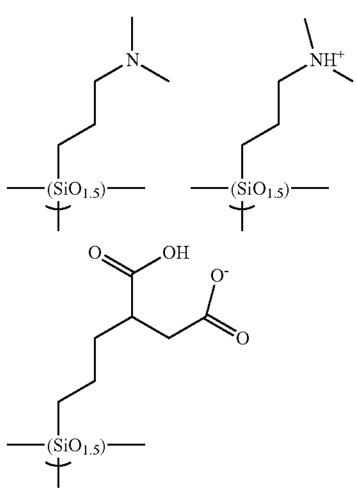
-continued
Formula (2-11-2)
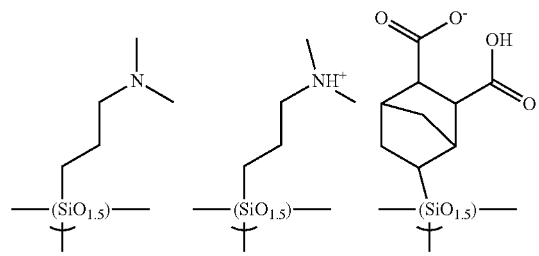
Formula (2-12-2)
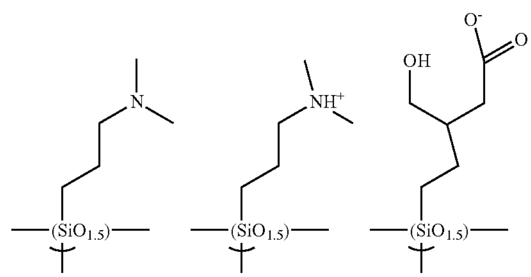
Formula (2-13-2)
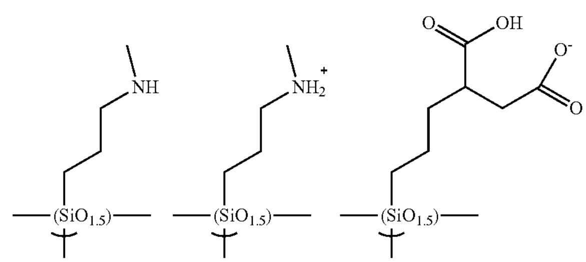
Formula (2-14-2)
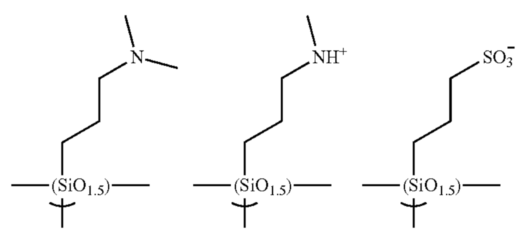
Formula (2-15-2)
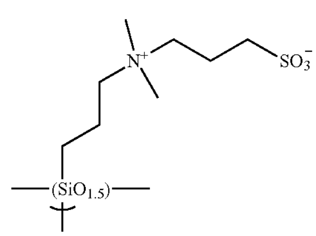
Formula (2-1-4)
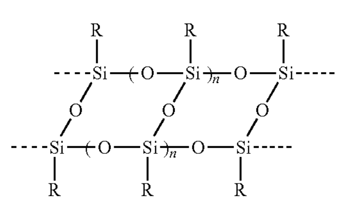

-continued

Formula (2-2-4)

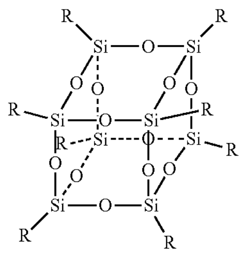

Formula (2-3-4)

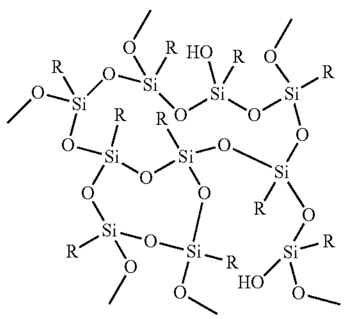

Formula (2-1-5)

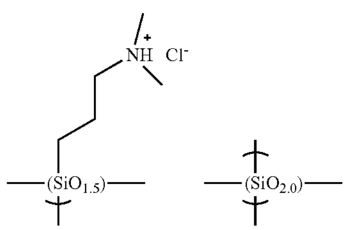

Formula (2-2-5)

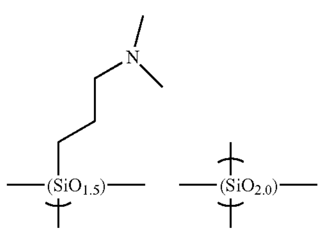

Formula (2-3-5)

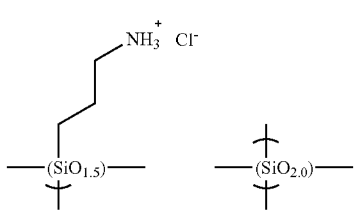

Formula (2-4-5)

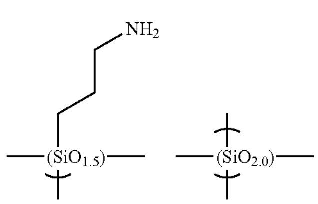

-continued

Formula (2-5-5)

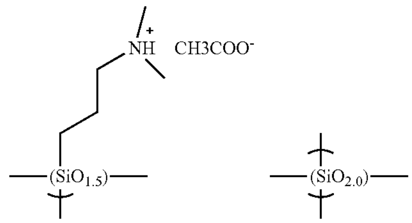

Formula (2-6-5)

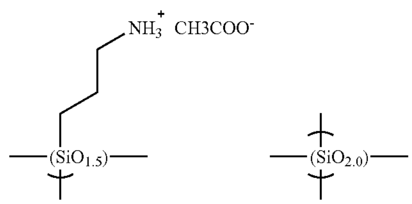

Examples of silsesquioxane (also called a polysilsesquioxane) type polysiloxanes include Formula (2-1-4), Formula (2-2-4), and Formula (2-3-4).

Formula (2-1-4) shows a ladder type silsesquioxane, and n is 1 to 1000, or 1 to 200. Formula (2-2-4) shows a cage type silsesquioxane. Formula (2-3-4) shows a random type silsesquioxane. In Formula (2-1-4), Formula (2-2-4), and Formula (2-3-4), R is an organic group having an amino group or an organic group having an ionic functional group, and is a group that is bonded to a silicon atom by an Si—C bond or Si—N bond, and examples of these groups include those exemplified above.

The hydrolysate (a3) and the hydrolysis condensate (a4) of the hydrolyzable silane compound (a2) can be obtained by hydrolysis and condensation of the hydrolyzable silane compound (a2).

The hydrolyzable silane compound (a2) used in the present invention has an alkoxy group, an acyloxy group, and a halogen group, which are directly bonded to a silicon atom, that is, it contains an alkoxysilyl group, an acyloxysilyl group, and a halogenated silyl group, which are hydrolyzable groups.

For hydrolysis and condensation of these hydrolyzable groups, generally 0.5 to 100 mol, and preferably 1 to 10 mol of water is used per mol of the hydrolyzable group.

In addition, during hydrolysis and condensation, a hydrolysis catalyst may be used for promoting hydrolysis and condensation, or hydrolysis may be performed without using a hydrolysis catalyst. When a hydrolysis catalyst is used, generally 0.0001 to 10 mol and preferably 0.001 to 1 mol of the hydrolysis catalyst can be used per mol of the hydrolyzable group.

The reaction temperature when hydrolysis and condensation are performed is generally in a range between room temperature or higher and a reflux temperature of an organic solvent or lower that can be used for hydrolysis at atmospheric pressure, and may be, for example, 20 to 110° C., or for example, 20 to 80° C.

The hydrolysis may be complete hydrolysis, that is, all hydrolyzable groups may be converted into silanol groups, or partial hydrolysis, that is, unreacted hydrolyzable groups may remain. That is, after the hydrolysis and condensation reaction, uncondensed hydrolysates (complete hydrolysate, partial hydrolysate) or monomers (hydrolyzable silane compound) may remain in the hydrolysis condensate. Here, in the present invention, as described above, the hydrolysis condensate is a polymer obtained by hydrolysis and condensation of a silane compound, and the concept includes those in which condensation is partially not performed and Si—OH groups remain.

Examples of a hydrolysis catalyst that can be used for hydrolysis and condensation include a metal chelate compound, an organic acid, an inorganic acid, an organic base, and an inorganic base. Although examples are shown below, these may be used alone or two or more thereof may be used in combination.

Examples of metal chelate compounds as a hydrolysis catalyst include titanium chelate compounds such as triethoxy mono(acetylacetonato)titanium, tri-n-propoxy mono (acetylacetonato)titanium, tri-i-propoxy mono(acetylacetonato)titanium, tri-n-butoxy mono(acetylacetonato)titanium, tri-sec-butoxy mono(acetylacetonato)titanium, tri-t-butoxy mono(acetylacetonato)titanium, diethoxy-bis(acetylacetonato)titanium, di-n-propoxy-bis(acetylacetonato)titanium, di-i-propoxy-bis(acetylacetonato)titanium, di-n-butoxy bis (acetylacetonato)titanium, di-sec-butoxy-bis(acetylacetonato)titanium, di-t-butoxy-bis(acetylacetonato)titanium, monoethoxy-tris(acetylacetonato)titanium, mono-n-propoxy-tris(acetylacetonato)titanium, mono-i-propoxy-tris (acetylacetonato)titanium, mono-n-butoxy-tris(acetylacetonato)titanium, mono-sec-butoxy-tris(acetylacetonato) titanium, mono-t-butoxy-tris(acetylacetonato)titanium, tetrakis(acetylacetonato)titanium, triethoxy mono(ethylacetoacetate)titanium, tri-n-propoxy mono(ethylacetoacetate) titanium, tri-i-propoxy mono(ethylacetoacetate)titanium, tri-n-butoxy mono(ethylacetoacetate)titanium, tri-sec-butoxy mono(ethylacetoacetate)titanium, tri-t-butoxy mono(ethylacetoacetate)titanium, diethoxy-bis(ethylacetoacetate)titanium, di-n-propoxy bis(ethylacetoacetate)titanium, di-i-propoxy bis(ethylacetoacetate)titanium, di-n-butoxy bis (ethylacetoacetate)titanium, di-sec-butoxy bis (ethylacetoacetate)titanium, di-t-butoxy-bis(ethylacetoacetate)titanium, monoethoxy-tris(ethylacetoacetate) titanium, mono-n-propoxy tris(ethylacetoacetate)titanium, mono-i-propoxy-tris(ethylacetoacetate)titanium, mono-n-butoxy-tris(ethylacetoacetate)titanium, mono-sec-butoxy-tris(ethylacetoacetate)titanium, mono-t-butoxy-tris(ethylacetoacetate)titanium, tetrakis(ethylacetoacetate)titanium, mono(acetylacetonato)tris(ethylacetoacetate)titanium, bis (acetylacetonato) bis(ethylacetoacetate)titanium, and tris (acetylacetonato) mono(ethylacetoacetate)titanium; zirconium chelate compounds such as triethoxy mono (acetylacetonato)zirconium, tri-n-propoxy-mono(acetylacetonato)zirconium, tri-i-propoxy-mono(acetylacetonato) zirconium, tri-n-butoxy-mono(acetylacetonato)zirconium, tri-sec-butoxy-mono(acetylacetonato)zirconium, tri-t-butoxy-mono(acetylacetonato)zirconium, diethoxy-bis(acetylacetonato)zirconium, di-n-propoxy-bis(acetylacetonato)zirconium, di-i-propoxy-bis(acetylacetonato)zirconium, di-n-butoxy-bis(acetylacetonato)zirconium, di-sec-butoxy-bis (acetylacetonato)zirconium, di-t-butoxy-bis(acetylacetonato)zirconium, monoethoxy-tris(acetylacetonato)zirconium, mono-n-propoxy-tris(acetylacetonato)zirconium, mono-i-propoxy-tris(acetylacetonato)zirconium, mono-n-butoxy-tris(acetylacetonato)zirconium, mono-sec-butoxy-tris(acetylacetonato)zirconium, mono-t-butoxy-tris(acetylacetonato)zirconium, tetrakis(acetylacetonato)zirconium, triethoxy-mono(ethylacetoacetate)zirconium, tri-n-propoxy-mono(ethylacetoacetate)zirconium, tri-i-propoxy-mono (ethylacetoacetate)zirconium, tri-n-butoxy-mono(ethylacetoacetate)zirconium, tri-sec-butoxy-mono(ethylacetoacetate)zirconium, tri-t-butoxy-mono(ethylacetoacetate) zirconium, diethoxy-bis(ethylacetoacetate)zirconium, di-n-propoxy-bis(ethylacetoacetate)zirconium, di-i-propoxy-bis (ethylacetoacetate)zirconium, di-n-butoxy-bis(ethylacetoacetate)zirconium, di-sec-butoxy-bis(ethylacetoacetate)zirconium, di-t-butoxy-bis(ethylacetoacetate)zirconium, monoethoxy-tris(ethylacetoacetate)zirconium, mono-n-propoxy-tris(ethylacetoacetate)zirconium, mono-i-propoxy-tris(ethylacetoacetate)zirconium, mono-n-butoxy-tris(ethylacetoacetate)zirconium, mono-sec-butoxy-tris (ethylacetoacetate)zirconium, mono-t-butoxy-tris (ethylacetoacetate)zirconium, tetrakis(ethylacetoacetate) zirconium, mono(acetylacetonato)tris(ethylacetoacetate) zirconium, bis(acetylacetonato)bis(ethylacetoacetate) zirconium, and tris(acetylacetonato)mono (ethylacetoacetate)zirconium; and aluminum chelate compounds such as tris(acetylacetonato)aluminum, and tris (ethylacetoacetate)aluminum, but the present invention is not limited thereto.

Examples of organic acids as a hydrolysis catalyst include acetic acid, propionic acid, butyric acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, and trifluoromethanesulfonic acid, but the present invention is not limited thereto.

Examples of inorganic acids as a hydrolysis catalyst include hydrochloric acid, nitric acid, sulfuric acid, hydrofluoric acid, and phosphoric acid, but the present invention is not limited thereto.

Examples of organic bases as a hydrolysis catalyst include pyridine, pyrrole, piperazine, pyrrolidine, piperidine, picoline, trimethylamine, triethylamine, monoethanolamine, diethanol amine, dimethylmonoethanol amine, monomethyldiethanol amine, triethanol amine, diazabicyclooctane, diazabicyclononane, diazabicycloundecene, tetramethylammonium hydroxide, tetraethylammonium hydroxide, tetrapropylammonium hydroxide, tetrabutylammonium hydroxide, trimethylphenylammonium hydroxide, benzyltrimethylammonium hydroxide, and benzyltriethylammonium hydroxide, but the present invention is not limited thereto.

Examples of inorganic bases as a hydrolysis catalyst include ammonia, sodium hydroxide, potassium hydroxide, barium hydroxide, and calcium hydroxide, but the present invention is not limited thereto.

Among these catalysts, a metal chelate compound, an organic acid, and an inorganic acid are preferable, and these may be used alone or two or more thereof may be used in combination.

As an example, in the present invention, the hydrolysate (a3) of the hydrolyzable silane compound (a2) (a hydrolyzable silane selected from the group consisting of the hydrolyzable silane of Formula (1) and the hydrolyzable silane of Formula (1-1), further, a hydrolyzable silane selected from the group consisting of the hydrolyzable silane of Formula (2) and the hydrolyzable silane of Formula (3), and further, if desired, other hydrolyzable silanes) is obtained by hydrolyzing the hydrolyzable silane compound (a2) in the presence of an alkaline substance, and particularly in the presence of an organic base, and these hydrolysates are preferably additionally condensed to form a hydrolysis condensate (a4) (polysiloxane).

Here, the alkaline substance is an alkaline catalyst that is added during hydrolysis of the hydrolyzable silane or is an amino group present in the molecule of the hydrolyzable silane itself.

When the alkaline substance is an amino group present in the hydrolyzable silane molecule, among the above examples of the hydrolyzable silane compound (a4) of Formula (1) or Formula (1-1), a silane containing an amino group in the side chain is exemplified.

In addition, when an alkaline catalyst is added, the above inorganic bases and organic bases described as the hydrolysis catalyst may be exemplified. Particularly, an organic base is preferable.

The hydrolysate of the hydrolyzable silane is preferably hydrolyzed in the presence of an alkaline substance.

The composition may further contain a hydrolyzable silane, a hydrolysate obtained by hydrolyzing the hydrolyzable silane in the presence of an alkaline substance, or a mixture thereof.

In addition, in the present invention, a silsesquioxane obtained by hydrolyzing a silane having three hydrolyzable groups can be used. This silsesquioxane is a hydrolysis condensate (a4) obtained by hydrolyzing and condensing a silane having three hydrolyzable groups in the presence of an acidic substance. As the acidic substance used here, an acidic catalyst among the above hydrolysis catalysts can be used.

As the hydrolysis condensate (a4), a random type, ladder type, or cage type silsesquioxane can be used.

In addition, when hydrolyzing and condensing are performed, an organic solvent may be used as a solvent, and specific examples thereof include, for example, aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amyl naphthalene, and trimethylbenzene; monoalcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethyl butanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenyl methyl carbinol, diacetone alcohol, and cresol; multivalent alcohol solvents such as ethylene glycol, propylene glycol, 1,3-butylene glycol, pentandiol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerin; ketone solvents such as acetone, methyl ethyl ketone, methyl-n-propyl ketone, methyl-n-butyl ketone, diethyl ketone, methyl-1-butylketone, methyl-n-pentyl ketone, ethyl-n-butyl ketone, methyl-n-hexyl ketone, di-i-butylketone, trimethylnonanone, cyclohexanone, methylcyclohexanone, 2,4-pentanedione, acetonylacetone, diacetone alcohol, acetophenone, and fenchone; ether solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, 7-butyrolactone, 7-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone, but the present invention is not limited thereto. These solvents may be used alone or two or more thereof may be used in combination.

After the hydrolysis reaction is completed, when the reaction solution is directly used or diluted or concentrated, or as necessary neutralized, or treated using an ion exchange resin, hydrolysis catalysts such as acids and bases used for hydrolysis and condensation can be removed. In addition, before or after such a treatment, by distillation under a reduced pressure or the like, by-product alcohols, water, the hydrolysis catalyst used and the like can be removed from the reaction solution.

Here, the hydrolysis condensate (a4) (polysiloxane) obtained in this manner is obtained in the form of a polysiloxane varnish dissolved in an organic solvent, which can be directly used as a composition for a resist pattern metallization process to be described below.

[(B): Acid Compound Containing No Carboxylic Acid Group (—COOH)]

The composition of the present invention contains an acid compound containing no carboxylic acid group as a component (B).

The acid compound is preferably an acid compound containing a sulfonate group (—$SO_3H$). Examples thereof include methane sulfonic acid, octane sulfonic acid, decane sulfonic acid, dodecylbenzene sulfonic acid, phenol sulfonic acid, sulfosalicylic acid, camphor sulfonic acid, nonafluorobutane sulfonic acid, toluene sulfonic acid, cumene sulfonic acid, p-octylbenzenesulfonic acid, p-decylbenzenesulfonic acid, 4-octyl 2-phenoxybenzenesulfonic acid, and 4-carboxybenzenesulfonic acid.

The proportion of the component (B) is preferably 0.5 to 15 parts by mass with respect to 100 parts by mass of the component (A).

[Component (C): Aqueous Solvent]

The composition of the present invention contains an aqueous solvent as a component (C). The aqueous solvent preferably contains water, and more preferably, the aqueous solvent is composed of 100% water, that is, a solvent composed of only water. In this case, the presence of an organic solvent or the like contained in a small amount in water as impurities when water is intentionally used as a water-soluble solvent is not denied.

Here, since the composition of the present invention is applied to a resist pattern, a solvent that may dissolve the resist pattern cannot be used. However, the composition of the present invention may contain a water-soluble organic solvent that can be mixed with an aqueous solvent, which is a solvent that does not dissolve the resist pattern, for example, an alcohol solvent or an ether solvent.

Examples of such a solvent that does not dissolve a resist pattern include alcohols such as methanol, ethanol, n-propanol, isopropyl alcohol, n-butanol, and isobutyl alcohol; glycols such as ethyl cellosolve, butyl cellosolve, ethylene glycol, and diethylene glycol; glycol ethers such as propylene glycol monomethyl ether; and ethers such as tetrahydrofuran (THF), but the present invention is not limited thereto. These water-soluble organic solvents may be used alone or two or more thereof may be used in combination.

In addition, the water-soluble organic solvent can also be used as a mixed solvent with water. In this case, the mixing ratio between water and the water-soluble organic solvent is not particularly limited, and for example, in terms of mass ratio, water:water-soluble organic solvent=0.1:99.9 to 99.9:0.1.

In addition to the water-soluble organic solvent, as long as the effects of the present invention are not impaired, an organic solvent that is poorly soluble in water or a hydrophobic organic solvent may be used in combination.

[Preparation of Composition]

The composition for a resist pattern metallization process of the present invention contains the component (A), the component (B) and the component (C).

If the components (A) to (C) and if desired, other components are contained, the composition can be produced by mixing the other components. In this case, a solution containing the component (A) (for example, the hydrolysis condensate (a4), etc.) may be prepared in advance and the solution may be mixed with a solvent or other components.

The mixing order is not particularly limited. For example, the component (B) and the component (C) may be added to a solution containing the component (A) (for example, the hydrolysis condensate (a4), etc.) and mixed, and other components may be added to the mixture, or a solution containing the component (A) (for example, the hydrolysis condensate (a4), etc.) and the like, a solvent, and other components may be mixed at the same time.

In addition, in the middle of producing the composition or after all components are mixed, filtering may be performed using a submicrometer-order filter or the like.

In the composition for a resist pattern metallization process of the present invention, when the hydrolysis condensate (a4) is contained as the component (A), particularly in order to stabilize the hydrolysis condensate contained therein, an inorganic acid, an organic acid, an alcohol, an organic amine, a photoacid generator, a metal oxide, a surfactant, or a combination thereof can be added. Here, even if a component other than (a4) is contained as the component (A), as long as the effects of the present invention are not impaired, the following components may be contained.

Examples of inorganic acids include hydrochloric acid, nitric acid, sulfuric acid, and phosphoric acid.

Examples of organic acids include oxalic acid, malonic acid, methylmalonic acid, succinic acid, maleic acid, malic acid, tartaric acid, phthalic acid, citric acid, glutaric acid, lactic acid, and salicylic acid. Among these, oxalic acid and maleic acid are preferable. When such an acid is added, the amount added may be 0.5 to 15 parts by mass with respect to 100 parts by mass of the component (A).

However, since the addition of an acid containing a carboxylic acid group (—COOH) may cause deterioration of coating properties of the composition of the present invention, it is naturally preferable that an acid not be mixed into the composition of the present invention.

In addition, as the alcohol, an alcohol that is likely to disperse due to heating after application is preferable, and examples thereof include methanol, ethanol, propanol, i-propanol, and butanol. When an alcohol is added, the amount of the alcohol added may be 0.001 parts by mass to 20 parts by mass with respect to 100 parts by mass of the composition of the present invention.

Examples of organic amines include aminoethanol, methylaminoethanol, N,N,N',N'-tetramethylethylenediamine, N,N,N',N'-tetraethylethylenediamine, N,N,N',N'-tetrapropylethylenediamine, N,N,N',N'-tetraisopropylethylenediamine, N,N,N',N'-tetrabutylethylenediamine, N,N,N',N'-tetraisobutylethylenediamine, N,N,N',N'-tetramethyl-1,2-propylenediamine, N,N,N',N'-tetraethyl-1,2-propylenediamine, N,N,N',N'-tetrapropyl-1,2-propylenediamine, N,N,N',N'-tetraisopropyl-1,2-propylenediamine, N,N,N',N'-tetrabutyl-1,2-propylenediamine, N,N,N',N'-tetraisobutyl-1,2-propylenediamine, N,N,N',N'-tetramethyl-1,3-propylenediamine, N,N,N',N'-tetraethyl-1,3-propylenediamine, N,N,N',N'-tetrapropyl-1,3-propylenediamine, N,N,N',N'-tetraisopropyl-1,3-propylenediamine, N,N,N',N'-tetrabutyl-1,3-propylenediamine, N,N,N',N'-tetraisobutyl-1,3-propylenediamine, N,N,N',N'-tetramethyl-1,2-butylenediamine, N,N,N',N'-tetraethyl-1,2-butylenediamine, N,N,N',N'-tetrapropyl-1,2-butylenediamine, N,N,N',N'-tetraisopropyl-1,2-butylenediamine, N,N,N',N'-tetrabutyl-1,2-butylenediamine, N,N,N',N'-tetraisobutyl-1,2-butylenediamine, N,N,N',N'-tetramethyl-1,3-butylenediamine, N,N,N',N'-tetraethyl-1,3-butylenediamine, N,N,N',N'-tetrapropyl-1,3-butylenediamine, N,N,N',N'-tetraisopropyl-1,3-butylenediamine, N,N,N',N'-tetrabutyl-1,3-butylenediamine, N,N,N',N'-tetraisobutyl-1,3-butylenediamine, N,N,N',N'-tetramethyl-1,4-butylenediamine, N,N,N',N'-tetraethyl-1,4-butylenediamine, N,N,N',N'-tetrapropyl-1,4-butylenediamine, N,N,N',N'-tetraisopropyl-1,4-butylenediamine, N,N,N',N'-tetrabutyl-1,4-butylenediamine, N,N,N',N'-tetraisobutyl-1,4-butylenediamine, N,N,N',N'-tetramethyl-1,5-pentylenediamine, and N,N,N',N'-tetraethyl-1, 5-pentylenediamine. The amount of the organic amine added may be 0.001 to 20 parts by mass with respect to 100 parts by mass of the composition of the present invention.

Examples of photoacid generators include onium salt compounds, sulfonimide compounds, and disulfonyldiazomethane compounds, but the present invention is not limited thereto.

Specific examples of onium salt compounds include iodonium salt compounds such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate and bis(4-tert-butylphenyl)iodonium trifluoromethanesulfonate, and sulfonium salt compounds such as triphenylsulfonium hexafluoroantimonate, triphenylsulfonium nonafluoro-n-butanesulfonate, triphenylsulfonium camphorsulfonate, triphenylsulfonium trifluoromethanesulfonate, triphenylsulfonium adamantane carboxylate trifluoroethanesulfonate, triphenylsulfonium p-toluenesulfonate, triphenylsulfonium methanesulfonate, triphenylsulfonium phenolsulfonate, triphenylsulfonium nitrate, triphenylsulfonium maleate, bis(triphenylsulfonium) maleate, triphenylsulfonium hydrochloride, triphenylsulfonium acetate, triphenylsulfonium trifluoroacetate, triphenylsulfonium salicylate, triphenylsulfonium benzoate, and triphenylsulfonium hydroxide, but the present invention is not limited thereto.

Specific examples of sulfonimide compounds include N-trifluoromethanesulfonyloxy)succinimide, N-(nonafluoro-n-butanesulfonyloxy)succinimide, N-(camphorsulfonyloxy)succinimide and N-(trifluoromethanesulfonyloxy)naphthalimide, but the present invention is not limited thereto.

Specific examples of disulfonyldiazomethane compounds include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane, but the present invention is not limited thereto.

The photoacid generators may be used alone or two or more thereof may be used in combination.

When a photoacid generator is used, the proportion thereof is 0.01 to 30 parts by mass, 0.1 to 20 parts by mass, or 0.5 to 10 parts by mass with respect to 100 parts by mass of the component (A).

Examples of surfactants include nonionic surfactants, anionic surfactants, fluorine-based surfactants, cationic surfactants, silicon-based surfactants, and UV curable surfactants.

Examples thereof include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl allyl ethers such as polyoxyethylene octylphenol ether, and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants such as product name EFTOP EF301, EF303, and EF352 (commercially available from Mitsubishi Materials Electronic Chemicals Co., Ltd.) (formely Tochem Products Co., Ltd.)), product name MEGAFACE F171, F173, R-08, R-30, R-40, and R-40N (commercially available from DIC), Fluorad FC430, and FC431 (commercially available from Sumitomo 3M Limited), product name Asahi Guard AG710, Surflon S-382, SC101, SC102, SC103, SC104, SC105, and SC106 (commercially available from Asahi Glass Co., Ltd.); and silicon-based surfactants such as organosiloxane polymer-KP341 (product name, commercially available from Shin-Etsu Chemical Co., Ltd.), BYK302, BYK307, BYK333, BYK341, BYK345, BYK346, BYK347, and BYK348 (product name, commercially available from BYK). In addition, cationic surfactants such as distearyl dimethyl ammonium chloride, benzalkonium chloride, benzethonium chloride, cetylpyridinium chloride, hexadecyltrimethylammonium bromide, and dequalinium chloride; anionic surfactants such as octanoates, decanoates, octanesulfonates, decanoate sulfonate, palmitates, perfluorobutanesulfonates, and dodecylbenzenesulfonates; and UV curable surfactants such as BYK307, BYK333, BYK381, BYK-UV-3500, BYK-UV-3510, and BYK-UV-3530 (product name, commercially available from BYK) may be exemplified.

These surfactants may be used alone or two or more thereof may be used in combination. When a surfactant is used, the proportion thereof is 0.0001 to 5 parts by mass, 0.001 to 5 parts by mass, or 0.01 to 5 parts by mass with respect to 100 parts by mass of the component (A).

[Resist Pattern Metallization Method]

When the composition for a resist pattern metallization process of the present invention is brought into contact with the surface of the resist pattern after mask exposure, a resist pattern in which the composition components have permeated into a resist can be formed. In this manner, a method of making the composition permeate into a resist and particularly metallizing a resist pattern with a metal component in the composition is also an object of the present invention.

More specifically, an object of the present invention is to provide a resist pattern metallization method for providing a resist pattern in which the composition components have permeated into a resist, including the following steps [a1] to [d1].

[a1] a step of applying a resist solution to a substrate

[b1] a step of exposing and developing a resist film

[c1] a step of applying the composition for a resist pattern metallization process of the present invention to a resist pattern during the development or after the development and forming a coating film on the resist pattern

[d1] a step of heating the coating film and forming a heated coating film

Examples of substrates used in the step [a1] include a substrate used for producing a semiconductor device, and include, for example, a silicon wafer substrate, a silicon/silicon dioxide-coated substrate, a silicon nitride substrate, a glass substrate, an ITO substrate, a polyimide substrate, and a low dielectric constant material (low-k material)-coated substrate.

The resist used in the step [a1] is not particularly limited as long as it is sensitive to light used for exposure. Both a negative photoresist and a positive photoresist can be used. Examples thereof include a positive photoresist composed of a novolac resin and 1,2-naphthoquinone diazide sulfonic acid ester, a chemically amplified photoresist composed of a binder having a group that decomposes with an acid and increases an alkali dissolution rate and a photoacid generator, a chemically amplified photoresist composed of a low-molecular-weight compound that decomposes with an acid and increases an alkali dissolution rate of a photoresist, an alkali soluble binder and a photoacid generator, and a chemically amplified photoresist composed of a binder having a group that decomposes with an acid and increases an alkali dissolution rate, a low-molecular-weight compound that decomposes with an acid and increases an alkali dissolution rate of a photoresist, and a photoacid generator.

Specific examples available as products include APEX-E (product name, commercially available from Shipley Company), PAR710 (product name, commercially available from Sumitomo Chemical Co., Ltd.) and SEPR430 (product name, commercially available from Shin-Etsu Chemical Co., Ltd.), but the present invention is not limited thereto. In addition, for example, fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000) may be exemplified.

In addition, instead of the photoresist, an electron beam lithography resist (also referred to as an electron beam resist), or an EUV lithography resist (also referred to as an EUV resist) can be used.

As the electron beam resist, both a negative and positive resist can be used. Specific examples thereof include a chemically amplified resist composed of an acid generator and a binder having a group that decomposes with an acid and changes an alkali dissolution rate, a chemically amplified resist composed of an alkali soluble binder, an acid generator, and a low-molecular-weight compound that decomposes with an acid and changes an alkali dissolution rate of a resist, a chemically amplified resist composed of an acid generator, a binder having a group that decomposes with an acid and changes an alkali dissolution rate, and a low-molecular-weight compound that decomposes with an acid and changes an alkali dissolution rate of a resist, a non-chemically amplified resist composed of a binder having a group that decomposes with an electron beam and changes an alkali dissolution rate, and a non-chemically amplified resist composed of a binder having a moiety that is cut with an electron beam and changes an alkali dissolution rate. Even when such an electron beam resist is used, a resist pattern can be formed in the same manner as when a photoresist is used with an electron beam as an irradiation source.

In addition, as the EUV resist, a methacrylate resin-based resist can be used.

After the resist solution is applied, for example, at a baking temperature of 70 to 150° C. and a baking time of 0.5 to 5 minutes are set, and thus a resist (film) with a film thickness of, for example, 10 to 1,000 nm, can be obtained.

Here, the resist solution, the developer, and the following coating material can be applied or coated by spin coating, a dipping method, a spraying method or the like, and particularly, a spin coating method is preferable.

Here, the method may include a step [a1-0] of forming a resist underlayer film on a substrate before the step [a1]. This resist underlayer film has an antireflection function and an organic hardmask function.

Specifically, before the step [a1] of applying the resist solution, the step [a1-0] of forming a resist underlayer film on the substrate is performed and the step [a1] of applying the resist solution thereto can be performed. In addition, in the step [a1-0], a resist underlayer film (also referred to as an organic underlayer film) is formed on a semiconductor substrate, a resist is formed thereon, or a silicon hardmask is additionally formed on a resist underlayer film, and a resist can be formed thereon.

The resist underlayer film used in the step [a1-0] is used to prevent irregular reflection when the upper-layer resist film is exposed or to improve adhesion with the resist film, and for example, an acrylic resin or a novolac resin can be used. The resist underlayer film can be formed on a semiconductor substrate as a film with a film thickness of 1 to 1,000 nm.

In addition, the resist underlayer film used in the step [a1-0] can be a hardmask using an organic resin, and in this case, a material having a high carbon content and a low hydrogen content is used. Examples thereof include a polyvinylnaphthalene resin, a carbazole novolac resin, a phenol novolac resin, and a naphthol novolac resin. These can be formed on a semiconductor substrate as a film with a film thickness of 5 to 1,000 nm.

In addition, as the silicon hardmask used in the step [a1-0], a polysiloxane obtained by hydrolyzing a hydrolyzable silane can be used. For example, a polysiloxane obtained by hydrolyzing tetraethoxysilane, methyltrimethoxysilane, and phenyltriethoxysilane may be exemplified. These can be formed on the resist underlayer film as a film with a film thickness of 5 to 200 nm.

In the step [b1], the resist film is exposed through a predetermined mask.

For exposure, KrF excimer laser (wavelength of 248 nm), ArF excimer laser (wavelength of 193 nm), EUV light (wavelength of 13.5 nm), an electron beam or the like can be used. After exposure, as necessary, post exposure bake (PEB) can be performed. For post exposure bake, a heating temperature of 70° C. to 150° C. and a heating time of 0.3 to 10 minutes are appropriately selected.

Then, development is performed with a developer. Therefore, for example, when a positive photoresist is used, the photoresist in the exposed part is removed, and a photoresist pattern is formed.

In this case, examples of developers include aqueous solutions containing an alkali metal hydroxide such as potassium hydroxide and sodium hydroxide, aqueous solutions containing a quaternary ammonium hydroxide such as tetramethylammonium hydroxide, tetraethylammonium hydroxide, and choline, and alkaline aqueous solutions (alkaline developers) such as amine aqueous solutions containing ethanol amine, propylamine, and ethylenediamine. In addition, a surfactant or the like can be added to such a developer. Conditions for development are appropriately selected from a temperature of 5 to 50° C. and a time of 10 to 600 seconds.

In addition, in the present invention, an organic solvent can be used as a developer. After exposure, development is performed with a developer (solvent). Therefore, for example, when a positive photoresist is used, the photoresist in the unexposed part is removed, and a photoresist pattern is formed.

In this case, examples of developers (organic solvents) include methyl acetate, butyl acetate, ethyl acetate, isopropyl acetate, amyl acetate, isoamyl acetate, ethyl methoxy acetate, ethyl ethoxy acetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl-3-methoxypropionate. In addition, a surfactant or the like can be added to such a developer. Conditions for development are appropriately selected from a temperature of 5 to 50° C. and a time of 10 to 600 seconds.

In the step [c1], the composition of the present invention is applied to the resist pattern during the development or after the development, and preferably the resist pattern after the development, and a coating film is formed on the surface of the resist pattern. Here, the coating film is formed so that the resist pattern is covered, that is, the upper part, side wall and bottom part of the resist pattern are covered.

In this case, the thickness of the coating film is appropriately determined in consideration of the height and space width of the resist pattern, film thickness reduction due to evaporation of the solvent or the like, and a desired thickness of the heated coating film.

Thus, the step [d1] is a step of heating the coating film and forming a heated coating film. Heating is preferably performed at a baking temperature of 80 to 200° C. for 0.5 to 5 minutes. During this heating, the composition components of the present invention permeate into the resist pattern.

According to the method described above, the resist pattern in which the composition components have permeated into a resist can be obtained, but at the same time, a heated coating film is formed on the surface of the resist pattern. The thickness of the heated coating film from the surface of the resist pattern cannot be unconditionally determined because it varies depending on the height and space width of the resist pattern, and may be, for example, about 1 nm to 20 nm.

In addition, in the method in the present invention, an object of the present invention is to provide a resist pattern metallization method for providing a resist pattern in which the composition components have permeated into a resist, including the following steps [a2] to [e2].

[a2] a step of applying a resist solution to a substrate

[b2] a step of exposing and developing a resist film

[c2] a step of applying the composition for a resist pattern metallization process of the present invention to a resist pattern during the development or after the development and forming a coating film on the resist pattern

[d2] a step of heating the coating film and forming a heated coating film

[e2] a step of removing the heated coating film with water or a developer

Here, the steps [a2], [b2] and [d2] can be performed in the same procedures as described in the above steps [a1] (including [a1-0]), [b1] and [d1].

In the step [c2], the composition of the present invention is applied to a resist pattern during the development or after the development, and in this case, a coating film is formed so that the resist pattern is buried, which is different from the step [c1]. That is, the coating film is formed so that the thickness of the coating film from the bottom part of the resist pattern exceeds 100% of the height of the pattern. In this case, the thickness of the coating film from the bottom part of the resist pattern is appropriately determined in consideration of the conditions in the step [e2] (a removal liquid used for removing an unnecessary heated coating film and other conditions) and the like.

Then, the step [e2] is a step of removing the heated coating film obtained by heating in the step [d2] with water or a developer. As the developer, the same type of developer as the developer used in the previous step [b2] can be used. As water, those used in this field such as ion-exchanged water and ultrapure water can be used.

According to this step, an unnecessary heated coating film can be removed to obtain a resist pattern into which the composition components of the present invention have permeated. However, depending on conditions for removing the heated coating film, the heated coating film may be completely removed from the surface of the resist pattern or the heated coating film may remain on the surface of the resist pattern. When the heated coating film remains on the surface of the resist pattern, the thickness thereof cannot be unconditionally determined because it varies depending on the height and space width of the resist pattern and conditions in the step [e2] (a removal liquid used for removing the unnecessary heated coating film and other conditions), and it is generally 20 nm or less. The thickness of the heated coating film from the surface of the resist pattern can be adjusted by changing the conditions in the step [e2]. Here, depending on conditions in the step [e2], the heated coating film may be completely removed from the surface of the resist pattern, and the resist pattern itself may also become thinner.

Here, after the above step [d1], as in the step [d2], for example, in order to make the heated coating film formed on the surface of the resist pattern thinner, a step of removing the coating film subjected to the heating step [d1] with water or a developer may be included. As the water and the developer used here, the same type of water and developer as the water and developer used in the previous step [b1] can be used.

FIG. 9 shows schematic views of an example of a resist pattern metallization method including steps [a1] to [d1], and FIG. 10 shows schematic views of an example of a resist pattern metallization method including steps [a2] to [e2] (here, in these drawings, a step of processing a substrate in [Method of producing a semiconductor device] to be described below (in the drawing, [f1] and [f2]) are also shown). Here, the present invention is not limited to the steps shown in these drawings.

In the drawings, Sub indicates a substrate, UC indicates an underlayer film of a resist (carbon-containing layer (SOC), organic anti-reflective coating (BARC), inorganic anti-reflective coating (Si-HM), etc.), and PR indicates a resist film.

[Method of Producing Semiconductor Device]

An object of the present invention is to provide a method of producing a semiconductor device including a step of processing a substrate with the metallized resist pattern obtained through the above [Resist pattern metallization method], continuing from the method.

Here, when a resist underlayer film (carbon-containing layer (SOC), organic anti-reflective coating (BARC), inorganic anti-reflective coating (Si-HM), etc.) is formed between the substrate and the resist, using the metallized resist pattern as a protective film, layers (films) therebelow can be processed sequentially. Hereinafter, the present invention will be described in detail, including the case in which a resist underlayer film or the like is formed, but the present invention is not limited to the following.

When a resist underlayer film is formed, first, the resist underlayer film is removed (patterned) using the metallized resist pattern (upper layer) as a protective film (in FIG. 9 and FIG. 10, [f1] and [f2]).

The resist underlayer film can be removed by dry etching using a tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane or dichloroborane gas.

In this case, the resin-based underlayer film (organic underlayer film) is preferably removed by dry etching with an oxygen-based gas. This is because the metallized resist pattern according to the present invention is unlikely to be removed by dry etching with an oxygen-based gas. Here, a nitrogen-based gas may be mixed with an oxygen-based gas and used for dry etching.

In addition, when a silicon hardmask is provided, it is preferable to use a halogen-based gas. For example, a fluorine-based gas is used, and examples thereof include tetrafluoromethane ($CF_4$), perfluorocyclobutane ($C_4F_8$), perfluoropropane ($C_3F_8$), trifluoromethane, and difluoromethane ($CH_2F_2$), but the present invention is not limited thereto.

According to the above dry etching, a patterned resist underlayer film and a patterned silicon hardmask can be obtained.

Next, when the metallized resist pattern is used as a protective film, and a resist underlayer film or the like is provided, a semiconductor substrate is processed using the metallized resist pattern, the patterned resist underlayer film or the like as a protective film. The processing of the semiconductor substrate is preferably performed by dry etching with a fluorine-based gas.

Examples of fluorine-based gases include tetrafluoromethane ($CF_4$), perfluorocyclobutane ($C_4F_8$), perfluoropropane ($C_3F_8$), trifluoromethane, and difluoromethane ($CH_2F_2$).

EXAMPLES

Hereinafter, the present invention will be described in detail with reference to synthesis examples and examples, but the present invention is not limited to the following.

[1] Synthesis of Polymer (Hydrolysis Condensate)

Synthesis Example 1

5.89 g of water and 120.54 g of tetrahydrofuran were put into a 500 ml flask, and while stirring the mixed solution with a magnetic stirrer, 40.18 g of aminopropyltriethoxysilane (100 mol % in the total silane) was added dropwise to the mixed solution.

After the dropwise addition, the flask was transferred to an oil bath adjusted to 40° C. and the mixed solution was reacted for 240 minutes. Then, the reaction solution was cooled to room temperature, 120.54 g of water was added to the reaction solution, ethanol, tetrahydrofuran, and water, which are reaction byproducts, were distilled off under a reduced pressure, and concentration was performed to obtain a hydrolysis condensate (polysiloxane) aqueous solution.

In addition, water was added, and the concentration was adjusted so that the solvent ratio of water 100% (solvent composed of only water) was 20% by mass in terms of solid residue at 140° C. The obtained polymer corresponded to Formula (2-1-1).

Synthesis Example 2

89.99 g of water was put into a 500 ml flask, and while stirring the mixed solution with a magnetic stirrer, 30.00 g of 3-(N,N-dimethylaminopropyl)trimethoxysilane (100 mol % in the total silane) was added dropwise to the mixed solution.

After the dropwise addition, the flask was transferred to an oil bath adjusted to 40° C. and the mixed solution was reacted for 240 minutes. Then, the reaction solution was cooled to room temperature, 179.98 g of water was added to the reaction solution, methanol and water, which are reaction byproducts, were distilled off under a reduced pressure, and concentration was performed to obtain a hydrolysis condensate (polysiloxane) aqueous solution.

In addition, water was added, and the concentration was adjusted so that the solvent ratio of water 100% (solvent composed of only water) was 20% by mass in terms of solid residue at 140° C. The obtained polymer corresponded to Formula (2-4-1).

Synthesis Example 3

4.69 g of water and 89.99 g of acetone were put into a 500 ml flask, and while stirring the mixed solution with a magnetic stirrer, 30.00 g of dimethylaminopropyltrimethoxysilane was added dropwise to the mixed solution. Then, 7.23 g of a 1 M nitric acid aqueous solution was added.

After the 1 M nitric acid aqueous solution was added, the flask was transferred to an oil bath adjusted to 40° C., and the mixed solution was reacted for 240 minutes. Then, the reaction solution was cooled to room temperature, 179.98 g of water was added to the reaction solution, methanol, acetone, and water, which are reaction byproducts, were distilled off under a reduced pressure, and concentration was performed to obtain a hydrolysis condensate (polysiloxane) aqueous solution.

In addition, water was added, and the concentration was adjusted so that the solvent ratio of water 100% (solvent composed of only water) was 20% by mass in terms of solid residue at 140° C. The obtained polymer corresponded to Formula (2-9-2).

Synthesis Example 4

91.16 g of water was put into a 500 ml flask, and while stirring the mixed solution with a magnetic stirrer, 22.23 g of dimethylaminopropyltrimethoxysilane, and 8.16 g of triethoxysilylpropyl succinic anhydride were added dropwise to the mixed solution.

After the dropwise addition, the flask was transferred to an oil bath adjusted to 40° C. and the mixed solution was reacted for 240 minutes. Then, the reaction solution was cooled to room temperature, 91.16 g of water was added to the reaction solution, methanol, ethanol, and water, which are reaction byproducts, were distilled off under a reduced pressure, and concentration was performed to obtain a hydrolysis condensate (polysiloxane) aqueous solution.

In addition, water was added, and the concentration was adjusted so that the solvent ratio of water 100% (solvent composed of only water) was 20% by mass in terms of solid residue at 140° C. The obtained polymer corresponded to Formula (2-10-2).

Synthesis Example 5

93.13 g of a 0.5 M hydrochloric acid aqueous solution was put into a 300 ml flask, and while stirring the mixed solution with a magnetic stirrer, 6.87 g of aminopropyltriethoxysilane (100 mol % in the total silane) was added dropwise to the mixed solution.

After the dropwise addition, the flask was transferred to an oil bath adjusted to 23° C., and the mixed solution was reacted for 5 days. Then, ethanol and water, which are reaction byproducts, were distilled off under a reduced pressure, and concentration was performed to obtain a hydrolysis condensate (polysiloxane). Then, ethanol and water, which are reaction byproducts, were distilled off under a reduced pressure, and concentration was performed to obtain a hydrolysis condensate (polysiloxane).

In addition, water was added, and the concentration was adjusted so that the solvent ratio of water 100% (solvent composed of only water) was 20% by mass in terms of solid residue at 140° C. The obtained polymer corresponded to Formula (2-1-4) which is a ladder type silsesquioxane, and R was a propylammonium chloride group. ($R{=}C_3H_6NH_3^+Cl^-$)

Then, 6.8 g of an anion exchange resin was added, and chlorine ions were removed. The obtained polymer corresponded to Formula (2-1-4) which is a ladder type silsesquioxane, and R was an aminopropyl group. ($R{=}C_3H_6NH_2$)

Synthesis Example 6

5.39 g of acetic acid and 179.58 g of ultrapure water were put into a 300 ml flask, and while stirring the mixed solution with a magnetic stirrer, 3.72 g of dimethylaminopropyltrimethoxysilane (30 mol % in the total silane) was added dropwise to the mixed solution. After stirring at room temperature for 5 minutes, the aqueous solution was added dropwise to 8.73 g of tetraethoxysilane (70 mol % in the total silane).

After the dropwise addition, the flask was transferred to an oil bath adjusted to 23° C., and the mixed solution was reacted for 2 hours. Then, methanol, ethanol, and water, which are reaction byproducts, were distilled off under a reduced pressure, and concentration was performed to obtain a hydrolysis condensate (polysiloxane). Then, ethanol and water, which are reaction byproducts, were distilled off under a reduced pressure at 50° C., and subsequently at 100° C., and concentration was performed to obtain a hydrolysis condensate (polysiloxane).

Then, water was added, and the concentration was adjusted so that the solvent ratio of water 100% (solvent composed of only water) was 20% by mass in terms of solid residue at 140° C. The obtained polymer corresponded to Formula (2-5-5).

[2] Preparation of Composition

The polysiloxane (polymer) obtained in the synthesis example, additive, and solvent were mixed at ratios shown in Table 1, and filtered through a 0.1 μm filter made of a fluorine resin, and a polymer-containing coating solution was prepared. In Table 1, each addition amount is indicated in parts by mass.

Here, in Table 1, the amount of a polymer (polysiloxane) added indicates the amount of the polymer itself added, not the amount of the polymer solution added.

In addition, in Table 1, NfA indicates nonafluoro butanesulfonic acid, DBSA indicates dodecylbenzenesulfonic acid, and Ac indicates acetic acid.

TABLE 1

| | Polysiloxane | Additive | Solvent |
|---|---|---|---|
| Example 1-1 | Synthesis Example 1 | NfA | Water |
| (parts by mass) | 0.5 | 0.005 | 100 |
| Example 2-1 | Synthesis Example 2 | NfA | Water |
| (parts by mass) | 0.5 | 0.005 | 100 |
| Example 3-1 | Synthesis Example 3 | NfA | Water |
| (parts by mass) | 0.5 | 0.005 | 100 |
| Example 4-1 | Synthesis Example 4 | NfA | Water |
| (parts by mass) | 0.5 | 0.005 | 100 |
| Example 5-1 | Synthesis Example 5 | DBSA | Water |
| (parts by mass) | 0.5 | 0.005 | 100 |
| Example 6-1 | Synthesis Example 6 | NfA | Water |
| (parts by mass) | 0.5 | 0.005 | 100 |
| Example 1-2 | Synthesis Example 1 | NfA | Water |
| (parts by mass) | 5 | 0.05 | 100 |
| Example 2-2 | Synthesis Example 2 | NfA | Water |
| (parts by mass) | 5 | 0.05 | 100 |
| Example 3-2 | Synthesis Example 3 | NfA | Water |
| (parts by mass) | 5 | 0.05 | 100 |
| Example 4-2 | Synthesis Example 4 | NfA | Water |
| (parts by mass) | 5 | 0.05 | 100 |
| Example 5-2 | Synthesis Example 5 | NfA | Water |
| (parts by mass) | 5 | 0.05 | 100 |
| Example 6-2 | Synthesis Example 6 | DBSA | Water |
| (parts by mass) | 5 | 0.05 | 100 |
| Comparative Example 1 | Synthesis Example 2 | | Water |
| (parts by mass) | 0.5 | | 100 |
| Comparative Example 2 | Synthesis Example 2 | Ac | Water |
| (parts by mass) | 0.5 | 0.05 | 100 |

[3] Preparation of Composition for Forming Organic Resist Underlayer Film

Under nitrogen, carbazole (6.69 g, 0.040 mol, commercially available from Tokyo Chemical Industry Co., Ltd.), 9-fluorenone (7.28 g, 0.040 mol, commercially available from Tokyo Chemical Industry Co., Ltd.), and p-toluenesulfonic acid monohydrate (0.76 g, 0.0040 mol, commercially available from Tokyo Chemical Industry Co., Ltd.) were put into a 100 mL four-neck flask, and 1,4-dioxane (6.69 g, commercially available from Kanto Chemical Co., Inc.) was charged to the flask and stirred. The temperature was raised to 100° C., dissolution was performed and polymerization started. After 24 hours, cooling was performed to 60° C.

Chloroform (34 g, commercially available from Kanto Chemical Co., Inc.) was added to the cooled reaction mixture for dilution, and the diluted mixture was added to methanol (168 g, commercially available from Kanto Chemical Co., Inc.) for precipitation.

The obtained precipitate was filtered, and dried in a vacuum dryer at 80° C. for 24 hours, and 9.37 g of a desired polymer of Formula (X) (hereinafter referred to as PCzFL) was obtained.

Here, the measurement results of $^1$H-NMR of PCzFL were as follows.

$^1$H-NMR (400 MHz, DMSO-$d_6$): δ7.03-7.55 (br, 12H), 67.61-8.10 (br, 4H), 611.18 (br, 1H)

In addition, for the weight average molecular weight Mw of PCzFL, in terms of polystyrene by GPC, the weight average molecular weight Mw was 2,800, and the polydispersity Mw/Mn was 1.77.

(X)

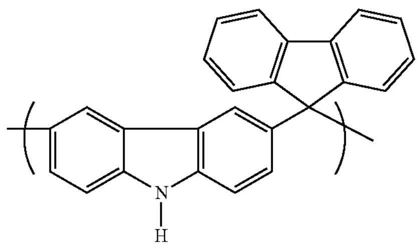

3.0 g of tetramethoxymethyl glycoluril (product name Powder Link 1174 commercially available from Japan Cytec Industries Co., Ltd.) (formerly Mitsui Cytec Ltd.)) as a cross-linking agent, 0.30 g of pyridinium p-toluenesulfonate as a catalyst, and 0.06 g of MEGAFACE R-30 (product name, commercially available from DIC) as a surfactant were mixed with 20 g of PCzFL, and the mixture was dissolved in 88 g of propylene glycol monomethyl ether acetate. Then, filtering was performed using a polyethylene micro filter having a pore size of 0.10 m, and additionally, filtering was performed using a polyethylene micro filter having a pore size of 0.05 m, and a composition for forming an organic resist underlayer film used in a lithography process using a multilayer film was prepared.

[4] Coating Properties Evaluation Test

The compositions obtained in Examples 1-1 to 6-1, Examples 1-2 to 6-2, and Comparative Examples 1 and 2 were applied to a silicon wafer using a spinner to form a coating film, heating was performed on a hot plate at 100° C. for 1 minute, and an Si-containing film (with a film thickness of 20 nm) was formed.

Figure 1:
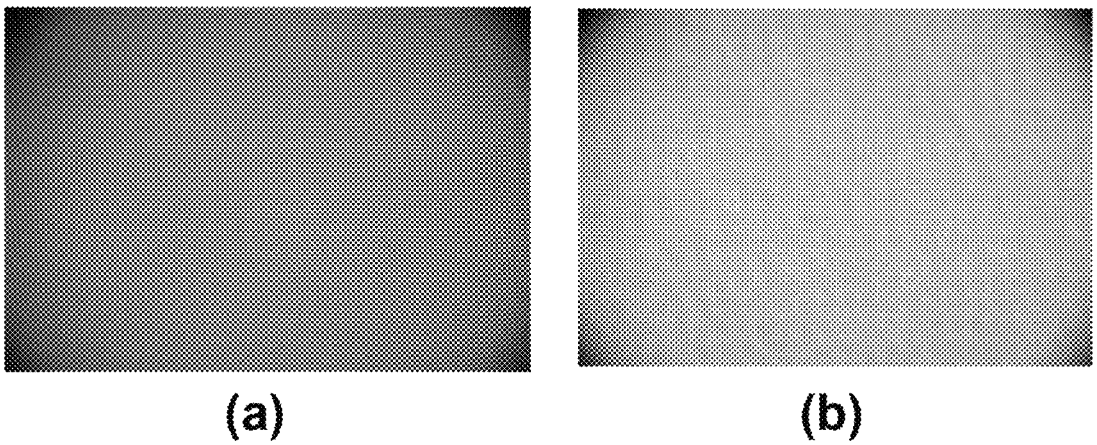
FIG. 1 shows optical microscopic images (magnification: 50 K) of an Si-containing film, FIG. 1(*a*) shows an optical microscopic image of an Si-containing film obtained using a composition of Example 4-2 and FIG. 1(*b*) shows an optical microscopic image of an Si-containing film obtained using a composition of Comparative Example 2, in [4] Evaluation of coating properties.

The obtained Si-containing film was observed using an optical microscope. Those observed to have uniform film formation were evaluated as "Good" and those observed to have a striped pattern and no uniform film formation were evaluated as "Poor." The obtained results are shown in Table 2. In addition, the optical microscopic images (magnification: 50 K) of the Si-containing films obtained in Example 4-2 and Comparative Example 2 are shown in FIG. 1 ((a) Example 4-2 and (b) Comparative Example 2).

TABLE 2

| | Results of observation under optical microscope |
|---|---|
| Example 1-1 | Good |
| Example 2-1 | Good |
| Example 3-1 | Good |
| Example 4-1 | Good |
| Example 5-1 | Good |
| Example 6-1 | Good |
| Example 1-2 | Good |

TABLE 2-continued

| | Results of observation under optical microscope |
|---|---|
| Example 2-2 | Good |
| Example 3-2 | Good |
| Example 4-2 | Good |
| Example 5-2 | Good |
| Example 6-2 | Good |
| Comparative Example 1 | Poor |
| Comparative Example 2 | Poor |

[5] Permeation Confirmation Test of Si Component with Respect to Resist

A resist solution for EUV (methacrylate resin-based resist) was applied to a silicon wafer using a spinner and heated on a hot plate at 110° C. for 1 minute, and a photo resist film with a film thickness of 30 nm was formed.

Then, the composition obtained in Example 4-2 was applied to a photo resist film using a spinner to form a coating film, heating was performed on a hot plate at 100° C. for 1 minute, an Si-containing film (with a film thickness of 100 nm) was formed, and the composition components (particularly, a silane component) permeated into the EUV resist. Then, using ultrapure water, composition components that had not permeated into the resist were removed, and an EUV resist film into which the composition components permeated was obtained. Then, the EUV resist film was subjected to TOF-SIMS evaluation, and it was checked whether an Si component was confirmed in the film.

Here, as a comparative example, the EUV resist film was directly subjected to TOF-SIMS evaluation.

Figure 2:
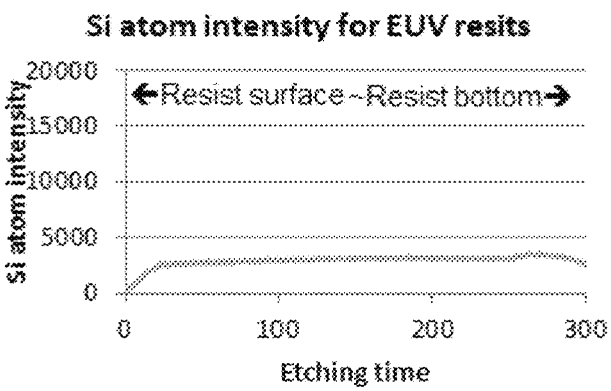
FIG. 2 is a diagram showing TOF-SIMS data of an EUV resist film to which the composition of Example 4-2 was applied in [5] Permeation confirmation test for an Si component with respect to a resist.

The obtained results are shown in Table 3. In addition, FIG. 2 shows TOF-SIMS data of the EUV resist film to which the composition of Example 4-2 was applied.

Here, measurement conditions for TOF-SIMS were as follows.

Primary Ion (primary ion): $Bi^{3++}$

Sputter Ion: Cs

Area (measurement area): 50×50 μm$^2$

Sputter Area: 250×250 μm$^2$

Polarity: Nega

TABLE 3

| | Results obtained through TOF-SIMS |
|---|---|
| Example 4-2 | With Si component |
| Comparative Example | Without Si component |

[6] Resist Pattern Formation According to ArF Exposure and Resist Pattern Metallization (1)

(Resist Patterning Evaluation: Evaluation Through Positive Alkaline Development (PTD) Step of Performing Alkaline Development)

The composition for forming an organic resist underlayer film was applied to a silicon wafer using a spinner and baked on a hot plate at 240° C. for 60 seconds, and an organic underlayer film (layer A) with a film thickness of 200 nm was obtained.

On the layer A, a commercially available ArF resist solution (product name: AR2772JN commercially available from JSR Corporation) was applied using a spinner, and heating was performed on a hot plate at 110° C. for 1 minute, and a photo resist film (layer B) with a film thickness of 100 nm was formed.

Using a scanner (NSR-S307E, commercially available from Nikon Corporation) (a wavelength of 193 nm, NA, a: 0.85, 0.93/0.85), the photo resist film was exposed through a mask set such that the line width and the width between the lines of the photoresist after the development were 0.062 m, that is, a 0.062 m dense line with a line and space (L/S)=1/1 was formed. Then, baking was performed on a hot plate at 100° C. for 60 seconds, cooling was performed and development was then performed using a 2.38% alkaline aqueous solution for 60 seconds to form a resist pattern.

Subsequently, the compositions (coating solution) of Example 1-1 to Example 6-1 were applied (with a film thickness of 5 nm) to the resist pattern, and a 2.38 mass % tetramethylammonium aqueous solution used for development was replaced with the compositions of these examples. Here, as a comparative example, water was applied to the resist pattern, and a 2.38 mass % tetramethylammonium aqueous solution used for development was replaced with water.

Then, the silicon substrate was spun at 1,500 rpm for 60 seconds, the solvent in the composition was dried and heating was then performed at 100° C. for 60 seconds, a heated coating film was formed, and the composition components permeated from the side wall and upper part of the resist pattern.

For the photoresist pattern obtained in this manner, the pattern shape and the line width roughness were confirmed and evaluated according to observation of the cross section of the pattern and observation of the upper part of the pattern.

In observation of the pattern shape, those having no large pattern peeling and no undercut or thickening (footing) of the bottom part of the line were evaluated as "Good" and those having undercut or footing were evaluated as "Poor (undercut)" or "Poor (footing)."

In addition, for the line width roughness, those having a line width of a 3 sigma value of 6.0 nm or more were evaluated as "Poor", and those having a line width of a 3 sigma value of less than 6.0 nm were evaluated as "Good."

Figure 3:
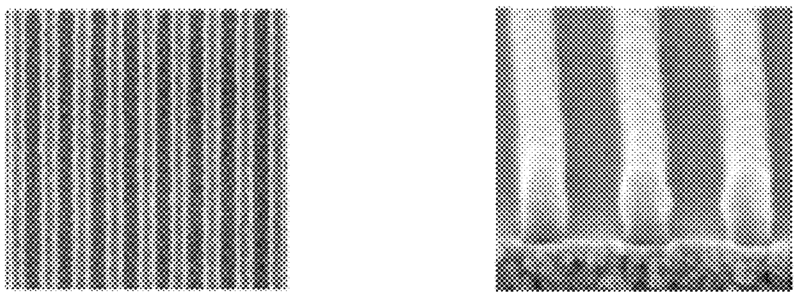
FIG. 3 shows scanning microscopic images (magnification: 100 K, an upper part and a cross section of a pattern) of a resist pattern to which a composition of Example 4-1 was applied in [6] Resist pattern formation according to ArF exposure and resist pattern metallization (1).
Figure 4:
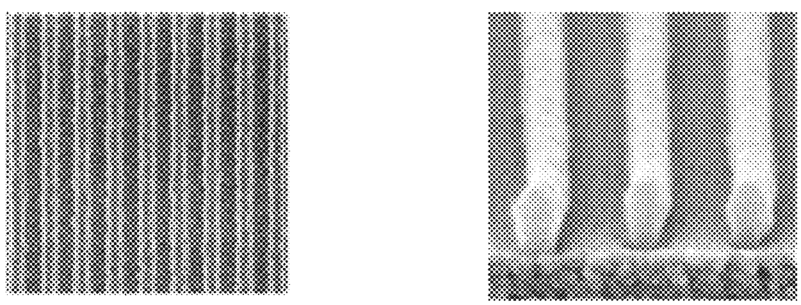
FIG. 4 shows scanning microscopic images (magnification: 100 K, an upper part and a cross section of a pattern)

The obtained results are shown in Table 4. In addition, the scanning microscopic images (magnification: 100 K, the upper part and the cross section of the pattern) of the resist pattern to which the composition of Example 4-1 was applied and the resist pattern of the comparative example are shown in FIG. 3 (Example 4-1) and FIG. 4 (Comparative Example).

After that, the resist pattern into which the composition components permeated was used as a mask, dry etching was performed with 02 and N2 gases, and the pattern was transferred to an organic underlayer film (layer A).

For the obtained pattern, those having a line width variation value between before and after dry etching of 10 nm or more were evaluated as "Poor" and those having a line width variation value of less than 10 nm were evaluated as "Good."

The obtained results are shown in Table 4 together. In addition, scanning microscopic images (magnification: 100 K, the upper part and the cross section of the pattern) of the resist pattern and the transfer pattern to which the composition of Example 4-1 was applied after dry etching, and the resist pattern and the transfer pattern of the comparative example after dry etching are shown in FIG. 5 (Example 4-1) and FIG. 6 (Comparative Example).

TABLE 4

| | Pattern shape | Line width roughness | Before and after dry etching Line width variation value |
|---|---|---|---|
| Example 1-1 | Good | Good | Good |
| Example 2-1 | Good | Good | Good |
| Example 3-1 | Good | Good | Good |
| Example 4-1 | Good | Good | Good |
| Example 5-1 | Good | Good | Good |
| Example 6-1 | Good | Good | Good |
| Comparative Example | Good | Poor | Poor |

[7] Resist Pattern Formation According to ArF Exposure and Resist Pattern Metallization (2)

(Resist Patterning Evaluation: Evaluation Through PTD Step of Performing Alkaline Development)

The composition for forming an organic resist underlayer film was applied to a silicon wafer using a spinner and baked on a hot plate at 240° C. for 60 seconds, and an organic underlayer film (layer A) with a film thickness of 200 nm was obtained.

On the layer A, a commercially available ArF resist solution (product name: AR2772JN, commercially available from JSR Corporation) was applied using a spinner, and heating was performed on a hot plate at 110° C. for 1 minute, and a photo resist film (layer B) with a film thickness of 100 nm was formed.

Using a scanner (NSR-S307E, commercially available from Nikon Corporation) (a wavelength of 193 nm, NA, a: 0.85, 0.93/0.85), the photo resist film was exposed through a mask set such that the line width and the width between the lines of the photoresist after the development were 0.062 μm, that is, a 0.062 μm dense line with a line and space (L/S)=1/1 was formed. Then, baking was performed on a hot plate at 100° C. for 60 seconds, cooling was performed and development was then performed using a 2.38% alkaline aqueous solution for 60 seconds to form a resist pattern.

Subsequently, the compositions (coating solution) of Example 1-2 to Example 6-2 were applied to the resist pattern (with a film thickness of 120 nm) and a 2.38 mass % tetramethylammonium aqueous solution used for development was replaced with the compositions of these examples. Here, as a comparative example, water was applied to the resist pattern, and a 2.38 mass % tetramethylammonium aqueous solution used for development was replaced with water.

Then, the silicon substrate was spun at 1,500 rpm for 60 seconds, the solvent in the composition was dried and heating was then performed at 100° C. for 60 seconds, a heated coating film was formed, and the composition components (particularly, the silane component) permeated from the side wall and the upper part of the resist pattern.

Then, again, a 2.38 mass % tetramethylammonium aqueous solution was applied to remove composition components that had not permeated into the resist pattern.

For the photoresist pattern obtained in this manner, the pattern shape and the line width roughness were confirmed and evaluated according to observation of the cross section of the pattern and observation of the upper part of the pattern.

In observation of the pattern shape, those having no large pattern peeling and no undercut or thickening (footing) of the bottom part of the line were evaluated as "Good" and those having undercut or footing were evaluated as "Poor (undercut)" or "Poor (footing)."

In addition, in the line width roughness, those having a line width of a 3 sigma value of 6.0 nm or more were evaluated as "Poor" and those having a line width of a 3 sigma value of less than 6.0 nm were evaluated as "Good."

The obtained results are shown in Table 5.

After that, the resist pattern into which the composition components permeated was used as a mask, dry etching was performed with 02 and N2 gases, and the pattern was transferred to an organic underlayer film (layer A).

For the obtained pattern, those having a line width variation value between before and after dry etching of 10 nm or more were evaluated as "Poor" and those having a line width variation value of less than 10 nm were evaluated as "Good."

The obtained results are shown in Table 5 together.

TABLE 5

| | Pattern shape | Line width roughness | Before and after dry etching line width variation value |
|---|---|---|---|
| Example 1-2 | Good | Good | Good |
| Example 2-2 | Good | Good | Good |
| Example 3-2 | Good | Good | Good |
| Example 4-2 | Good | Good | Good |
| Example 5-2 | Good | Good | Good |
| Example 6-2 | Good | Good | Good |
| Comparative Example | Good | Poor | Poor |

In Example 4-2, the line pattern size before dry etching was changed from 62 nm to 72 nm. This means that both sides and the upper side of the resist line were covered with the composition components at a film thickness of 5 nm.

[8] Resist Pattern Formation According to EUV Exposure and Resist Pattern Metallization: Positive Alkaline Development The composition for forming an organic resist underlayer film was applied to a silicon wafer using a spinner and baked on a hot plate at 240° C. for 60 seconds, and an organic underlayer film (layer A) with a film thickness of 90 nm was obtained.

On the layer, a resist solution for EUV (methacrylate resin-based resist) was spin-coated and heated at 130° C. for 1 minute, and an EUV resist layer (layer B) was formed. Exposure was performed using an EUV exposure device (NXE3300) under conditions of NA=0.33, σ=0.90/0.67, and Dipole45 (exposed amount of 49 mJ, pattern line & space: 22 mm).

After the exposure, post exposure bake (PEB, at 110° C. for 1 minute) was performed, cooling was performed to room temperature on a cooling plate, and development was performed using an alkaline developer (2.38% TMAH aqueous solution) for 30 seconds.

Subsequently, the composition (coating solution) of Example 4-1 was applied to the resist pattern (with a film thickness of 5 nm), and a 2.38 mass % tetramethylammonium aqueous solution used for development was replaced with the composition of Example 4-1. Here, as a comparative example, water was applied to the resist pattern, and a 2.38 mass % tetramethylammonium aqueous solution used for development was replaced with water.

Then, the silicon substrate was spun at 1,500 rpm for 60 seconds, the solvent in the composition was dried and heating was then performed at 100° C. for 60 seconds, a heated coating film was formed, and the composition components (particularly, the silane component) permeated from the side wall and the upper part of the resist pattern.

Then, again, a 2.38 mass % tetramethylammonium aqueous solution was applied to remove composition components that had not permeated into the resist pattern.

For the photoresist pattern obtained in this manner, the pattern shape was confirmed and evaluated according to observation of the cross section of the pattern and observation of the upper part of the pattern.

In observation of the pattern shape, those having no large pattern peeling and no undercut or thickening (footing) of the bottom part of the line were evaluated as "Good" and those in an unfavorable state in which the resist pattern was peeled off and collapsed were evaluated as "Collapse."

The obtained results are shown in Table 6. In addition, the scanning microscopic images (magnification: 200 K, the upper part of the pattern) of the resist pattern to which the composition of Example 4-1 was applied and the resist pattern of the comparative example are shown in FIG. 7 (Example 4-1) and FIG. 8 (Comparative Example).

TABLE 6

| | 22 nm line |
|---|---|
| Example 4-1 | Good |
| Comparative Example 1 | Collapse |

The invention claimed is:

1. A resist pattern metallization method for providing a resist pattern in which the composition components have permeated into a resist, comprising:

a step of applying a resist solution to an organic underlayer film on a substrate;

a step of exposing and developing a resist film prepared from the resist solution to form a developed resist film;

a step of applying a composition to a resist pattern during the development or after the development and forming a coating film in which the resist pattern is buried, wherein the composition comprises a component (A) that is at least one selected from the group consisting of a metal oxide (a1), a hydrolyzable silane compound (a2), a hydrolysate (a3) of the hydrolyzable silane compound, and a hydrolysis condensate (a4) of the hydrolyzable silane compound, a component (B) that is an acid compound containing no carboxylic acid group (—COOH), and a component (C) that is an aqueous solvent;

a step of heating the coating film and forming a heated coating film;

a step of removing the heated coating film with water or a developer to form a metallized resist pattern corresponding to the resist pattern of the developed resist film; and a step of etching the organic underlayer film using the metallized resist pattern before removing the developed resist film.

2. A method of producing a semiconductor device, further comprising a step of processing the substrate with the metallized resist pattern and etched organic underlayer film obtained by the method according to claim 1.

3. The method according to claim 1, wherein the component (B) is an acid compound containing a sulfonate group (—$SO_3H$).

4. The method according to claim 1, wherein the hydrolyzable silane compound (a2) contains at least one selected from the group consisting of a hydrolyzable silane (i) containing an organic group having an amino group and a hydrolyzable silane (ii) containing an organic group having an ionic functional group.

5. The method according to claim 1, wherein the hydrolyzable silane compound (a2) contains at least one selected from the group consisting of a hydrolyzable silane of the following Formula (1) and a hydrolyzable silane of the following Formula (1-1):

$$[R^1_{a0}Si(R^2)_{3-a0}]_{b0}R^3_{c0} \qquad \text{Formula (1)}$$

$$[[Si(R^{10})_2O]_{n0}Si(R^{20})_2]R^{30}_2 \qquad \text{Formula (1-1)}$$

wherein in Formula (1):

$R^3$ is an organic group having an amino group or an organic group having an ionic functional group, which is bonded to a silicon atom by an Si—C bond or Si—N bond, and when there are a plurality of $R^3$'s, the $R^3$'s are groups that may form a ring and be bonded to Si atoms, $R^1$ is an organic group having an alkyl group, an aryl group, a halogenated alkyl group, a halogenated aryl group, an alkenyl group, an epoxy group, an acryloyl group, a methacryloyl group, a mercapto group, or a cyano group and is a group that is bonded to a silicon atom by an Si—C bond, $R^2$ is an alkoxy group, an acyloxy group or a halogen group, a0 is an integer of 0 or 1, b0 is an integer of 1 to 3, and c0 is an integer of 1 or 2, wherein in Formula (1-1):

$R^{10}$ and $R^{20}$ are each a hydroxy group, an alkoxy group, an acyloxy group, or a halogen group, $R^{30}$ is an organic group having an amino group or an organic group having an ionic functional group, which is bonded to a silicon atom by an Si—C bond or Si—N bond, and when there are a plurality of $R^{30}$'s, the $R^{30}$'s are groups that may form a ring and be bonded to Si atoms, and n0 is an integer of 1 to 10.

6. The method according to claim 1, wherein the metal oxide (a1) is an oxide of at least one metal selected from the group consisting of titanium, hafnium, zirconium, germanium, aluminum, indium, tin, tungsten and vanadium.

7. The method according to claim 1, wherein the proportion of the component (B) contained is 0.5 to 15 parts by mass with respect to 100 parts by mass of the component (A).

8. The method according to claim 1, wherein the composition further includes a curing catalyst.

9. The method according to claim 1, wherein the composition further includes a surfactant.

10. The method according to claim 1, wherein the composition further includes a photoacid generator.

* * * * *